United States Patent
Gyugyi et al.

[11] 4,000,455
[45] Dec. 28, 1976

[54] FAST CURRENT MEASUREMENT APPARATUS FOR STATIC VAR GENERATOR COMPENSATOR CONTROL CIRCUIT AND METHOD FOR USING SAME

[75] Inventors: Laszlo Gyugyi, Pittsburgh; Francis T. Thompson, Murrysville, both of Pa.

[73] Assignee: Westinghouse Electric Corporation, Pittsburgh, Pa.

[22] Filed: Dec. 23, 1974

[21] Appl. No.: 535,918

[52] U.S. Cl. ............................................. 323/119
[51] Int. Cl.² ........................................ H02J 3/18
[58] Field of Search ................. 13/12, 13; 219/108, 219/110–115, 131 R; 321/9, 27 R, 40; 323/9, 24, 101, 102, 106, 108–110, 119, 124, 127, 128

[56] References Cited
UNITED STATES PATENTS

| | | |
|---|---|---|
| 3,400,326 | 9/1968 | Zhukov et al. .................... 323/101 |
| 3,450,983 | 6/1969 | Koppelmann et al. ............ 323/119 |
| 3,754,184 | 8/1973 | Stone ................................. 323/102 |
| 3,829,759 | 8/1974 | Thorborg ...................... 323/102 X |

FOREIGN PATENTS OR APPLICATIONS

| | | | |
|---|---|---|---|
| 266,036 | 8/1970 | U.S.S.R. ............................. 323/102 |

*Primary Examiner*—A. D. Pellinen
*Attorney, Agent, or Firm*—M. J. Moran

[57] ABSTRACT

A control circuit for a static VAR generator measures load current on consecutive half cycles. This information together with voltage information is used to determine the firing angles of the VAR generator thyristors for providing the required compensator currents. The total computation time for determining the firing angles in each succeeding half cycle takes no longer than the length of time of the last complete half cycle immediately preceding the firing of the thyristor.

52 Claims, 35 Drawing Figures

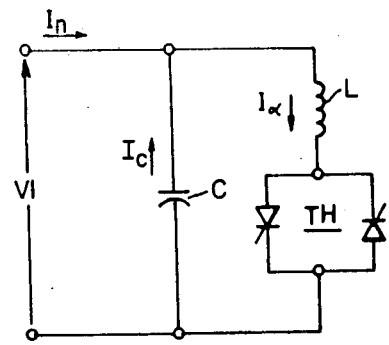
FIG. I
PRIOR ART
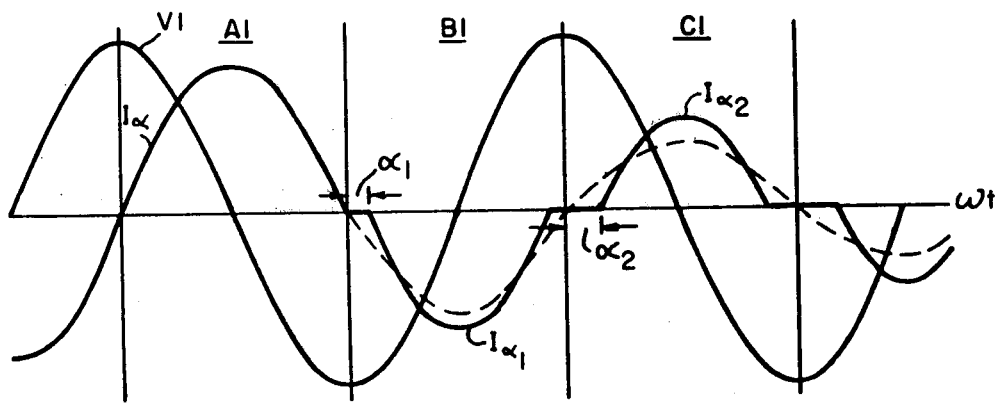
FIG. 2
PRIOR ART
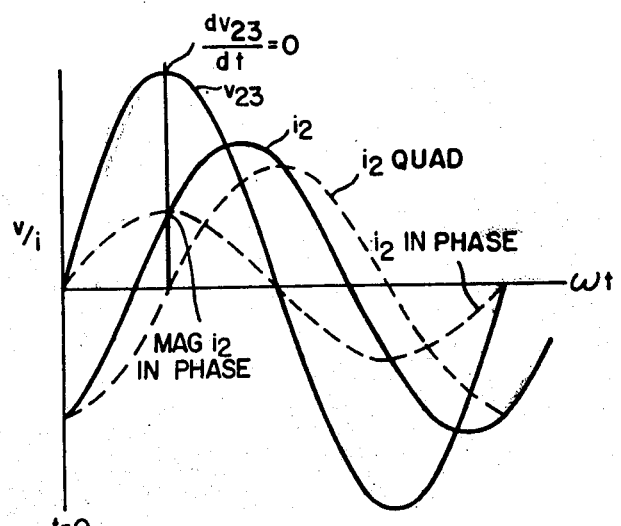
FIG. 4

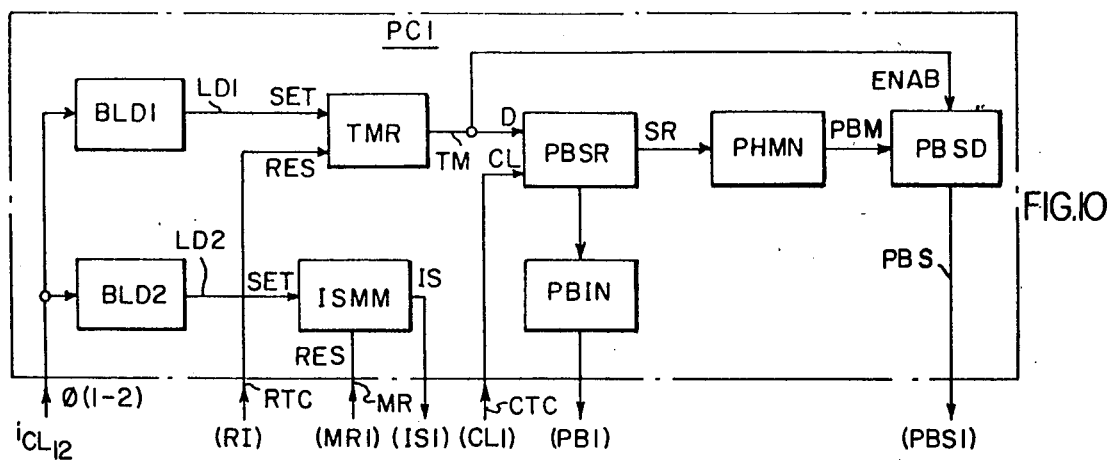
FIG.10
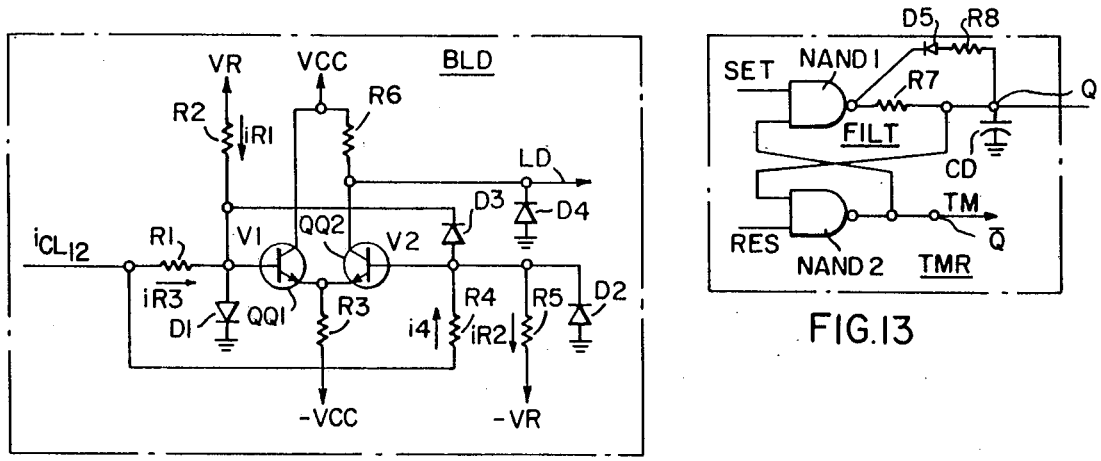
FIG.11
FIG.13
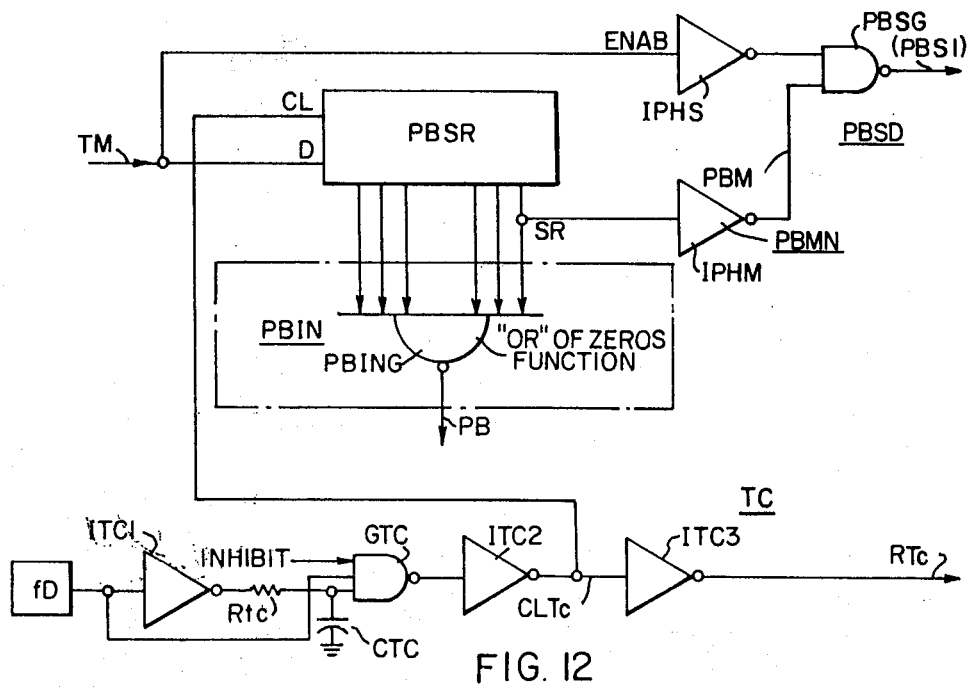
FIG.12

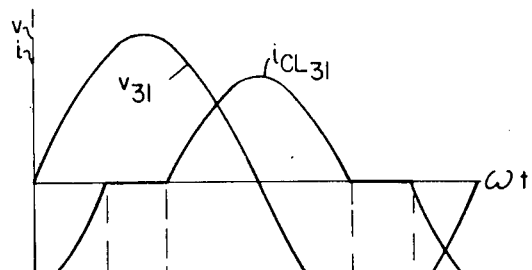
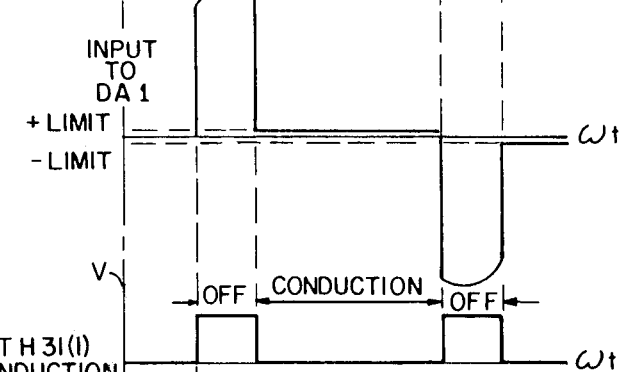
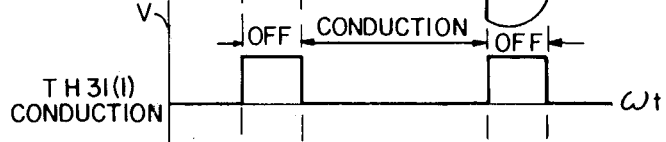
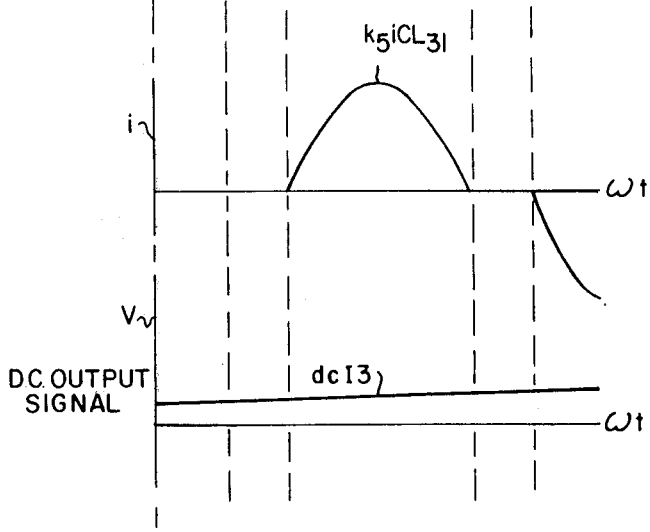
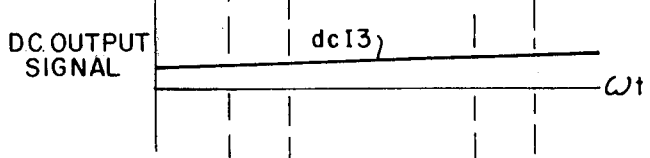
FIG.20a
FIG.20b
FIG.20c
FIG.20d
FIG.20e

FAST CURRENT MEASUREMENT APPARATUS FOR STATIC VAR GENERATOR COMPENSATOR CONTROL CIRCUIT AND METHOD FOR USING SAME

CROSS REFERENCE TO RELATED APPLICATIONS

Certain inventions related to those disclosed in the present application are disclosed and claimed in copending applications Ser. No. 535,629, filed concurrently by L. Gyugyi and M. B. Brennen; Ser. No. 535,627, filed concurrently by M. B. Brennen and F. T. Thompson; Ser. No. 535,617, filed concurrently by F. T. Thompson; Ser. No. 535,919, filed concurrently by L. Gyugyi, M. B. Brennen and E. J. Stacey and Ser. No. 535,626, filed concurrently by F. T. Thompson and M. B. Brennen, all of which are assigned to the same assignee as the present application.

BACKGROUND OF THE INVENTION

This invention relates generally to static VAR generators and it relates in particular to high speed circuits for ascertaining the firing angles in static VAR generators.

Static VAR generators compensate for the effects of highly reactive loads such as arc furnaces on the terminals of an AC supply system. A static VAR generator or flicker compensator control circuit measures the magnitudes of the arc furnace currents in consecutive half cycles. This information is used to compute the necessary compensation currents in terms of subsequently required firing angle signals for the thyristors of the static VAR generator. The VAR generator output current can only be adjusted once during each half cycle per phase. Consequently the response time of the flicker compensator and thus its effectiveness for flicker reduction is largely dependent upon the fastness of the arc furnace current measurement and conversion to firing angles. U.S. Pat. No. 3,597,518 entitled "Electric Arc Furnace Control" by R. W. Roberts issued Aug. 3, 1971 teaches a control system for an electric arc furnace which is designed to maintain constant arc impedance. The system is designed to respond quickly to large impedance errors, is insensitive to short term impedance fluctuations and at the same time is rarely highly sensitive to continuing small errors. U.S. Pat. No. 3,728,516 entitled "Welding Power Source" issued to A. D. Daspit on Apr. 17, 1973 teaches the concept of controlling SCR's in response to current and voltage applied to an electric welding device in which a capacitor is periodically semi-discharged through a switching device shuch as an SCR. It would be advantageous to provide a control device for a static VAR generator which very quickly senses and computes the parameters necessary to set the firing angle of the thyristors in the static VAR generator and thereafter sets those angles almost immediately after making the computation. It would be preferable if this detection and setting for firing could be done within one half cycle.

SUMMARY OF THE INVENTION

In accordance with the invention methods and apparatus are taught which utilize static circuitry for implementing mathematical equations and concepts which are useful in determining the firing angle of a thyristor with great accuracy and almost immediately prior to the firing of the thyristor. In one embodiment this is accomplished by computing one of the factors necessary to determine the firing angle over a 120° interval. In another embodiment the computation requires an integration which takes place over 180° interval with the interval broken up into two discrete sections. In another embodiment portions of the two previously mentioned prior concepts are utilized to provide an integrating technique.

BRIEF DESCRIPTION OF THE DRAWINGS

For a better understanding of the invention, reference may be had to the preferred embodiment exemplary of the invention shown in the accompanying drawings in which:

FIG. 1 shows a prior art static VAR generator;

FIG. 2 shows a plot of VAR generator voltage and time-controlled inductor current versus $\omega t$ for the apparatus of FIG. 1;

FIG. 4 shows a plot of phase voltage and current with current components (for a harmonicless current) versus $\omega t$;

FIG. 10 shows a block diagram of a portion of a phase back system shown in FIG. 3;

FIG. 11 shows a schematic diagram of the BLD portion of the block diagram shown in FIG. 10;

FIG. 12 shows another portion of the block diagram shown in FIG. 10;

FIG. 13 shows still another portion of the block diagram shown in FIG. 10;

FIGS. 20a–20e show analog signals associated with a DC eliminator shown in FIG. 3;

DESCRIPTION OF THE PREFERRED EMBODIMENTS

Figure 3A:
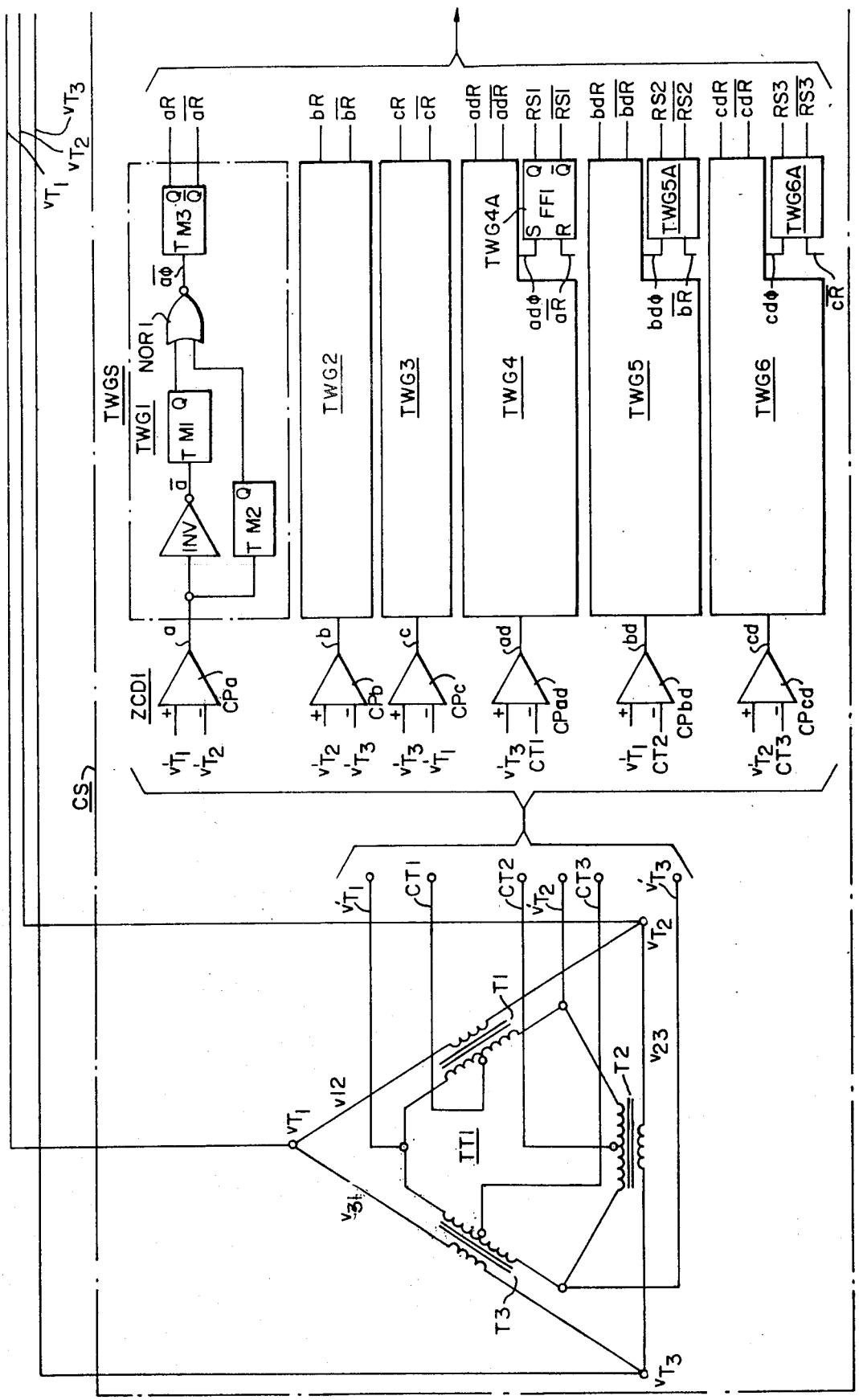
FIGS. 3A–3E (also collectively referred to as FIG. 3) show a diagram of a static VAR generator including a control system therefor.

Referring now to the drawings and prior art FIG. 1 in particular there is shown a basic VAR generator for a single phase AC electrical system. In general the VAR generator consists of a fixed capacitor C and a thyristor controlled inductor L. At zero leading VAR demand, the thyristor switch TH is closed and the inductive effect of the inductor L cancels the capacitive effect of the capacitor C so that the net current $I_n$ provided for the AC system is zero. That is the algebraic sum of the capacitor current $I_c$ and the inductor current $I_\alpha$ is equal to zero. The voltage across the parallel combination which includes the capacitive element C, and the inductive element L and the thyristor switch TH is equal to V1. At some non-zero leading VAR demand, the closing of the switch TH is appropriately delayed in each half cycle of the alternating current by a variable angle which shall be called the firing angle $\alpha$ which is measured with respect to the peak of the supply voltage V1 in order to reduce the current $I_\alpha$ flowing in the inductor L.

Referring now to FIG. 2 there is shown a plot of voltage V1 and current $I_\alpha$ vs. $\omega t$. The curves of FIG. 2 are arbitrarily divided into three zones designated A1, B1 and C1 each of which begins with the maximum positive or negative value of V1 in each half cycle as the case may be. It will be noted that in region A1 the inductor current $I_\alpha$ lags the inductor voltage V1 by 90° and the firing angle $\alpha$ is zero. However, with an increasing firing angle $\alpha$ in the region between 0° and 90° the inductive current $I_\alpha$ decreases and consequently the leading VAR provided for the AC system increases. At maximum leading VAR demand the switch TH of FIG. 1 is opened. This occurs at $\alpha$ equal 90°. When this happens the current $I_\alpha$ in the inductor L in FIG. 1 is zero and therefore the maximum rated capacitive element $I_c$ is provided for compensation. FIG. 2 shows in region B1 that for a delay or firing angle $\alpha_1$, the inductive current $I_{\alpha_1}$ flows for a shorter period of time than the current $I_\alpha$ shown in region A1. Likewise in region C1 where the firing angle or delay is $\alpha_2$ (where $\alpha_2$ is greater than $\alpha_1$ in this case) the inductor current $I_{\alpha_2}$ flows for an even shorter period of time than those inductive currents $I_\alpha$ and $I_{\alpha_1}$ shown in regions A1 and B1 respectively.

Referring now to FIGS. 3A–3E an alternating current system having a three phase AC source S and a three phase AC load LO and also having a static or solid state VAR generator SVG is depicted. The control system CS for use with the prior art static VAR generator power circuit of FIG. 1, among other things, comprises a portion of the inventive concept described herein. There is shown in FIG. 3A the alternating electric power source S capable of providing instantaneous line to neutral terminal voltages $v_{T_1}$, $v_{T_2}$ and $v_{T_3}$ to a three phase load LO via transformer $t1$. The intermediate line comprises line inductors LL and line resistors RR. By viewing FIG. 3C it can be seen that the three previously described voltages are provided in this embodiment of the invention, to the primary winding of the transformer $t1$ the secondary winding of which is connected to the alternating current load LO (an arc furnace in this embodiment of the invention). There may also be provided a return line or neutal R/N one end of which is connected to the neutral of the load LO and the other end of which is connected to the neutral of the three phase source S. The three phase line currents on the source side of the lines connected to the static VAR generator are generally designated $i_{S_1}$, $i_{S_2}$ and $i_{S_3}$. Each of these currents flow through the serially connected line inductance LL and line resistance RR. The line to neutral voltages at the output terminals of the source S are generally designated $v_1$, $v_2$ and $v_3$. The currents flowing into the primary of the transformer $t1$ are generally designated $i_1$, $i_2$ and $i_3$. These currents are measured with suitable current sensing means or devices and are provided as input information to the control system CS as shown in FIG. 3A. Likewise the voltages $v_{T_1}$, $v_{T_2}$ and $v_{T_3}$ are also provided as input information for the control system CS also shown in FIG. 3A. The previously described control system CS, in this embodiment of this invention, has the characteristic of converting the latter mentioned instantaneous values of current and voltage into firing angles $\alpha_{12}$, $\alpha_{23}$ and $\alpha_{31}$ for control of the various thyristor switches TH of the compensator circuit CO of the static VAR generator SVG. The delayed firing angles $\alpha_{12}$, $\alpha_{23}$ and $\alpha_{31}$ are determined in successive half cycles of the line voltages such that the combined currents of the load $i_1$, $i_2$ and $i_3$ and the compensator $i_{C_{12}}$, $i_{C_{23}}$, and $i_{C_{31}}$ drawn from the AC source currents $i_{S_1}$, $i_{S_2}$ and $i_{S_{23}}$ become balanced and have a constant reactive component. It is generally required that the reactive components of the line current and therefore the phase angles between each respective terminal current and terminal voltage be zero. For purposes of control it has been determined mathematically that the magnitudes $I_{C_{12}}$, $I_{C_{23}}$ and $I_{C_{31}}$ of the three compensator currents $i_{C_{12}}$, $i_{C_{23}}$ and $i_{C_{31}}$ respectively can be determined for constant (zero) real axis (in phase) voltage drop from the fundamental components of the three line currents by the following equations:

$$I_{C_{12}} = \left[ \left( \frac{RR}{3X} - \frac{1}{\sqrt{3}} \right) i_{2/\frac{dv_{23}}{dt} = 0} - \left( \frac{RR}{3X} + \frac{1}{\sqrt{3}} \right) i_{1/\frac{dv_{31}}{dt} = 0} \right] - I \quad (1)$$

-continued $$I_{c_{12}} = \left[\left(\frac{RR}{3X} - \frac{1}{3}\right) i_{3f\big/\frac{dv_{31}}{dt}=0} - \left(\frac{RR}{3X} + \frac{1}{3}\right) i_{2f\big/\frac{dv_{12}}{dt}=0}\right] - I \quad (2)$$

$$I_{c_{31}} = \left[\left(\frac{RR}{3X} - \frac{1}{\sqrt{3}}\right) i_{1f\big/\frac{dv_{12}}{dt}=0} - \left(\frac{RR}{3X} + \frac{1}{\sqrt{3}}\right) i_{3f\big/\frac{dv_{23}}{dt}=0}\right] - I. \quad (3)$$

In the foregoing equation (1) is a constant which determines the voltage across the line impedance and the input power factor (for zero real axis voltage drop, I = 0). Also in the foregoing equation RR is the line resistance, X = ω LL is the line reactance and the subscript f signifies the fact that only the fundamental components of the line current are to be considered. The meaning of each of the above equations is that the instantaneous magnitudes of the currents $i_{1f}$, $i_{2f}$, $i_{3f}$ have to be measured at the peaks of the line to line or phase voltages $v_{12}$, $v_{23}$ and $v_{31}$, i.e. when the derivatives of the latter voltages with respect to time respectively are equal to zero. This means that in every half cycle a measurement can be made to determine the compensator currents required. In the compensator CO shown in FIG. 3D the left compensator branch has flowing therein the compensating current $i_{C_{31}}$ composed or comprised of a capacitive current $i_{CC_{31}}$, and an inductive current $i_{CL_{31}}$. Likewise the current flowing in the right branch of the compensator circuit is generally designated $i_{C_{12}}$. It has a capacitive component of current $i_{CC_{12}}$ and an inductive component of current $i_{CL_{12}}$. Finally the bottom branch has the compensating current $i_{C_{23}}$ which is comprised of a capacitive component of current $i_{CC_{23}}$ and an inductive component of current $i_{CL_{23}}$. Each of the branches has a controlled thyristor switch arrangement. The right portion or right branch of the compensating circuit has a thyristor switch TH12, the bottom portion has a thyristor switch TH23 and the left portion has a thyristor switch TH31.

In the fixed capacitor thyristor controlled variable inductor VAR generator SVG the magnitudes $I_{C_{12}}$, $I_{C_{23}}$ and $I_{C_{31}}$ of compensator currents are derived as differences between the magnitudes $I_{CC_{12}}$, $I_{CC_{23}}$ and $I_{CC_{31}}$ of fixed capacitor currents and the magnitudes $I_{CL_{12}}$, $I_{CL_{23}}$ and $I_{CL_{31}}$ of the variable inductor currents. The magnitude of the current in the inductors required to satisfy the foregoing equations can be expressed as follows:

$$I_{CL_{12}} = I_{CC_{12}} - I_{C_{12}} \quad (4)$$

$$I_{CL_{23}} = I_{CC_{23}} - I_{C_{23}} \quad (5)$$

$$I_{CL_{31}} = I_{CC_{31}} - I_{C_{31}} \quad (6)$$

$I_{CC}$ in each case may be equal to $\omega CC \sqrt{3} V$ where V is the amplitude of a line to neutral R/N voltage such as $v_{T_1}$, $v_{T_2}$, and $v_{T_3}$. Consequently, the following equations which follow from equations 1–3 can be written respectively as follows:

$$I_{CL_{12}} = I_{CC_{12}} - \left[\left(\frac{RR}{3X} - \frac{1}{\sqrt{3}}\right) i_{2f\big/\frac{dv_{23}}{dt}=0} - \left(\frac{RR}{3X} + \frac{1}{\sqrt{3}}\right) i_{1f\big/\frac{dv_{31}}{dt}=0}\right] + I \quad (7)$$

$$I_{CL_{23}} = I_{CC_{23}} - \left[\left(\frac{RR}{3X} - \frac{1}{\sqrt{3}}\right) i_{3f\big/\frac{dv_{31}}{dt}=0} - \left(\frac{RR}{3X} + \frac{1}{\sqrt{3}}\right) i_{2f\big/\frac{dv_{12}}{dt}=0}\right] + I \quad (8)$$

$$I_{CL_{31}} = I_{CC_{31}} - \left[\left(\frac{RR}{3X} - \frac{1}{\sqrt{3}}\right) i_{1f\big/\frac{dv_{12}}{dt}=0} - \left(\frac{RR}{3X} + \frac{1}{\sqrt{3}}\right) i_{3f\big/\frac{dv_{23}}{dt}=0}\right] + I. \quad (9)$$

In these equations the sign of I has to be positive to obtain the positive real axis voltage drop across the line impedance and the sign of I has to be a negative to obtain the negative real axis voltage across the line impedance. In the former case there is a combined load and compensator power factor which is lagging and in a latter case there is a combined load and compensator power factor which is leading. Finally, I has to be zero for zero real axis voltage drop across the line impedance. This latter case represents the situation where the combined load and compensator power factor is close to unity.

Figure 3B:
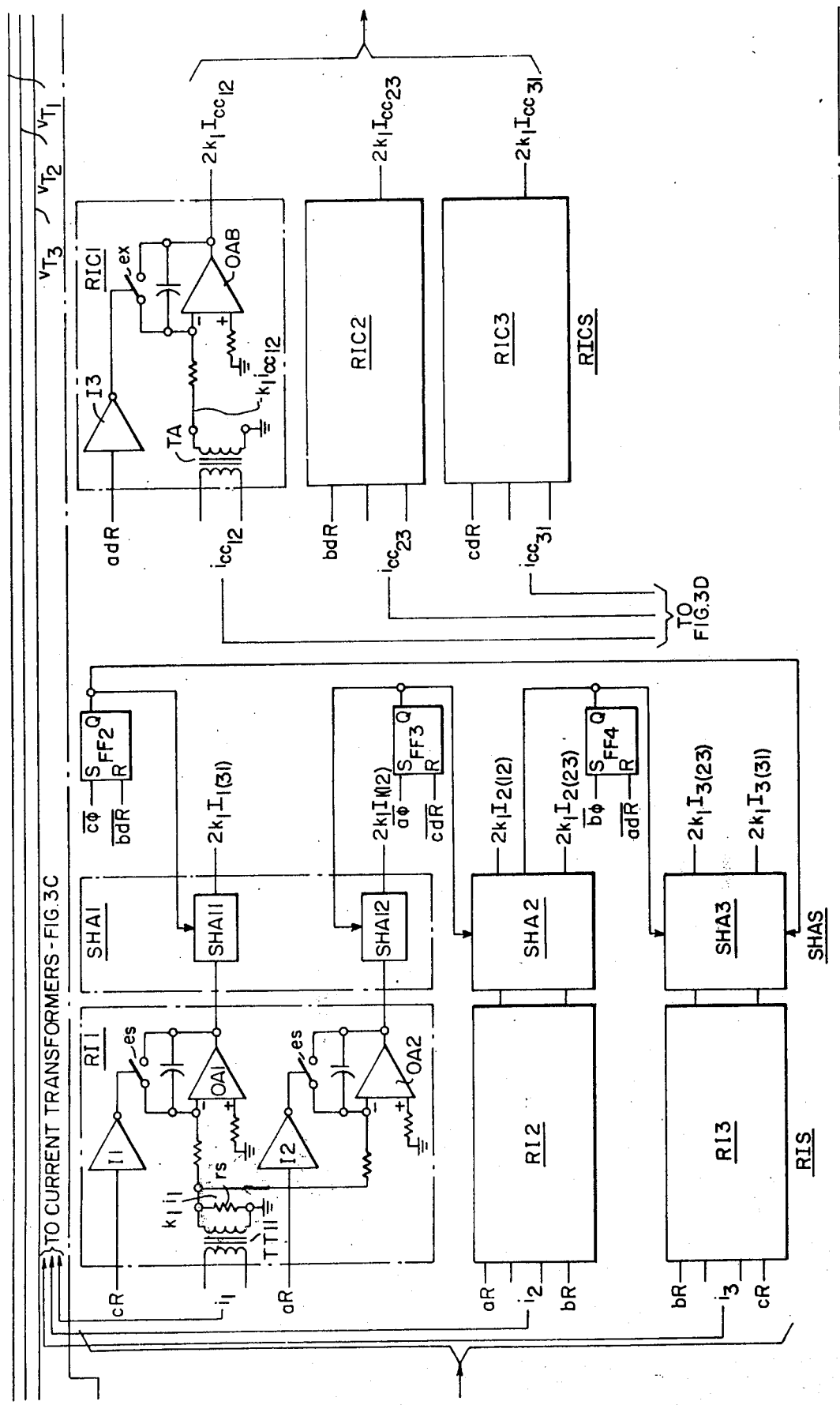
Figure 3C:
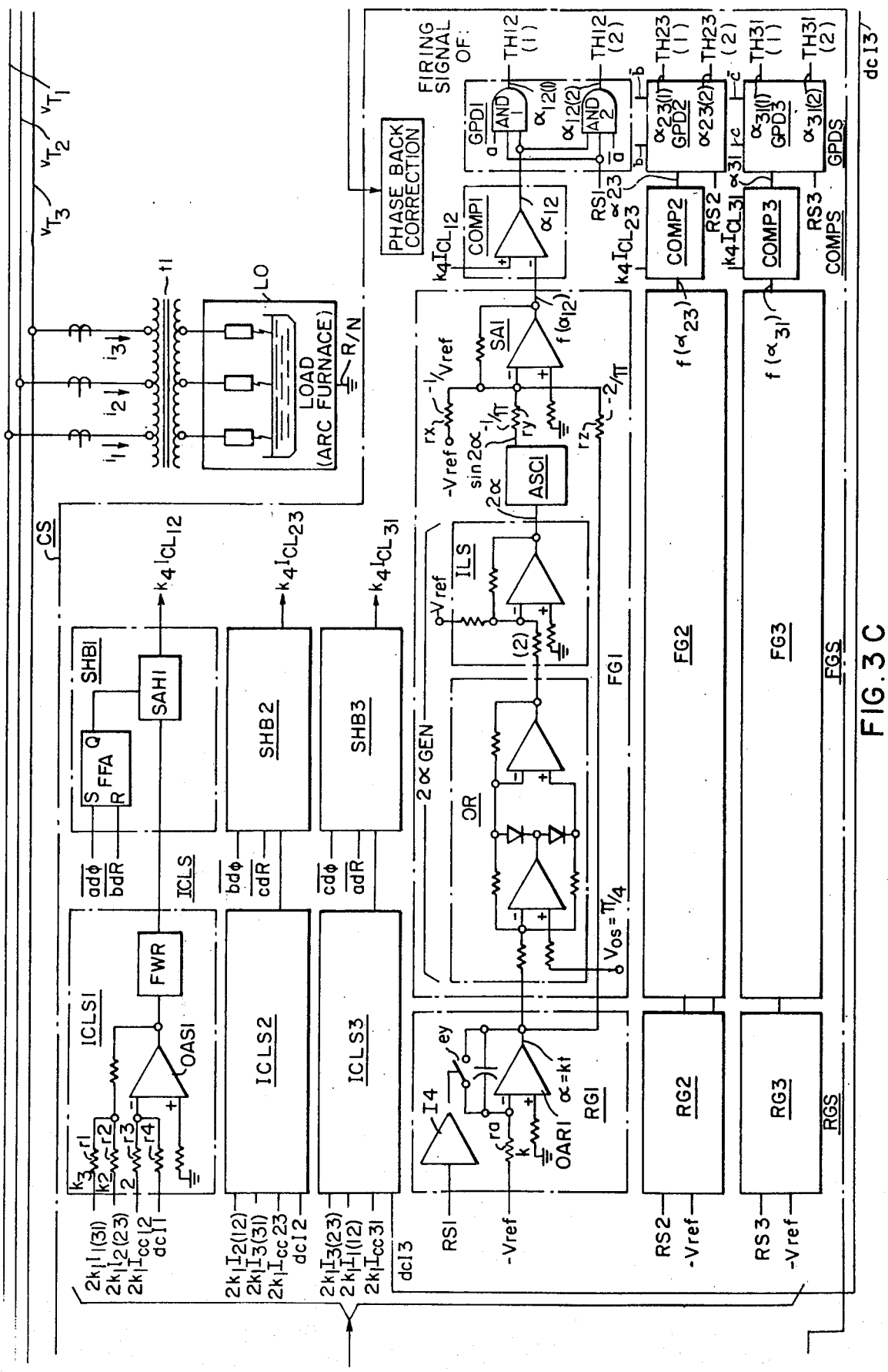
Figure 3D:
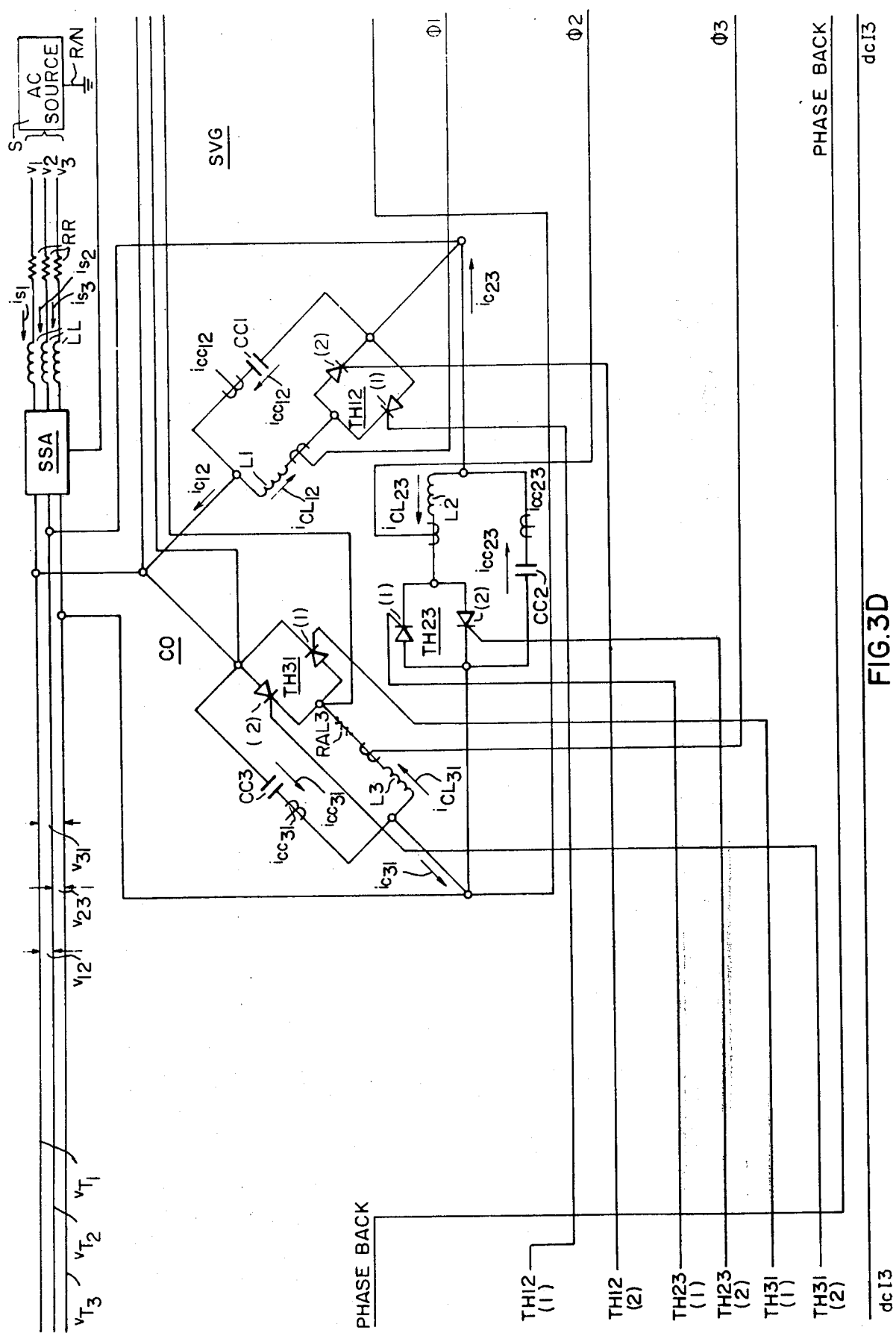

It has been determined that the magnitude of the fundamental current in a thyristor controlled inductor can be expressed as a function of a delay angle α in the following way:

$$I_{CL} = 2\left(\frac{\sqrt{3}\ V}{\pi\omega L}\right)\left(\frac{\pi}{2} - \alpha - \frac{1}{2}\sin 2\alpha\right), \qquad (10)$$

where $$0 \le I_{CL} \le \frac{\sqrt{3}\ V}{\omega L} \text{ for } \frac{\pi}{2} \ge \alpha \ge 0,$$

where $V$ is the amplitude of the line to neutral voltage, and $L = L1, L2$ or $L3$ of unit CO in FIG. 3D. Using equation (10) and the computed values of currents $I_{CL_{12}}, I_{CL_{23}}$ and $I_{CL_{31}}$ as defined by equations (7)–(9), the required delayed angles $\alpha_{12}, \alpha_{23}, \alpha_{31}$ for proper compensation can be determined from the following equations:

$$I_{CL_{12}} = 2\left(\frac{\sqrt{3}\ V}{\pi\omega L1}\right)\left(\frac{\pi}{2} - \alpha_{12} - \frac{1}{2}\sin 2\alpha_{12}\right) \qquad (11)$$

$$I_{CL_{23}} = 2\left(\frac{\sqrt{3}\ V}{\pi\omega L2}\right)\left(\frac{\pi}{2} - \alpha_{23} - \frac{1}{2}\sin 2\alpha_{23}\right) \qquad (12)$$

$$I_{CL_{31}} = 2\left(\frac{\sqrt{3}\ V}{\pi\omega L3}\right)\left(\frac{\pi}{2} - \alpha_{31} - \frac{1}{2}\sin 2\alpha_{31}\right). \qquad (13)$$

It has been found that the direct implementation of the above equations (11)–(13) into an actual control system, though possible, is not always practical, because the required compensator current is determined from the instantaneous values of line current. Since the line currents may in a practical system be distorted, the instantaneous values of current measured may not be the actual magnitudes of the fundamental current at the appropriate instant as is necessary. To avoid this difficulty another approach in which the required instantaneous line current values are indirectly computed from the half cycle average line currents is provided.

Referring now to FIG. 4, a graph is shown which illustrates the foregoing principle. FIG. 4 shows a plot of one line to line or phase voltage $v_{23}$ and one current $i_2$ vs. $\omega t$. In FIG. 4 the actual value of current $i_2$, which in this case is idealized, that is has no distortion, is decomposed into two components one of which $i_2$ IN PHASE is in phase with the voltage $v_{23}$ and one of which $i_2$ QUAD is in quadrature with the voltage $v_{23}$. As is shown in the previously described equation (7) which is used for the computation of the current $I_{CL_{12}}$, the instantaneous value of $i_{2f}$ at the peak of the waveform for the voltage $v_{23}$ is used. The peak of the voltage waveform $v_{23}$ is the place where the derivative of the $v_{23}$ with respect to time equals zero. The magnitude of $i_2$ is shown at this point by the heavy portion of the vertical line at $dv_{23}/dt = 0$ in FIG. 4. Consequently it can be seen that the quantity $i_2$ at the point where $dv_{23}/dt = 0$ represents the maximum amplitude of the in phase component $i_2$ IN PHASE of the current $i_2$. Since the integral of the quadrature component over the positive or negative half cycle of $v_{23}$ is zero and since the integral of the real component is equal to twice its amplitude, it is evident that the quantity $i_2$ at $dv_{23}/dt = 0$ is for sinusoidal quantities, equal to the following equation:

$$i_{2\frac{dv_{23}}{dt}=0} = \frac{1}{2}\int_0^\pi i_2 d(\omega t). \qquad (14)$$

Figure 5:
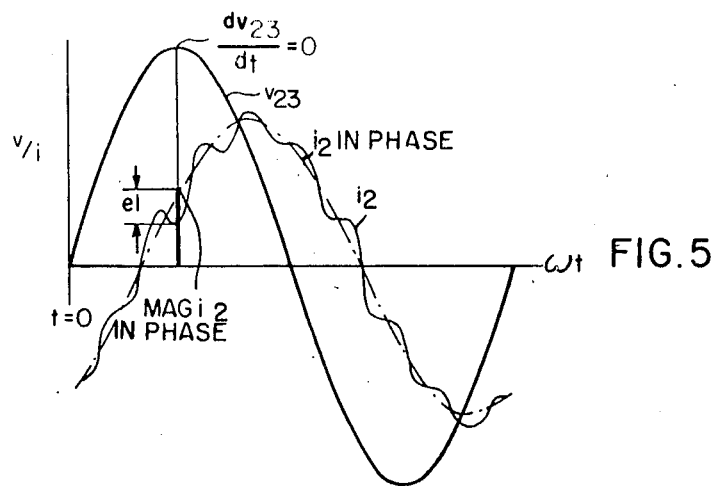
FIG. 5 shows a plot similar to FIG. 4 but with a harmonic rich current.

Referring now to FIG. 5 it is further evident that the integral of equation (14) will essentially represent the amplitude of the in phase fundamental component of current even if the current is severely distorted such as is illustrated in FIG. 5 where the instantaneous measurement would result in a large error $e1$. For this reason equations (7)–(9) are brought forward in the following form which provide the theoretical basis for the practical control system:

$$I_{CL_{12(2t-1)}} = I_{cc} - \frac{1}{2}\left[\left(\frac{RR}{3X} - \frac{1}{\sqrt{3}}\right)\int_{\beta_{23(2t-1)}}^{\beta_{23(2t)}} i_2 d(\omega t) - \left(\frac{RR}{3X} + \frac{1}{\sqrt{3}}\right)\int_{\beta_{31(2t-1)}}^{\beta_{31(2t)}} i_1 d(\omega t)\right] + I \qquad (15)$$

$$I_{CL_{12(2t)}} = I_{cc} - \frac{1}{2}\left[\left(\frac{RR}{3X} - \frac{1}{\sqrt{3}}\right)\int_{\beta_{23(2t)}}^{\beta_{23(2t+1)}} i_2 d(\omega t) - \left(\frac{RR}{3X} + \frac{1}{\sqrt{3}}\right)\int_{\beta_{31(2t)}}^{\beta_{31(2t+1)}} i_1 d(\omega t)\right] + I$$

$$I_{CL_{23(2t-1)}} = I_{cc} - \frac{1}{2}\left[\left(\frac{RR}{3X} - \frac{1}{\sqrt{3}}\right)\int_{\beta_{31(2t-1)}}^{\beta_{31(2t)}} i_3 d(\omega t) - \left(\frac{RR}{3X} + \frac{1}{\sqrt{3}}\right)\int_{\beta_{12(2t-1)}}^{\beta_{12(2t)}} i_2 d(\omega t)\right] + I \qquad (16)$$

$$I_{CL_{23(2t)}} = I_{cc} - \frac{1}{2}\left[\left(\frac{RR}{3X} - \frac{1}{\sqrt{3}}\right)\int_{\beta_{31(2t)}}^{\beta_{31(2t+1)}} i_3 d(\omega t) - \left(\frac{RR}{3X} + \frac{1}{\sqrt{3}}\right)\int_{\beta_{12(2t)}}^{\beta_{12(2t+1)}} i_2 d(\omega t)\right] + I$$

-continued $$I_{CL_{31(2i-1)}} = I_{cc} - \frac{1}{2}\left[\left(\frac{RR}{3X} - \frac{1}{\sqrt{3}}\right)\int_{\beta_{12(2i-1)}}^{\beta_{12(2i)}} i_1 d(\omega t) - \left(\frac{RR}{3X} + \frac{1}{\sqrt{3}}\right)\int_{\beta_{23(2i-1)}}^{\beta_{23(2i)}} i_3 d(\omega t)\right] + I \quad (17)$$

$$I_{CL_{31(2i)}} = I_{cc} - \frac{1}{2}\left[\left(\frac{RR}{3X} - \frac{1}{\sqrt{3}}\right)\int_{\beta_{12(2i)}}^{\beta_{12(2i+1)}} i_1 d(\omega t) - \left(\frac{RR}{3X} + \frac{1}{\sqrt{3}}\right)\int_{\beta_{23(2i)}}^{\beta_{23(2i+1)}} i_3 d(\omega t)\right] + I$$

where $i = 1, 2, 3 \ldots$ etc.

Figure 6:
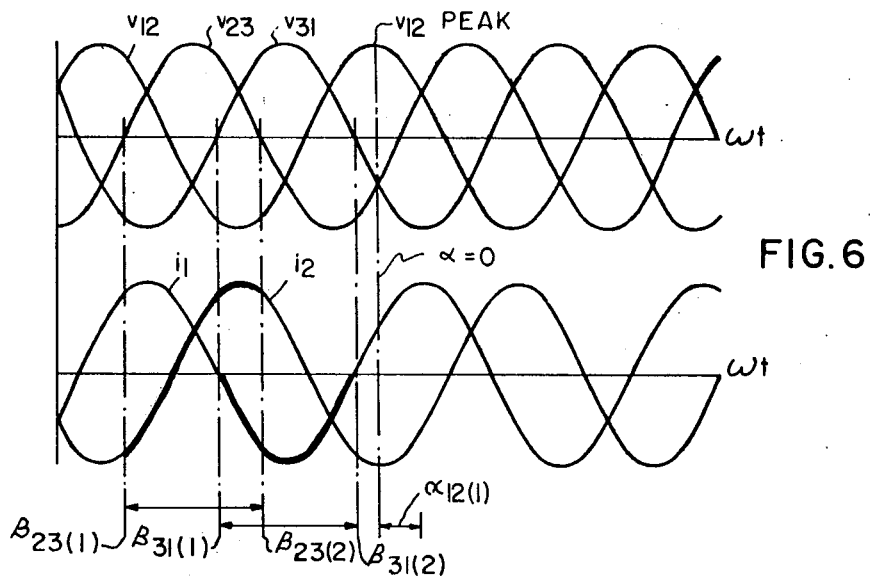
FIG. 6 shows current integration regions versus phase voltages as a function of $\omega t$.

In the preceding equations the values $I_{CL\ 12(2i-1)}$, $I_{CL\ 23(2i-1)}$, and $I_{CL\ 31(2i-1)}$ represent the amplitude of the currents in the three controlled inductors for the required compensator currents in the given positive half cycles and the values $I_{CL12(2i)}$, $I_{CL23(2i)}$, and $I_{CL\ 31(2i)}$ represent the amplitudes of the currents in the three controlled inductors for the required compensator current in a given negative half cycle. Likewise angles $\beta_{12(2i-1)}$, $\beta_{12(2i)}$, $\beta_{23(2i-1)}$, $\beta_{23(2i)}$, etc. represent the half cycle integration limits measured from an arbitrarily selected reference point such as the first zero crossing point of the line to neutral voltage $v_{T_1}$ are represented in FIG. 6 (to be described hereinafter). The preceding values of current result in corresponding respective delay angles $\alpha_{12(2i-1)}$, $\alpha_{23(2i-1)}$ and $\alpha_{31(2i-1)}$ which are the firing angles for the thyristors which are capable of conducting positive current in the AC switches, i.e. TH12(2), TH23(2) and TH31(2), and the delay angles $\alpha_{12(2i)}$, $\alpha_{23(2i)}$, $\alpha_{31(2i)}$ which are the firing angles of the thyristors which are capable of conducting negative current in the AC switches, i.e. TH12(1), Th23(1) and TH31(1). The delay angles previously mentioned are computed by utilizing the concepts set forth in equations (11)–(13).

Referring now to FIG. 6 an example of the foregoing is depicted. By looking at equation (15) for the positive half cycle and substituting 1 for $i$ the following equation results:

$$I_{CL_{12(1)}} = I_{cc} - \frac{1}{2}\left[\left(\frac{RR}{3X} - \frac{1}{\sqrt{3}}\right)\int_{\beta_{23(1)}}^{\beta_{23(2)}} i_2 d(\omega t) - \left(\frac{RR}{3X} + \frac{1}{\sqrt{3}}\right)\int_{\beta_{31(1)}}^{\beta_{31(2)}} i_1 d(\omega t)\right] + I. \quad (15a)$$

From the latter equation we find $I_{CL_{12(1)}}$. Utilizing the latter equation in conjunction with equation (11) we may calculate $\alpha_{12(1)}$. It can be seen according to FIG. 6 that $\alpha_{12(1)}$ is available for utilization in the control circuit for firing the thyristor switch TH12(2) associated therewith after prior and necessary calculations have occurred. It can be seen that the calculation of $\alpha_{12(1)}$ must begin at the point $\beta_{23(1)}$ on the $\omega t$ axis and end at the point $\beta_{31(2)}$ thereof. The angle $\alpha_{12(1)}$ is then shown as a delay or firing angle which is measured from the point where the voltage $v_{12}$ reaches a positive peak. In a like manner similar firing angles for other phases and currents may be determined.

Figure 8:
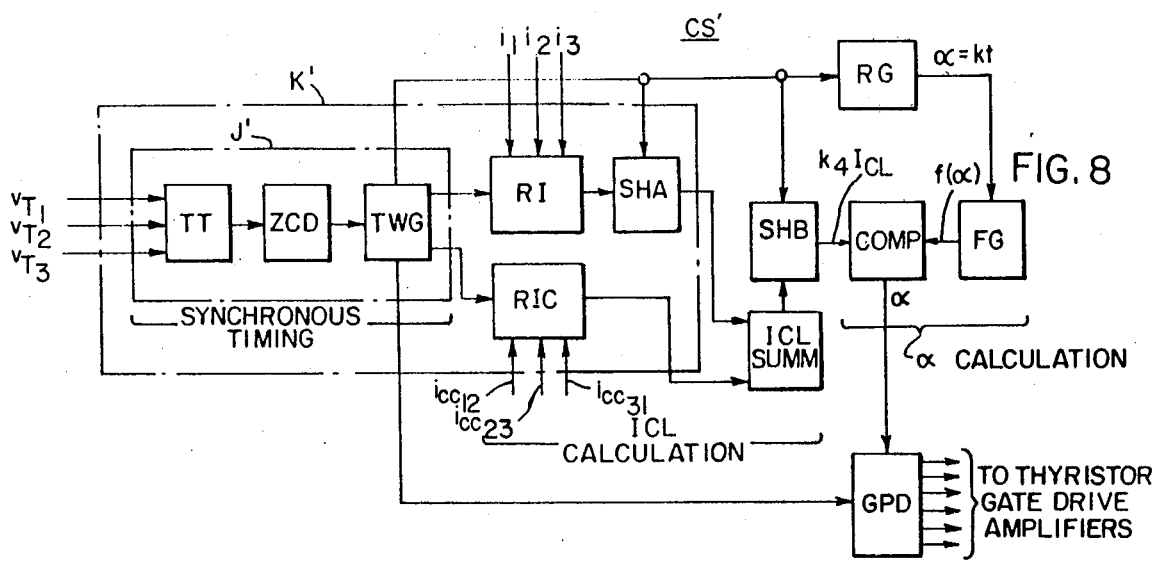
FIG. 8 shows a block diagram for a portion of the control system of FIG. 3 utilizing the integration limits and techniques exemplified in FIG. 6.

Referring now to FIG. 8 a practical system for implementing the previously described electrical and mathematical relationships is shown. The system of FIG. 8 is shown in block diagram form, it being understood that the various functional blocks shown therein may be replaced with electrical components. The block diagram CS' of FIG. 8 may represent the control circuit CS shown in FIG. 3 for controlling the compensator CO of the VAR generator network SVG also shown in FIGS. 3A–3C. The main function of the control circuit CS' is to generate gate control pulses for each thyristor in the compensator CO to thereby maintain constant (unity) line power factor under varying load conditions. To achieve this the control CS' has to perform three major tasks in synchronism with the power line voltages. First it has to calculate the various inductor currents $I_{CL_{12}}$, etc. required for compensation, second it has to determine the corresponding firing angles $\alpha_{12}$, etc. for each thyristor, third it has to fire the appropriate thyristors at appropriate times corresponding to the previously calculated firing angles. From left to right in the block diagram CS' of FIG. 8 the following functions are performed. First synchronous timing is implemented which coordinates the accomplishment of the three major tasks described above. Control system CS' utilizes a timing transformer TT, six zero crossing detectors ZCD and a timing waveform generator TWG. The timing waveform generator TWG fabricates or generates various logic waveforms synchronized to the various power line voltages, which, in turn control the current and firing angle calculations and the distribution of the gate pulses to the appropriate thyristors. To the right of the synchronous timing portion of the block diagram of FIG. 8 are those functional blocks which perform the current calculations indicated by the equations (15)–(17) described previously. According to the equations (15)–(17) two of the three constituents of the current $I_{CL}$ are obtained by integrating two line currents within prescribed intervals. Each of these line current integrations are performed by one of the three resettable integrators shown as one functional block RI in FIG. 8. The results of the integrations are stored by sample and hold techniques in three sample and hold means or functional block also shown as one functional block SHA in FIG. 8. The third component $I_{CC}$ of the required inductor current $I_{CL}$ is the amplitude of the current flowing in the fixed capacitors CC1, CC2 or CC3, as the case may be, shown in FIG. 3D. Each current $I_{CC}$ is obtained through the use of one three resettable integrators shown as one functional block RIC which integrates the instantaneous value of the capacitor current between consecutive peaks of the capacitor voltage. The three calculated constituent currents of $I_{CL}$ are weighed according to the constant coefficients of equations (15)–(17) in each phase by a summing amplifier SUMM. The output of each summing amplifier SUMM is sampled and held at consecutive peaks of the capacitor voltages in a device known as the sample and hold functional block SHB. At these latter sampling instances the output voltages of the resettable integrators RIC are proportional to the respective currents $I_{CC}$ and therefore the outputs of the summing amplifiers are proportional to the corresponding values of $I_{CL}$. It can be seen by reference to FIG. 6 that these sampling points correspond to a firing angular position of $\alpha = 0$. Next it is desired to calculate the appropriate firing angles for the thyristor switches shown in FIG. 3. In each expression for the firing angle, one of the equations (11)–(13) is solved in real time by one of the three function generators FG shown in the $\alpha$ CALCULATION portion of FIG. 8. Each function generator FG is controlled by a corresponding ramp generator RG which is in turn controlled by the previously described timing wave generator TWG. The linear output voltage from the ramp generator RG corresponds to $\alpha$ equals some constant $(k)$ times time $(t)$, that is $\alpha = kt$.

Figure 7:
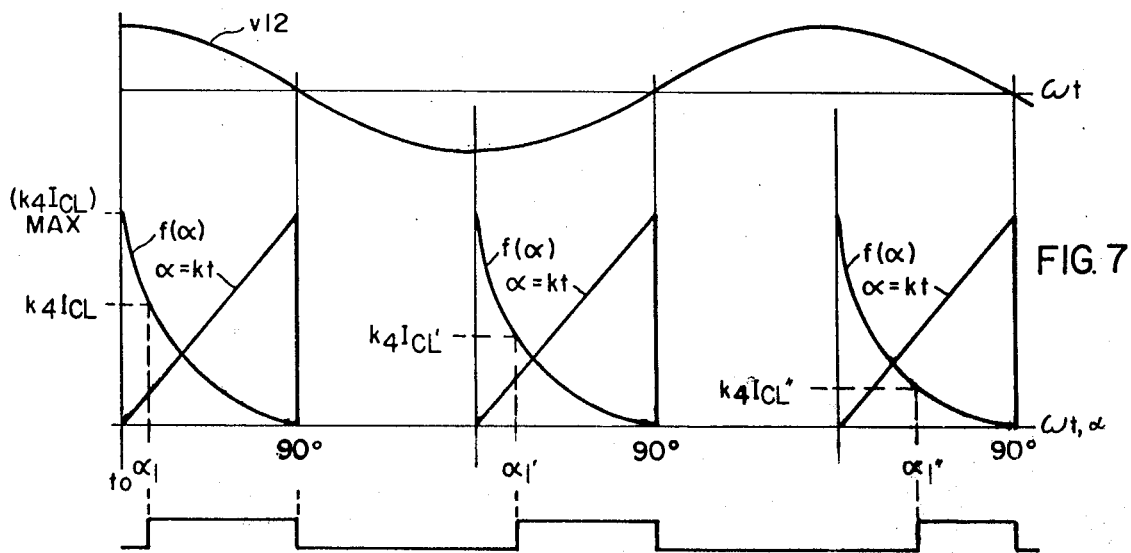
FIG. 7 shows an input signal for a comparator in the control system of FIG. 3 referenced against a phase voltage.

Referring now to FIG. 7 a graph is shown indicating ramp generator RG output signals $\alpha = kt$ vs. some function $f(\alpha)$. At the start of the curve, $\alpha$ and the ramp voltage ($\alpha = kt$) are equal to zero. At $\alpha$ equal 90° the ramp voltage is at a maximum. The function generator FG is an analog computer circuit with voltage input and $f(\alpha)$ output. FIG. 7 is shown for different values of current, i.e. $I_{CL}$, $I_{CL'}$, and $\alpha_{CL''}$. From these come the angle values $\alpha_1 \alpha_{1'}$, and $\alpha_{1''}$. It is convenient to scale down the $f(\alpha)$ magnitude to control voltage levels. The following $$f(\alpha) = \frac{2}{\pi}\left(\frac{\pi}{2} - \alpha - \frac{1}{2}\sin 2\alpha\right). \tag{17a}$$

The scale factors for alpha are equal in both the ramp generator RG and the function generator FG. The function generator FG as driven by the ramp generator RG is synchronized to the AC line voltage, therefore real time solutions of equations (11)–(13) are obtained for $\alpha$ by comparing the corresponding functions of the alpha $f(\alpha)$ to the value $k_4 I_{CL}$ in each case.

Referring once again to FIG. 7 it can be seen that where alpha equals zero the function of alpha is maximum and that value decreases to zero as alpha approaches 90°. For the case where the value $\alpha = \alpha_1$ the following relationships apply:

at $\alpha < \alpha_1$, $k_4 I_{CL} < f(\alpha)$ at $\alpha > \alpha_1$, $k_4 I_{CL} > f(\alpha)$ $$(k_4 I_{CL})_{max} = k_4 \frac{\sqrt{3}\, V}{\omega L} = (f(\alpha))_{max}. \tag{18}$$

In circuit terms it can be said that if the outputs of the function generator FG and the sample and hold functional block SHB of FIG. 8 are compared the output of the comparator will change state at a point alpha = alpha 1 ($\alpha = \alpha_1$). That point is at the time when firing should be initiated. Since the two thyristors in the same compensator branch of the compensator CO of FIG. 3 are always fired more than 90° apart, one function generator FG is capable of serving two thyristors in the compensator CO.

The comparator output signals of FIG. 8 are shaped and decoded in a gate pulse distributor GPD. The output signals from the state pulse distributor GPD are provided in a form suitable to switch on (or fire) a thyristor in the compensator CO shown in FIG. 3.

The circuit implementation of the system block diagram shown in FIG. 8 generally utilize the following conventions:

Generally accepted analog and digital circuit symbols are used.

Monostable circuits are positive edge triggered.

Reset-set flip-flops are negative level triggered on their respective R-S-inputs.

Gains of operational amplifier circuits are equal to one or as marked for each input resistor.

Logic "high" means hold and logic "low" means sample when these signals are applied at a sample and hold control input.

Switches are shorted on high logic signals and opened on low logic signals.

Comparators have infinite gain and logic compatible outputs.

Referring once again to FIGS. 3A–3E the circuit implementation of the block diagram shown in FIG. 8 is depicted as a portion of the control circuit function block CS. To the left in FIG. 3A is a timing transformer system TT1. The timing transformer system TTI comprises a delta connected three phase winding, having the primary windings connected in delta circuit relationship for transformers T1, T2 and T3. The common point between the transformers T1 and T2 is connected to the $v_{T_2}$ terminal of the power line shown in FIG. 3A. Likewise the common point between the primary windings of the transformers T2 and T3 is connected to the $v_{T_3}$ line terminal and the common point between the primary windings of transformers T3 and T1 is connected to the system line terminal $v_{T_1}$. The secondary windings of transformers T1, T2 and T3 of the timing transformer system TTI are also connected in delta relationship. Between the secondary windings of the transformers T1 and T2 is connected an output terminal $v'_{T_2}$ likewise between the secondary windings of the transformers T2 and T3 is connected the output terminal $v'_{T_3}$ and finally between the secondary windings of the transformers T3 and T1 is connected the output terminal $v'_{T_1}$. To the midpoint of each of the secondary windings of the transformers T1, T2 and T3 are connected output terminals CT1, CT2 and CT3, respectively. It can be seen by comparing the timing transformer system TT1 of FIG. 3 and the timing transformer functional block TT of FIG. 8 that the inputs for the timing transformer are the voltages $v_{T_1}$, $v_{T_2}$, and $v_{T_3}$. Because the timing transformer system TT1 shown in FIG. 3 is a three phase center tapped transformer system, both the in phase and the orthogonal component of line to line voltage are directly available between corresponding terminals. For example, the quantity $v'_{T_3} - CT1$ is orthogonal to the in phase line to line voltage component $v'_{T_1} - v'_{T_2}$.

To the right of the timing transformer system TT1 in FIG. 3A are six zero cross detectors ACD1 and their resettable integrator RI3 has two electronic switches therein (also not shown) which are controlled by the signals $b$R and $c$R. The resettable integrators RI2 and RI3 have serially connected sample and hold means SHA2 and SHA3 similar to the sample and hold means SHA1 described previously. The sample and hold means SHA2 has sample and hold devices therein (not shown) controlled by the previously described flip-flop FF3 and another flip-flop FF4. The sample and hold device SHA3 has sample and hold means therein, similar to those shown in the sample and hold portion SHA1, which are controlled by the flip-flop FF4 and the flip-flop FF2. The input to the flip-flop FF4 comprises at the set terminal thereof the signal $\overline{b\phi}$ and at the reset terminal thereof the signal $\overline{adR}$. The output of the sample and hold device SHA2 comprises at one terminal the signal $2k_1I_{2(12)}$ and at the other terminal thereof the signal $2k_1I_{2(23)}$. The outputs of the sample and hold means SHA23 are the signals $2k_1I_{3(23)}$ at one terminal thereof and $2k_1I_{3(31)}$ at another terminal thereof.

The resettable integrators RIC shown in FIG. 8 are also shown in schematic form as RICS in FIG. 3B. The first of the resettable integrators RIC1 comprises an analog integrator circuit OAB which comprises an inverting operational amplifier with input resistor and integrating capacitor. The input to the integrator circuit OAB is provided through a transformer TA the primary of which is interconnected through a current transformer to measure the current $i_{CC_{12}}$ flowing in the right-most capacitor CC1 of the compensator circuit CO. A burden resistor (not shown) is connected across the secondary of the appropriate current transformer in system CO. The value of the signal at the input of the integrator circuit OAB is $-k_1i_{CC_{12}}$. The output of the integrator OAB is $2k_1I_{CC_{12}}$. The feedback capacitor of the integrator OAB has connected thereacross an electronic switch $ex$ which is controlled by an inverter I3 the input of which is connected to the $adR$ signal shown in the timing diagram of FIG. 9. When the integrating capacitor of the operational amplifier OAB is shorted by the operation of the electronic switch $ex$, integration of the input signal ceases. There are two other resettable integrators RIC2 and RIC3. The latter resettable integrators RIC2 and RIC3 operate in a similar manner to the previously described integrator RIC1. The signal input for the integrator RIC2 is the signal $i_{CC_{23}}$ which is provided by measuring the current through the bottom-most capacitor CC2 of the compensator circuit CO. The timing control of the resettable integrator RIC2 is controlled by the signal $bdR$ as is shown in the timing diagram of FIG. 9. The output of the resettable integrator RIC2 is $2k_1I_{CC_{23}}$. Finally the resettable integrator RIC has as an input signal the current $i_{CC_{31}}$ flowing through the left-most capacitor CC3 of the compensator circuit CO. The timing control signal for the latter resettable integrator RIC3 is the signal $cdR$ as shown in the timing waveform diagram of FIG. 9. The ouput signal of the resettable integrator RIC3 is $2k_1I_{CC_{31}}$.

As can be seen by examining FIG. 8 once again the inputs for the ICL SUMM functional block come from the sample and hold functional block SHA and from the resettable integrator functional block RIC.

A circuit schematic diagram for element ICLS (which is partially in block diagram form) is shown in FIG. 3C for three similar portions of the ICL SUMM functional block indicated in FIG. 8. One of the devices in one of the current summing amplifiers ICLS1 is a summing circuit comprising a standard operational amplifier OAS1 with summing and feedback resistors. In this particular case there may be four input summing resistors $r1$, $r2$, $r3$, and $r4$. The first three summing resistors $r1$, $r2$, and $r3$ are utilized to sum the signals which have been generated in some of the previously described portions of the network of FIG. 3A–3B. As an example the resistive element $r1$, represents a constant gain $k3$ utilized in scaling the signal $2k_1I_{1(31)}$. The resistive element $r2$ represents the scaling factor $k_2$ for scaling the summing the signal $2k_1I_{2(23)}$ and the resistive element $r3$ represents the scaling factor "2" for scaling and summing the signal $2k_1I_{CC_{12}}$. The latter three mentioned signals have been previously described. The last summing resistor $r4$ may be utilized in some embodiments of the invention for subtracting or correcting for DC bias as represented by the signal $dc$I1 (refer to FIG. 3E). The previously described signals are summed by the summing operational amplifier network OAS1 the output of which is provided to the input of a full wave rectifier network FWR. The output of the full wave rectifier FWR is supplied to a sample and hold system SHB1 at the functional block generally designated SHA1 which is controlled by an RS flip-flop FFA. The set input to the RS flip-flop FFA is the signal $\overline{ad\phi}$. The reset input of the RS flip-flop FFA is the signal $\overline{bdR}$. The Q output of the RS flip-flop FFA is supplied to the enabling or control input of the sample and hold means or device SAH1. The output of the sampling device SHB1 is the signal $k_4I_{CL_{12}}$. The value of the $k_2$ coefficient and the value of the $k_3$ coefficient are as defined in equations (15), (16), and (17), i.e.:

$$k_2 = \frac{RR}{3X} - \frac{1}{\sqrt{3}} \qquad (18a)$$

$$k_3 = \frac{RR}{3X} + \frac{1}{\sqrt{3}}. \qquad (18b)$$

There are two other summing amplifiers and two other sample and hold means which are similar to the previously described summing amplifier ICLS1 and sample and hold means SHB1. The summing amplifier ICLS2 has an input the following signals: $2k_1I_{2(12)}$, $2k_1I_{3(31)}$, $2k_1I_{CC_{23}}$ and a DC bias reducing signal $dc$I2. The inputs to the complementary corresponding sample and hold circuit SHB2 for the summing amplifier ICLS2 are the signals $\overline{bd\phi}$ and $\overline{cdR}$ and the output for the amplifier ICLS2. The complementary signals for $\overline{bdo}$ and $\overline{cdR}$ are shown in the timing waveform diagram of FIG. 9. The output of the sample and hold means SHB2 is $k_4I_{CL_{23}}$. There is a third summing amplifier ICLS3 which has as inputs the following signals $2k_1I_{3(23)}$, $2k_1I_{1(12)}$, and $2k_1I_{CC_{31}}$ and the DC bias removing signal $dc$I3. The complementary sample and hold portion SHB3 has as input signals thereto the signal $\overline{cd\phi}$ and $\overline{adR}$. The output of the SHB3 network is the signal $k_4I_{CL_{31}}$.

Figure 9:
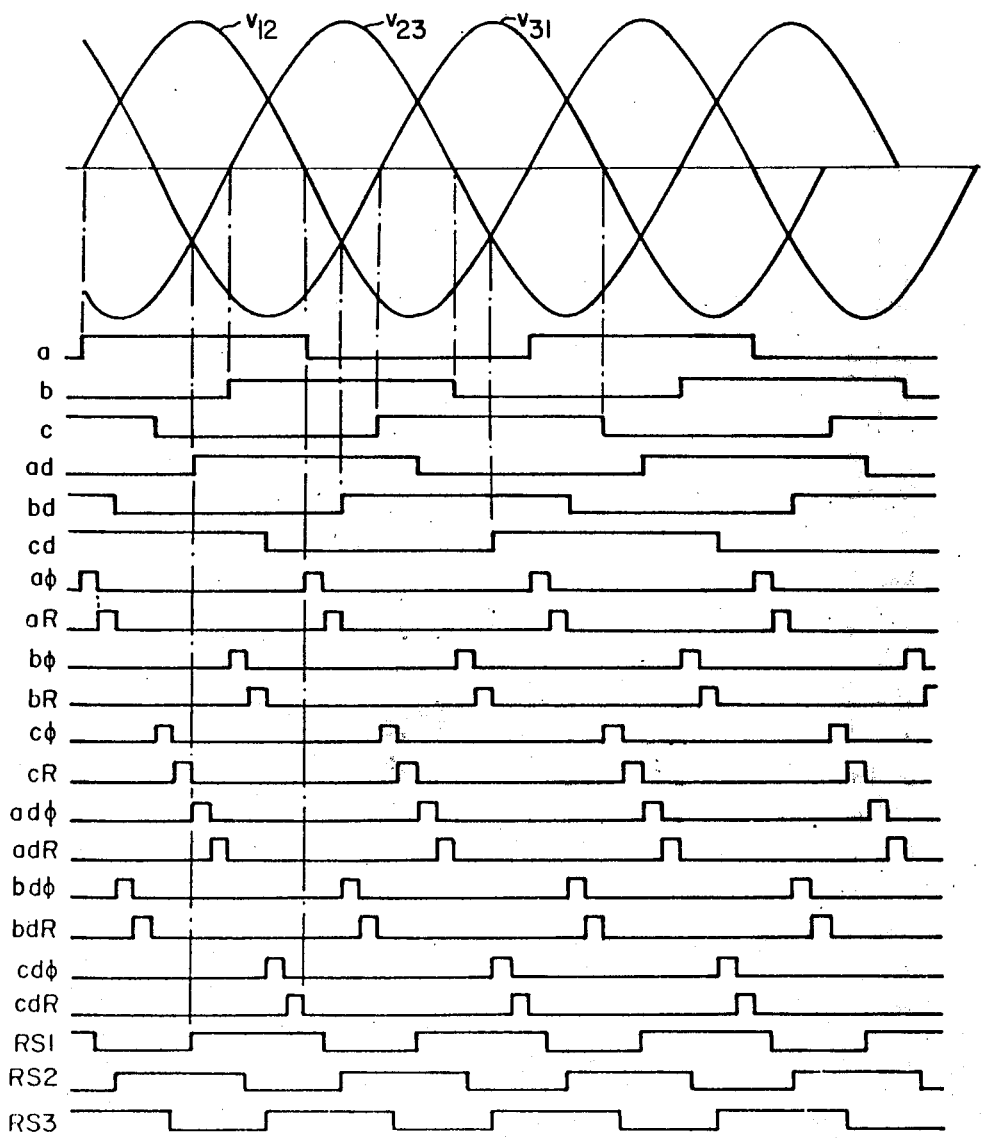
FIG. 9 shows a phase voltage reference waveform timing diagram for signals generated in the control system of FIGS. 3 and 8.
Figure 14:
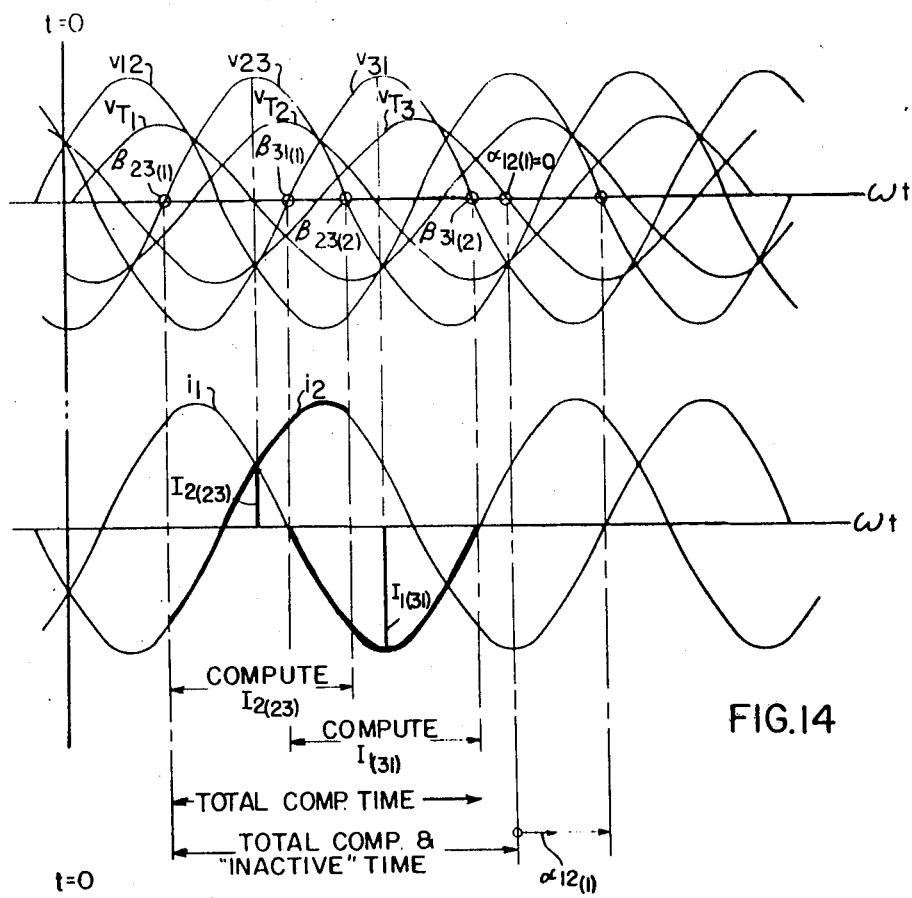
FIG. 14 shows a plot repeating some of the information shown in FIG. 6.

Since the sum of the currents in the previously described summing amplifiers changes polarity in cqnsecutive half cycles, the absolute value of any of the output signals therefrom must be taken for comparison with a function of alpha $f(\alpha)$, of fixed polarity. A sample and hold network B such as SHB1 operates similarly to a sample and hold network A (SHA1) as previously described. Sampling occurs for a low digital signal and hold occurs at a high digital signal. There are also provided three ramp generators RG1, RG2, and RG3, of a associated serially connected timing waveform generators TWG1 through TWG6. The first of the zero crossing detectors comprises a comparator CPa. The comparator CPa has two inputs one of which is a $v'_{T_1}$ input from the timing transformer system TT1 and the other of which is the $v'_{T_2}$ input from the timing transformer system TT1. The output of the comparator CPa produces a signal $a$ which is shown in FIG. 9 and which is high or at a digital "one" when the voltage $v_{12}$ is positive. In a like manner comparator CPb utilizes the input signals $v'_{T_2}$ and $v'_{T_3}$ to produce an output signal $b$ as shown in FIG. 9 which is at a digital one when the voltage $v_{23}$ is positive. In a like manner comparator CPc utilizes the voltage signals $v'_{T_3}$ and $v'_{T_1}$ to provide an output signal $c$ as shown in FIG. 9 which is at a digital one when the voltage signal $v_{31}$ is positive. The comparator CPad utilizes the TT1 output signals $v'_{T_3}$ and CT1 to produce the output signal "$ad$" as shown in FIG. 9 which is in quadrature with or 90° out of phase with the square wave $a$ as shown in FIG. 9. Comparator CPbd utilizes the signals $v'_{T_1}$ and CT2 to produce the output signal "$bd$" as shown in FIG. 9 which lags the signal $b$ by 90° as shown in FIG. 9. Finally comparator CPcd utilizes the signals $v'_{T_2}$ and CT3 to produce the output signal "$cd$" which is 90° out of phase with the signal $c$ shown in FIG. 9. The timing wave generator portion TWG1 of the timing wave system TWGS is connected at its input to the output of the comparator CPa. The $a$ signal shown in FIG. 9 is provided to an inverter INV where an inverted signal $\bar{a}$ is produced at the output thereof. This latter signal is provided to the trigger input terminal of a monostable multivibrator M1 where an output is taken off the output terminal thereof. The noninverted $a$ signal is also provided to the trigger input terminal of a monostable multivibrator M2 where an output is taken off the output terminal thereof. The latter two output signals are provided to a NOR gate NOR1 which provides an output signal $\overline{a0}$ the complement of which is shown in FIG. 9. This latter signal is provided to a monostable multivibrator M3 at the trigger input terminal thereof. Output signals are taken off the monostable multivibrator M3 at the Q and $\overline{Q}$ output terminals thereof. Signal $aR$ is shown in FIG. 9 and it is the signal taken off the Q terminal. Signal $\overline{aR}$ (not shown in FIG. 9), the complement to signal "$aR$" is taken off the $\overline{Q}$ terminal. In a like manner timing waveform generator portions TWG2–TWG6 produce output signals $bR$ and $\overline{bR}$; $cR$, $\overline{cR}$; $adR$, $\overline{adR}$; $bdR$, $\overline{bdR}$; and $cdR$, $\overline{cdR}$, respectively. With the exception of the complementary signals all of the preceding signals are shown in the timing waveform diagram of FIG. 9. Timing waveform generator TWG4 has an additional portion TWG4A which comprises a set-reset flip-flop FF1 and where a signal $ad0$ is provided to the set terminal thereof and the signal $\overline{aR}$ is provided to the reset terminal thereof. The outputs of the flip-flop FF1 are provided at the Q and $\overline{Q}$ terminals thereof and are identified as RS1 and $\overline{RS1}$ respectively. The signal RS1 is shown in the timing waveform diagram of FIG. 9. In a like manner the timing waveform generators TWG5 and TWG6 have portions TWG5A and TWG6A respectively which are similar to the portion TWG4A described previously. The input signals for the portion TWG5A comprise the signal $bd0$ generated with a portion of the timing wave generator portion TWG5 and the signal $\overline{bR}$. The output of the portion TWG5A comprises complementary signals RS2 and $\overline{RS2}$. The signal RS2 is shown in the timing waveform diagram of FIG. 9. The timing waveform generator portion TWG6A has input signals $cd0$ which is generated within an internal portion of the timing waveform generator portion TWG6 and input signal $\overline{cR}$. The output of the portion TWG6A comprises two complementary signals generally designated RS3 and $\overline{RS3}$. The signal RS3 is shown in the timing waveform diagram of FIG. 9.

To the right of the timing wave generator TWGS in FIG. 3B are the resettable integrator system RIS and the sample and hold system SHAS. The latter systems comprise for example a resettable integrator RI1 and a sample and hold circuit SHA1 respectively. The resettable integrator RI1 comprises two operational amplifiers OA1 and OA2 connected as integrators of current signals $k_1 i_1$ obtained from the burden resistor $rs$ connected in parallel across the secondary winding of current transformer resistor TT11. The primary of the transformer TT11 is connected as a sensor for measuring the current $i_1$ flowing in the electrical power system which supplies energy to the load or arc furnace. The feedback capacitors of the integrators OA1 and OA2 have connected in parallel relationships thereacross electronic switches $es$ which are capable of shortcircuiting the respective capacitors thus ending the integration action of the integrators OA1 or OA2. The electronic switches $es$ are driven in each case by inverters I1 and I2 respectively. Inverter I1 is driven by the $cR$ waveform shown in FIG. 9 and the inverter I2 is driven by the $aR$ waveform shown in FIG. 9. As the previously mentioned respective waveforms become high or take on the digital one state, the electronic switches $es$ short the feedback capacitors. The switches $es$ are opened again thus allowing the integration operations to continue when the respective signals $aR$ and $cR$ are at digital "zeros" or at signal lows. Connected to the output of the operational amplifier OA1 is a sample and hold functional block generally designated SHA11. Connected to the output of the operational amplifier OA2 is a sample and hold functional block or means generally designated SHA12. The sample and hold means SHA11 is enabled or controlled by the Q output of a flip-flop generally designated FF2. The set input terminal of the last mentioned flip-flop FF2 is the $\overline{c\phi}$ signal. The reset input terminal of the last mentioned flip-flop FF2 is the $\overline{bdR}$ signal. When the Q output of the flip-flop FF2 goes high the sample and hold device SHA11 holds the output value from the integrator OA1. When the Q output of the flip-flop FF2 goes low the sample and hold means or device SHA11 samples the output of the operational amplifier OA1. In a like manner the sample and hold means SHA12 is controlled by the Q output terminal of a flip-flop FF3. The flip-flop FF3 has at its set input the signal $\overline{a\phi}$ and at its reset input the signal $\overline{cdR}$. The complementary signals for the latter mentioned inputs for the flip-flop FF3 are shown in the timing waveform diagram of FIG. 9. The sample and hold means SHA12 performs a hold and sample operation, sensing the output voltage of the operational amplifier OA2 as a function of the Q output of the flip-flop FF3 in a manner similar to that described with respect to the sample and hold device SHA11. The output of the sample and hold means SHA11 is equal to $2k_1 I_{1(12)}$. There are two other resettable integrators generally designated RI2 and RI3 which have as their analog inputs the currents $i_2$ and $i_3$ respectively. The resettable integrator RI2 has electronic switches contained therein (but not shown) which are controlled by the $aR$ and $bR$ signals. The ramp generator system RGS which is similar to the ramp generator RG in FIG. 8. The ramp generator RG1 is shown in schematic diagram form while the ramp generators RG2 and RG3 which operate similarly to the ramp generator RG1 are shown in block diagram form. The ramp generator RG1 comprises an integrator circuit OAR1 which may be a standard well known integrator circuit of the type employing an operational amplifier with a capacitive feedback and resistive input network. There is provided a reference signal −Vref which is utilized to drive the ramp generator RG1. The capacitive element of the operational amplifying integrator OAR1 may be short circuited by an electronic switch $ey$ controlled by an inverter I4. The input signal to the inverter I4 is signal RS1. When the constant reference signal −Vref is applied to the integrating amplifier circuit OAR1, an input scaling resistor $ra$ provides the scaling constant $k$. Consequently, the output of the electronically switched and controlled operational amplifier integrating circuit OAR1 is equal to the function $\alpha = kt$. The output of the ramp generator RG1 therefore is linear and positive going and it has as an amplitude the value $\pi/2$. The function generator FG1 is driven from the output of the ramp generator RG1. Each of the function generators FG shown in FIG. 8 and FG1, FG2, and FG3 of system FGS shown in FIG. 3C may have three parts, the first part is known as a "$2\alpha$ generator", the second part is an analog sine converter ASC1 and the third part is a summing amplifier SA1. The $2\alpha$ generator has an offset rectifier OR and an inverter and level shifter ILS as part thereof. The offset signal to the offset rectifier is generally designated as Vos equals $\pi/4$ ($Vos = \pi/4$). The previously described −Vref signal is applied to the inverter and level shifter ILS. The output of the $2\alpha$ generator comprises two ramps of the same amplitude as $\alpha$ starting at alpha equals zero ($\alpha = 0$). The second ramp of $2\alpha$ has a negative slope. The $2\alpha$ signal is applied to the input of the analog sine converter ASC1, the analog sine converter ASC1 has an output signal which is proportional to the sine of its input signal. While the alpha signal varies from 0° to 90° the output of the analog sine converter ASC1 varies sinusoidally from 0° to 180°. This is equivalent to obtaining the signal sin $2\alpha$. The output of the summing amplifier SA1, with the gain shown, results in the desired output $f(\alpha_{12})$ of the function generator FG1. The summing amplifier SA1 may comprise a standard three input operational amplifier summer with resistive feedback. The first resistor input rx has the signal −Vref applied thereto. The scaling or gain factor is ($-1/Vref$). The second scaling resistor ry represents a gain of ($-1/\pi$) and the signal sin $2\alpha$ is multiplied by this value. The third summing resistor rx has the scale factor ($-2/\pi$) and the signal $\alpha = kt$ is multiplied by this value. The output of the summing amplifier which is equal to the function of alpha, $f(\alpha)$, is shown in the equation below:

value of the function of $\alpha_{12}$ becomes equal to the signal $k_4 I_{CL_{12}}$ the output of the comparator COMP1 changes (goes positive). This signal is supplied to a gate pulse distributor GPD1.

The output signal from the comparator COMP2 feeds a portion of a gate pulse distributor system GPDS. The named output signal which is designated $\alpha_{12}$ is supplied simultaneously to one input terminal each of two AND gates, AND 1 and AND 2 in the gate pulse distributor circuit GPD1. Also supplied as an input to the AND gate AND 1 and AND gate AND 2 is the signal RS1. Also supplied to the AND gate AND 1 is the signal $a$ and supplied to the AND gate AND 2 is the signal $\bar{a}$. Upon the mutual occurrence of signal $a$ being high, the signal RS1 being high, and the signal $f(\alpha_{12})$ being high, the gate AND 1 produces a positive going signal capable of firing the thyristor switch TH12(1) of the compensator CO. Conversely when the signal $a$ goes to a digital zero and the signal $\bar{a}$ becomes high the output of the gate AND 2 is enabled and the output of the gate AND 1 goes low irrespective of signal $\alpha_{12}$. When the output of the gate AND 2 goes high, this provides a signal for firing the thyristor switch TH12(2) for the negative going half cycle of $v_{12}$. The ramp generator RG2 cooperates with a function generator FG2, a comparator COMP2, and a gate pulse distributor circuit GPD2. The input to the ramp generator RG2 comprises a signal RS2 and the previously described reference signal (−Vref). The signal $Vos = \pi/4$, and the signal (−Vref) are applied to the function generator FG2 at other places (application not shown). The signal $k_4 I_{CL_{23}}$ is applied to the reference input of the comparator COMP2 and the output of the comparator COMP2 and the output of the comparator COMP2 is the signal $\alpha_{23}$ which is supplied along with the signals $b$, $\bar{b}$, and RS2 to a gate pulse distributing circuit GPD2. The output of the gate pulse distributing circuit GPD2 is the firing signal for the thyristor TH23(1) and for the thyristor TH23(2). In a like manner a ramp generator RG3 cooperates with a function generator FG3, a comparator circuit COMP3 and a gate pulse distribution circuit GPD3 to utilize as inputs the signal RS3 and the previously described (−Vref) signal as well as the signal $k_4 I_{CL_{31}}$ to generate an $\alpha_{31}$ signal. The $\alpha_{31}$ signal in combination with the RS3 signal, the signal c and the signal $\bar{c}$ cooperate to produce the thyristor firing signal TH31(1) and TH31(2) for firing the appropriately shown TH31(1) and TH31(2) for firing the appropriately shown thyristors in the compensator circuit CO of FIG. 3D.

Since the previously described firing angles $\alpha_{12}$, $\alpha_{23}$, etc. are determined by electronic computation in each half cycle, it is conceivable and in fact probable that positive and negative half cycles of the VAR generator current when averaged over a long interval are not equal due to small repeated and accumulated errors in the firing angle control system. This probably results $$-\alpha \left(\frac{2}{\pi}\right) - (-Vref)\frac{1}{Vref} - \sin(2\alpha)\frac{1}{\pi} = \frac{2}{\pi}\left(\frac{\pi}{2} - \alpha - \frac{1}{2}\sin 2\alpha\right). \quad (19)$$

Figure 3E:
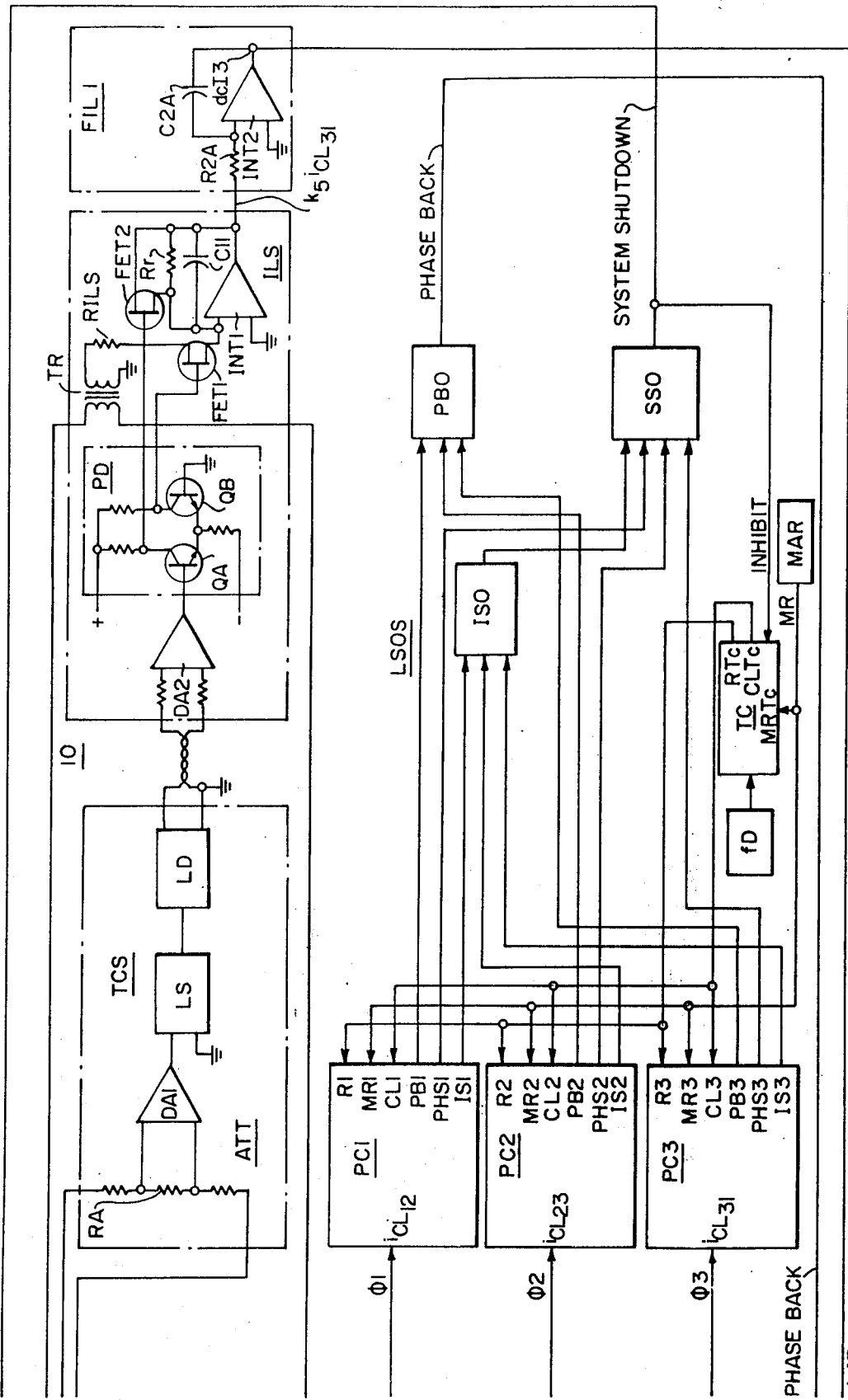

The function of alpha, $f(\alpha_{12})$, as generated by the summing amplifier SA1 is applied to a comparator circuit COMP1 of a comparator system COMPS and is compared with the signal $k_4 I_{CL_{12}}$ as supplied from previously described portions of the system CS. When the from error due to component tolerances, amplifier drifts, etc. The result of this could provide a DC component in the VAR generator output current which is undesirable because it might attain a sufficient magnitude to damage the AC power system, for example by causing the transformers therein to overheat. Referring to FIG. 3E it can be seen that in cases where this is deemed to be a significant problem, a DC eliminator 10 is provided in closed loop feedback orientation with the compensator CO and the control system CS to eliminate the previously described DC component. It will be noted by referring to FIG. 3D that the current in an inductor of the compensator CO such as L3 shown in the left-most branch for phase 3-1 is generally the integral of the voltage $v_{31}$ across the inductor L3 over the time interval that the switches TH31(1) and TH31(2) are on. Because of this relationship a signal $k_5 i_{CL_{31}}$ proportional to inductor current $i_{CL_{31}}$ can be derived by integrating the voltage $v_{31}$ or a fraction of that voltage with a switch integrator which may be a low powered electronic integrator. The integration interval is controlled in accordance with the period of the actual conductance of the thyristor switch as mentioned. The dc content of signal $k_5 i_{CL_{31}}$ is extracted by an integrating filter FIL1 shown in FIG. 3. The FIL1 output signal dcI3 can be used in a feedback loop, preferably including the summing amplifier ICLSUMM shown in FIG. 8 or the summing amplifier ICLS3 (for phase 3-1) as shown in FIG. 3C. It is to understood that only one DC eliminator 10 is shown in this embodiment of the invention as shown in FIG. 3E. It is also to be understood that two other DC eliminators (not shown) may be used and are preferably used with the other phases, i.e. (1-2) and (2-3). The single phase DC eliminator 10 is shown for convenience of simple illustration. The ON and OFF states for conduction intervals of the thyristors in question are determined by utilizing the differential amplifier DA1. Amplifier DA1 is utilized in a Thyristor Conduction Sensor TCS. The input of the differential amplifier DA1 is provided from lines which are connected across the thyristor switch comprising the thyristors TH31(1) and TH31(2). Preferably this latter voltage signal is provided through an attenuator ATT which may comprise a total resistance RA. If there is a large voltage drop across the previously described thyristors, which indicates that the thyristor switch is opened, the differential amplifier DA1 will provide a relatively large output signal. However, on the other hand if the thyristor switch is closed there is virtually no voltage drop across it and the differential amplifier will provide a relatively low level output voltage signal. The output of the differential amplifier DA1 is provided to a limit sensor LS which may be a null detector. The null detector limits are set slightly above the saturation voltage or the on voltage of the thyristor switch. When the voltage across the switch TH31(1)/TH31(2) is below the set limit, the thyristor switch is considered to be ON with a corresponding generally zero level output signal of limit sensor LS. Conversely, when the voltage across the thyristor switch exceeds the set limit, the switch is considered to be OFF and the output of the limit sensor LS becomes high. The output of the voltage detector limit sensor LS is conditioned to drive a transmission cable because it is envisioned that the Thyristor Conductor Sensor TCS of the DC eliminating circuit 10 will be located in the vicinity of the power thyristors, i.e. TH31 etc., which it monitors, in order to avoid the transmission of higher voltage noise signals. The plus and minus line driven signal fed into the transmission cables represents the corresponding ON or OFF intervals of the thyristors being measured. The signals are provided to the cable from a line driver LD. The signal from the transmission cable is received by a second differential amplifier DA2. This differential amplifier is utilized to remove common mode noise picked up on the transmission line. The second differential amplifier DA2 will drive a polarity detector PD. The polarity detector PD which may comprise, for example, two NPN transistors QA and QB, connected in common emitter configuration and having one load resistor for each collector, drives a pair of electronic switches one from each collector. The first electronic switch is designated FET1 and the second electronic switch is designated FET2. When the power thyristors conduct, the electronic switch FET1 is ON and the electronic switch FET2 is OFF. The voltage $v_{31}$ between the phases 3 and 1 is supplied to the primary of transformer TR. The secondary of the transformer TR is connected through a resistor element RILS and through the series connected electronic switch FET1 to one input terminal of an integrator INT1. Consequently, when the electronic switch FET1 is ON and switch FET2 is OFF as was previously described the integrator INT1 has impressed across the input terminals thereof a voltage which is related to the voltage across the inductor L3 of the left branch of the compensator circuit CO. The previously described differential amplifer DA2, the polarity detector PD, transformer TR, electronic switches FET1 and FET2, and the integrator INT1 form part of a ciruit generally designated ILS. As was mentioned previously the attenuator ATT, the differential amplifier DA1, the limit sensor LS, and the line driver LD form part of a circuit generally designated TCS which is a circuit to produce a thyristor conduction signal. The integrator INT1 comprises a feedback capacitor C11 and a feedback resistor Rr. The resistor Rr is a damping resistor and the resistor RILS is a summing resistor. The damping resistor Rr should be selected to match the damping factor or quality factor of the controlled inductor L3 (due to its finite coil resistance) with the damping factor of the integrator INT1. The resistor Rr can be calculated from the equal ratio of real and imaginary components of the controlled inductor L3 and that of the integrator INT1, according to the following ratio:

$$\frac{RAL3}{XL3} = \frac{XC11}{Rr} \quad (20)$$

where RAL3 is the coil resistance of the controlled inductor L3, XL3 and XC11 are the reactive impedances of the inductance and capacitance of the controlled inductor L3 and integrator INT1 respectively at fundamental frequency. When the previously described thyristors cease conducting the electronic switch FET1 switches off to remove the voltage signal from the integrator INT1 and the electronic switch FET2 shorts or shunts the feedback capacitor C11 thus assuring a zero output from the integrator INT1 until the power thyristors are turned on again. The output signal $k_5 i_{CL_{31}}$ of the integrator INT1, which represents the controlled current in the VAR generator inductor as previously described, is supplied to a filter circuit FIL1. In this case the filter circuit comprises an integrator INT2 with feedback capacitor C2A and input resistor or summing resistor R2A. The output of the integrator INT2 provides a signal dcI3 which is proportional to the DC component of the VAR generator output current in the left-most branch of the compensator CO. This signal can therefore be used to affect the firing angle to thus reduce the DC component in the latter mentioned branch of the compensator CO.

Referring now to FIGS. 20a–20e there are shown output wave shapes for the previously described circuit 10. These wave shapes show the inductor voltage $v_{31}$ and the thyristor controlled firing angle delayed inductor current $i_{C L_{31}}$ versus $\omega t$. It will be noted in reference to FIG. 20b that the differential input voltage to the differential amplifier DA1 only exists during those portions of the time that the thyristors in the compensator CO in the particular branch of interest (phase 3-1 in this case) are not conducting. The shaped output signal of the line drive unit LD is shown in the FIG. 30c. FIG. 20d shows the generated current $k_5 i_{C L_{31}}$ from the output of the integrator INT1. Finally the $dcI3$ output signal of the integrator INT2 is shown in FIG. 20e. This latter signal may be preferably fed back to the previously described summing circuit ICSS3 of FIG. 3C. This signal is supplied for cooperating with the other signals supplied to element ICLS3 to thus modify the value of the output signal $k_4 I_{C L_{31}}$ from the sample and hold portion SHB3.

Referring once again to FIG. 3E, there is shown for the static VAR generator, a load saving overcurrent shutdown system LSOS. The load saving overcurrent shutdown system LSOS performs the following functions. First it monitors the current in each phase controlled inductor in the three phase flicker compensator CO. There are three amplitude ranges which are distinguished. These are called the normal, caution and dangerous ranges of current in the inductors. During the time when the current amplitudes are in what is defined as the normal range no action is initiated by the overcurrent shutdown circuit LSOS. However, when a caution level of current in an inductor is reached, the flicker compensator control CO is instructed instantaneously to limit the firing angles $\alpha_{12}$, $\alpha_{23}$, and $\alpha_{31}$, of all thyristors TH12(1) and TH12(2) etc. respectively to a value which under normal operation should result in normal levels of currents in the inductors. During this period of firing angle limitation sometimes known as the phase back period the compensator control CS ignores the calculated control signals $\alpha_{12}$, $\alpha_{23}$, $\alpha_{31}$ for a given fixed period in each half cycle during which period firing of the appropriate thyristors is inhibited. The periods are defined by the compensator control system timing reference signals. The phase back operation delays the firing of the appropriate thyristors during a prescribed initial period after which the firing pulses are passed to the gates of the appropriate thyristor for firing. A typical phase back period is 10° starting at $\alpha = 0°$. After a phase back has been initiated the shutdown circuit LSOS waits for the results of the phase back operation for a prescribed number of line voltage cycles which may for example be eight cycles. If the current level in the inductor or inductors has decreased to a normal level during the recovery period no shutdown is initiated and the phase back request is removed. If, however, the phase back operation proves unsuccessful during the recovery period, indicating that the inductor currents are continuing to increase towards dangerous levels, a shutdown will be initiated. Reaching what has been called the dangerous level in the inductors will however result in an instantaneous shutdown without waiting for the results of the phase back operation. The system block diagram of a three phase overcurrent shutdown system LSOS is shown in FIG. 3E. The system may comprise three identical protective circuits generally designated PC1, PC2, and PC3. Each of the previously named protective circuits serves one line phase. The previously mentioned protective circuits share a common timing control circuit TC. Phase back and shutdown signals from each of the previous protective circuits are supplied simultaneously to OR-ing functional blocks PBO, ISO and SSO. These functional blocks will provide an output for any of the inputs from the previously described protective circuits PC1, PC2, or PC3 if any of them is in a state to initiate action. The instantaneous shutdown OR block designated ISO has provided or connected thereto the instaneous shutdown output terminals or lines IS1, IS2, and IS3 of the protective circuit blocks PC1, PC2, and PC3, respectively. The output of the latter mentioned instantaneous shutdown OR block ISO is provided as one input to a system shutdown OR-ing functional block SSO. In a like manner the phase back output terminals PB1, PB2, and PB3 of the previously described protective circuits PC1, PC2, and PC3 respectively are supplied as inputs to the phase back OR-ing functional block PB). Each of the functional blocks PC1, PC2, and PC3 has a phase back shutdown output terminal PHS1, PHS2, and PHS3, respectively. These latter output signals are supplied as additional inputs to the previously described system shutdown OR block SSO. These signals are in addition to the previously described output signal from the instantaneous shutdown OR block ISO. Each of the protective functional blocks PC1, PC2, and PC3 has manual and automatic control reset signals MR1, R1, MR2, R2 and MR3, R3, respectively. The output signal TRc from the timing control network TC is supplied simultaneously and in parallel to each of the previously described terminals R1, R2, and R3. The output of the phase back OR-ing network PBO may be provided to the control system CS for the compensator CO in a convenient manner to cause the control system to automatically cease passing on a firing request $\alpha_{12}$, $\alpha_{23}$, etc. as the case may be to the appropriate thyristor gates before $\alpha$ exceeds a preset (e.g. 10°) value. However, the output of the system shutdown or SSO block is provided to a system shutdown apparatus SSA which may be a circuit breaker or circuit interrupter which is connected in the three phase line of the VAR generator system somewhere between the source S and the load LO. In addition, the output of the system shutdown OR-ing system SSO is provided as an inhibit signal to the timing control actions therein once a shutdown has been initiated. A manual reset system MAR such as a pushbutton or similar means is provided to supply a manual reset signal MR to each of the previously described manual reset terminals MR1, MR2, and MR3 of the protective circuits PC1, PC2, and PC3, respectively and to also supply a manual reset signal MR to the timing control network TC at the terminal MRTc. The previously described inhibit signal from the system shutdown system output SSO latches the timing control network TC so that the timing control network TC cannot reset the protective circuits. Consequently, the shutdown OR-ing system SSO becomes latched until the timing control TC is reset by the manual reset means MAR. The triggering or timing control for the timing control network TC comes from a frequency driver network $fD$ which may be, for example, a 60 hz oscillator or which may be connected to the main electrical line. This latter network $fD$ provides a logic signal of predetermined frequency which may be 60 hz to drive the timing control network TC. There is also provided as an input for the protective circuits PC1 through PC3 clock input terminals CL1 through CL3 respectively. These clock input terminals CL1 through CL3 are connected to the timing network TC output signal CLTc. The pulse train of the previously described output signal CLTc controls the operation of the various protective networks or protective control systems PC1 through PC3. Each of the Protective control systems PC1 through PC3 an analog input. The current $i_{CL_{12}}$ which is related to the current flowing through the inductor L1 in the right-most phase of the compensator CO is provided as an input to the protective circuit PC1. Likewise, the current $i_{CL_{23}}$ is provided as an input to the protective circuit PC2 and represents the current flowing through the inductor L2 in the phase represented by the bottom portion of the compensator CO. Finally, the current $i_{CL_{31}}$ is provided as an analog signal to the protective circuit PC3 and is the current which is flowing in the inductor L3 of the left-most phase of the compensator CO.

Referring now to FIG. 10 there is shown a functional block diagram of the elements of one of the protective circuits PC1. The AC bipolar inductor current $i_{CL_{12}}$ from phase 1-2, 0 (1-2) is fed into a device called a bipolar limit detector BLD1. The same signal is also fed into the bipolar limit detector BLD2. The bipolar limit detector BLD1 is set at a predetermined value which represents the caution level of the current $i_{CL_{12}}$ and the bipolar limit detector BLD2 is set at a predetermined level which represents the dangerous level of current $i_{CL_{12}}$. When the caution level of the bipolar limit detector BLD1 is exceeded an output signal LD1 is provided to a transient memory TMR which sets the memory for future use. The normally high ("no phase back") output signal TM of the transient memory TMR is connected to the enabling input ENAB of the phase back shutdown PBSD and the D terminal of the phase back shift register PBSR. The latter shift register is controlled by its clock CL input. The shift register PBSR samples the state of signal TM after which memory TRM is reset at its reset terminal RES by signal RTC obtained from the timing control TC of FIG. 3E. The content of the shift register PBSR is constantly monitored by the phase back initiator PBIN. The output of the previously described transient memory TMR will become a zero when the caution level of the bipolar limit detector BLD1 is exceeded. This consequently shifts a zero into the phase back shift register PBSR. When a zero is present in the phase back shift register PBSR, the continually monitoring phase back initiator PBIN produces a phase back signal on its PB1 output as previously described. Before a shutdown operation occurs, the transient memory TMR is reset once in each line voltage cycle by the signal RTC on its RES input as previously described. This will occur shortly after the previously described phase back shift register PBSR has been clocked or indexed by the signal CLTC supplied to its terminal CL1. The last output stage of the shift register PBSR is monitored and detected by a device known as the phase back monitor PBMN. Monitoring is provided by way of the last stage signal SR of the phase back shift register PBSR to the phase back monitor PHMN. When a zero signal is detected in the last output stage of the shift register PBSR, the monitor PHMN requests a phase back shutdown by way of the signal PBM, which is an output of phase back monitor PBMN. Shutdown will occur only if phase back shutdown device PBSD is enabled by the previously described signal TM indicating that excessive inductor current still persists. The shutdown signal PSB is obtained from output terminal PBS1 of block PBSD. If the phase back shutdown PBSD is set, it is equivalent to the occurrence of at least two previously described waiting period, the length of which depends upon the number of stages in the shift register. The previously described bipolar limit detector BLD2 operates similarly to the bipolar limit detector BLD1 except at higher levels of current $i_{CL_{12}}$. When a higher level of current $i_{CL_{12}}$ is detected by the bipolar limit detector BLD2, an output signal LD2 is provided which fires or actuates the set terminal of an instantaneous shutdown memory ISMM. The instantaneous shutdown memory provides an output signal IS to the previously described instantaneous shutdown signal terminal IS1. The instantaneous shutdown memory ISMM is resettable by the manual reset signal MR on the manual reset terminal MR1. Phase back operation is initiated if the phase back output terminal PB1, PB2, or PB3 of any of the protective circuits PC1, PC2, or PC3 respectively is actuated by sensing a current $i_{CL_{12}}$, $i_{CL_{12}}$, or $i_{CL_{12}}$, respectively, which is in the caution range.

Referring now to FIG. 11 a discrete version BLD of an electronic circuit for the bipolar limit detector BLD1 or the bipolar limit detector BLD2 is shown. The bipolar limit detector BLD comprises a long tail differential amplifier pair comprising transistors QQ1 and QQ2 connected in common emitter configuration to resistor R3. There is a resistor R6 connected to the collector of transistor QQ2, no resistor need be connected to the collector of transistor of QQ1. The collector of the transistor QQ1 and the other side of the resistor R6 are connected to the positive side of a power supply VCC. The other side of the resistive element R3 is connected to the negative side of the power supply (−VCC). There is provided a reference voltage VR. A resistive element R2 is connected to the positive side of the voltage source VR. The other side of the resistive element R2 is connected to one side of a resistive element R1. The junction point between the resistive elements R1 and R2 is connected to the base of the previously described transistor QQ1. There is also connected to the base of the previously described transistor QQ1 the anode of a diode D1, the cathode of which is connected to ground or system common. Also connected to the base of the transistor QQ1 is the cathode of diode D3, the anode of which is connected to the base of the transistor QQ2. Connected to the collector of the transistor QQ2 is the cathode of a diode D4, the anode of which is connected to ground or system common. Also connected to the base of the transistor QQ2 is one side of a resistor element R4, the other side of which is connected to the other end of resistive element R1. This latter point, terminal or end comprises the input terminal for the bipolar detector BLD. Also connected to the base of the transistor QQ2 is one side of a resistor element R5, the other side of which is connected to the negative terminal of the reference voltage supply (−VR). Also connected to the base of the transistor QQ2 is the cathode of a diode D2, the anode of which is connected to ground or system common. The output of the bipolar limit detector BLD is at the collector of the transistor QQ2 and it provides the output signal LD which may be the signal LD1 in the case of the bipolar limit detector BLD1 and which may be the output signal LD2 in the case of the bipolar limit detector BLD2. When the input signal $i_{CL_{12}}$, for example, is zero, the resistive element R2 conducts current $iR1$ from the positive reference voltage source VR. At this time the transistor QQ2 is turned OFF and the output signal LD is a digital ONE. The diode D1 prevents the base of the transistor QQ1 from rising more than one diode voltage drop above ground. The base of the transistor QQ2 is clamped by the diode D2 at one diode voltage drop below ground. The previously described input signal $i_{CL_{12}}$ is applied simultaneously, by separate but generally equal resistors R1 and R4 to the bases of the transistors QQ1 and QQ2, respectively. As the current $i_{CL_{12}}$ increases, the current $i4$ which flows to the base of the transistor QQ2 through the resistive element R4 also increases. When the current $i4$ becomes greater than the current $iR2$, which is the current flowing through the resistive element R5 into the negative terminal of the reference voltage supply ($-VR$), the base voltage of the transistor QQ2 relative to ground becomes positive and when it exceeds one diode drop above ground, the transistor QQ2 turns ON changing the output signal LD to a digital zero. Because of the presence of the diode D3, the voltage V2 is limited to two voltage drops in the positive direction above ground. While the current $i_{CL_{12}}$ is positive, the voltage V1 at the base of the transistor QQ1 relative to ground stays at a diode drop above ground, unaffected by the current $iR3$ which is the current flowing through the resistive element R1 towards the base of the transistor QQ1 and then to ground through D1. Similarly, the output signal LD becomes zero when the electrical current $i_{CL_{12}}$ goes negative and consequently pulls the voltage on the base of the transistor QQ1 down below the value of the voltage V2 on the base of the transistor QQ2 after the current $iR3$ which is flowing from the base of the transistor QQ1 to the junction point between the resistive elements R1 and R4 becomes larger than the current $iR1$. The negative excursion of the base voltage of the transistor QQ1 is limited to two diode voltage drops by the diodes D2 and D3. The diode D4 clamps the output signal LD to ground to protect the logic circuit fed by the limit detector BLD.

Referring now to FIG. 13, the transient memory TMR is shown. This highly noise immune transient memory TMR may be a set-reset flip-flop which may be built from two NAND gates. The transient memory TMR may be slowed by a filter FILT comprising resistors R7, R8, diode D5 and capacitor CD to prevent latch-on-noise from affecting the output. The transient memory TMR comprises a first NAND gate NAND 1 which is connected through the resistive element R7 to the top of capacitor CD the bottom of which is connected to ground or system common. The cathode of diode D5 is connected to the output of gate NAND 1, its anode is conto one end of resistive element R8, the other end of which is connected to the common point between resistive element R7 and capacitive element CD. The junction between the resistive element R7 and the capacitor element CD is also connected to one of the input terminals of the NAND gate NAND 2. The other input terminal of gate NAND 2 is the reset terminal RES of the transient memory TMR as shown in FIG. 10. The output terminal of gate NAND 2 is connected to an input terminal of gate NAND 1. The other input terminal of gate NAND 1 is the SET terminal of the transient memory TMR as shown in FIG. 10. The output of gate NAND 2 is also supplied to an output terminal $\overline{Q}$ to provide the output signal TM shown in and described with respect to FIG. 10. As was previously described the signal LD1 is provided at the SET input terminal of the gate NAND 1 and the signal RTC is provided at the reset terminal RES of the gate NAND 2. Consequently the input signal LD1 is transferred to the output of the NAND gate NAND 2 with some time delay which is caused by the filter FILT.

The transient memory TMR does not latch in the ON state if, for example, continuous symmetrical square wave noise signals are received at its set input unless the wavelength of the noise wave is comparable to the time constant defined by resistor R7 and a capacitor CD. Noise immunity is achieved because in the shown configuration of FILT the average voltage on capacitor CD is always less than the mean (dc) value of the output signal of gate NAND 1 due to the capacitor discharge reset current flowing through diode D5 and resistor R8. Without resistor R8 and diode D5 the memory would likely latch on even before it reaches its above-described final mean (dc) value.

Referring now to FIG. 12 there is shown the phase back shift register PBSR, the phase back initiator PBIN, the phase back monitor PBMN, the phase back shutdown PBSD and the timing control TC of FIG. 10 in a combination block diagram and circuit diagram form. The phase back shift register PBSR may be a simple serial in-parallel out shift register with clocking on the leading edge of the clock signal at input CL. The signal TM is brought in on the D or data input terminal. The timing control comprises an inverter ITC1, the output of which is connected to one side of a resistive element Rtc, the other side of which is connected to one input of a NAND gate GTC and to one side of a capacitor CTC. The other side of the capacitor CTC is connected to ground. A logic signal which is utilized for timing is provided to the input of the inverter ITC1 and to another input terminal of the NAND gate GTC. This signal comes from the previously mentioned block $f$D and may be, in the preferred embodiment of the invention, a 60 hz logic signal. The remaining input terminal of the gate GTC is connected to the inhibit terminal of the timing control network TC as shown in FIG. 3E. The output of the previously described NAND gate GTC is connected to the input of another inverter ITC2 the output of which comprises the clock signal CLTc of the timing control circuit TC shown in FIG. 3E. The clock signal CLTc is provided to the phase back shift register PBSR at the clock terminal CL thereof. The clock signal CLTc is also supplied or provided as an input to a third inverter ITC3 the output of which produces the reset signal RTc shown in FIG. 3E. The phase back monitor PBMN may comprise an inverter IPHM, the input of which is connected to receive the last output stage signal SR of the phase back shift register PBSR. The output of the phase back monitor PBMN is connected to one input terminal of NAND gate PBSG, which is part of the phase back shutdown means PBSD. The other input terminal of the NAND gate PBSG is connected to an output terminal of an inverter IPHS the input ENAB of which is connected receive the output signal TM of the transient memory TMR (not shown). In the timing control circuit TC the inverter ITC1, the resistor R$tc$, the capacitor CTC, and the gate GTC comprise a monostable circuit which provides negative going output logic pulses and which is initiated by the positive going transients of the input logic signal which, as has been described previously, may be at a 60 hz rate. The output of the mono-stable device comprising the previously mentioned elements may be inhibited, that is, forced to stay high at the output, by a low inhibit signal on the input terminal of the gate GTC. The inverter ITC2 reestablishes the polarity necessary to provide the clock signal RTc in a positive going form. The inverter ITC3 establishes a polarity and a propagation delay necessary between the signals CLTc and RTc to avoid the well-known phenomena of racing. The phase back initiator PBIN comprises a multi-input NAND gate PBING capable of accepting the eight outputs of the phase shift register PBSR. The NAND gate PBING performs an OR function of all zeros present on the input terminals thereof.

The elements of FIGS. 11, 12, and 13 represent circuitry utilizable for the single protective circuit PC1 shown in FIG. 10. The single protective circuit PC1 shown in FIG. 10 represents the protective circuit PC1 shown in block diagram form in FIG. 3E. Naturally it is to be understood that the electronic elements shown in FIGS. 11, 12, and 13 are not limiting but may be utilized in conjunction with any and all of the other protective circuits PC2 and PC3 also shown in FIG. 3E.

Referring now to FIGS. 14 through 19, there are shown other concepts present in certain embodiments of this invention. Comparing FIG. 14 with the previously discussed and described FIGS. 4 and 6, it is apparent that FIG. 14 basically repeats the information contained in FIGS. 4 and 6 for convenience. As was explained previously with respect to the embodiment related to FIGS. 4 and 6, the currents in the three delta connected inductors TH12, etc. in the compensator CO are set by adjusting the corresponding firing angles $\alpha_{12}$, $\alpha_{23}$, and $\alpha_{31}$ in every half cycle such that the combined currents of the arc furnace and static compensator CO are balanced and have a specific power factor which may be unity but is not limited to unity. As was described previously the required inductor currents for consecutive half cycles are electronically computed by utilizing the equations (15) through (17) described previously. The set of equations (15) through (17) is constituted from pairs of similar equations, one pair for each inductor. In each pair one equation specifies the current for the odd (positive) half cycles when one of the parallel thyristors conducts and the other equation specifies the current for the even (negative) half cycle when the other thyristor conducts. Because of the similarities of these equations and for purposes of simplicity of explanation and illustration the present embodiment will be discussed in connection with only one of these equations which has arbitrarily been chosen to be the first one of a pair given previously in equation (15). This latter equation is repeated below for illustrative purposes as equation 21:

val $\beta_{23(1)}$ to $\beta_{23(2)}$ to therefore obtain the magnitude $I_{2(23)}$ of the current component which is in phase with the line to line voltage $v_{23}$. Similarly, the instantaneous current $i_1$ must be integrated in the interval $\beta_{31(1)}$ to $\beta_{31(2)}$. This latter operation obtains the current magnitude $I_{1(31)}$ of the current component that is in phase with the line to line voltage $v_{31}$. The previously described current magnitudes $I_{23(1)}$ and $I_{31(1)}$ are multiplied by the constants $(RR/3X - 1/\sqrt{3})$ and $(RR/3x + 1/\sqrt{3})$, respectively. One half of the difference of these latter products is subtracted from the magnitude $I_{CC}$ ($I_{CC}$ in the case of the constant capacitor current $i_{CC_{12}}$) to give the magnitude $I_{CL_{12(1)}}$ of inductor current $i_{CL_{12}}$. By further examining FIG. 14 it can be seen that the determination of the required inductor current requires only approximately five-sixths of a line voltage cycle with another 1/12 of a cycle inactive time elapsing before the calculated information can be utilized to set the current in the appropriate inductor by adjusting the firing angle $\alpha_{12}$. Note that the information obtained from measuring the current $I_{1(31)}$ is recent, that is, the integration of the current $i_1$ occurs very close to the earliest possible firing point of the angle $\alpha_{12}$, i.e. where $\alpha_{12} = 0$. The information obtained from the measurement of the current $I_{2(23)}$ is less recent since the integration for obtaining that quantity ceased approximately one-third of a cycle earlier than the possible firing point of the angle $\alpha_{12}$. It has been found that with the effect of the above computational method the effective frequency range of the flicker compensator CO can have an upper value of approximately 10 hz.

As effective as the latter computation of firing angle is in obtaining accurate flicker compensation, it has been found that even faster calculations may be utilized to improve response and the accuracy of the VAR generator system. It can be shown that the total time for the current calculations can be reduced from five-sixths of a cycle to one-half of a cycle and the inactive time can be eliminated completely. Since the choice of integration of the furnace currents $i_1$ and $i_2$ over a half cycle (180°) is arbitrary, the current magnitudes $I_{1(31)}$ and $I_{2(23)}$ can be determined by integrating over some smaller selected interval. Of course, it has been shown that the size of the integration interval is related to the accuracy of the calculation. It is known that loads such as arc furnaces provide current variations which are rich in harmonics and different harmonic components can influence the result of the integration depending upon the integration interval. Nevertheless, it can be established that the overall effect of the harmonic is small if the integration intervals for the currents are only reduced from one-half of a cycle to one-third of a $$I_{CL_{12(2i-1)}} = I_{CC} - \frac{1}{2}\left[\left(\frac{RR}{3X} - \frac{1}{\sqrt{3}}\right)\int_{\beta_{23(2i-1)}}^{\beta_{23(2i)}} i_2 d(\omega t) - \left(\frac{RR}{3X} + \frac{1}{\sqrt{3}}\right)\int_{\beta_{31(2i-1)}}^{\beta_{31(2i)}} i_1 d(\omega t)\right] + I \qquad (21)$$

where $I = 0$.

The equation (21) can be further simplified by setting the quantity $i$ equal to 1 for the terms $(2i)$ and $(2i - 1)$ contained therein. It can thus be seen that the instantaneous current $i_2$ must be integrated in the intercycle.

Figure 15:
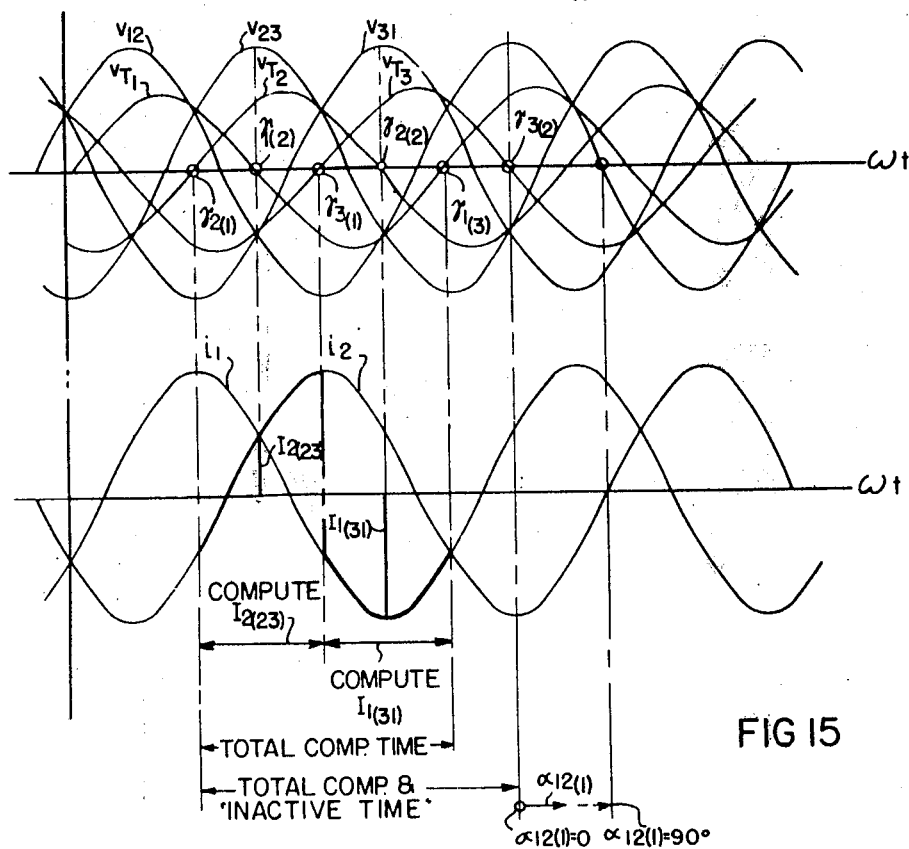
FIG. 15 shows a current integration region versus voltage.

Referring now to FIG. 15 a ⅓ cycle current integration is illustrated. The scale factors of both integrals must be changed from 1/2 to 1/$\sqrt{3}$. Consequently, the resulting variation in the equation (15) is as follows:

$$I_{CL_{12(2t-1)}} = I_{CC} - \frac{1}{\sqrt{3}} \left[ \left( \frac{RR}{3X} - \frac{1}{\sqrt{3}} \right) \int_{\lambda_{2(2t-1)}}^{\lambda_{3(2t-1)}} i_2 d(\omega t) - \left( \frac{RR}{3X} + \frac{1}{\sqrt{3}} \right) \int_{\lambda_{3(2t-1)}}^{\lambda_{1(2t+1)}} i_1 d(\omega t) \right] + I \quad (22)$$

where I = 0.

In comparing the effect of the harmonics in the last two equations, it can be shown that the integrals of the even harmonics are zero for integrating over one-half of the cycle (fundamental) interval while an integration over one-third of a cycle (120°) eliminates or reduces the effect of the odd harmonics. From a practical point of view, the two methods are by and large interchangeable without causing an appreciable difference in the flicker reduction.

Figure 16:
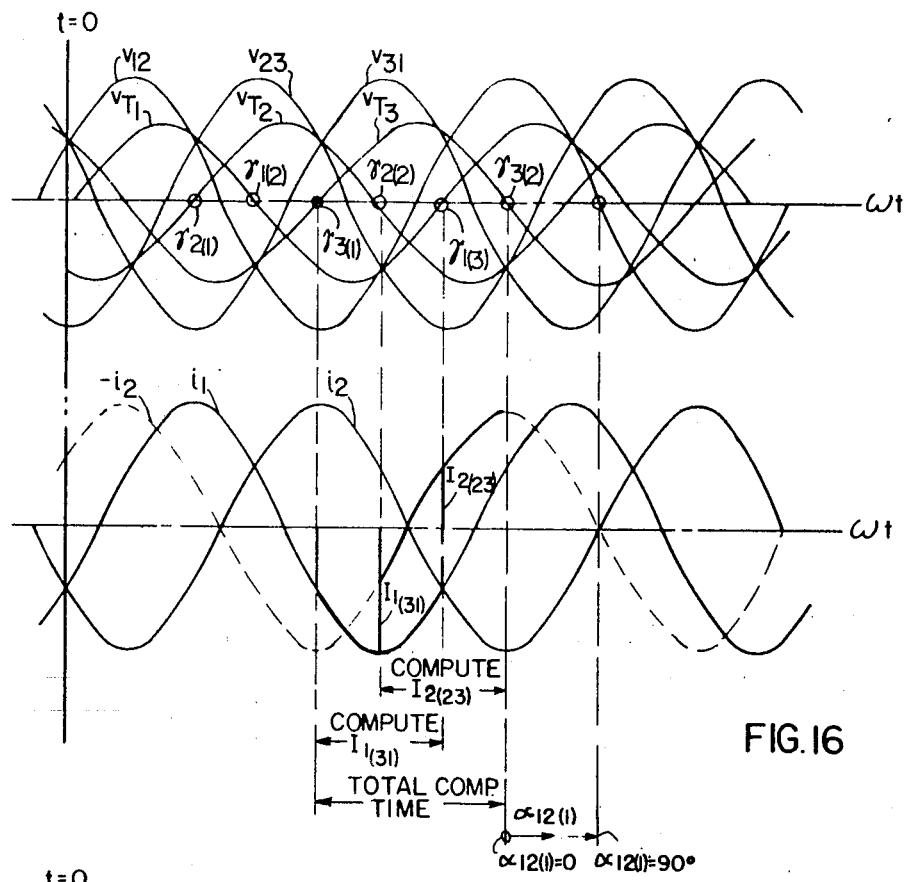
FIG. 16 shows another current integration region versus voltage.
Figure 17:
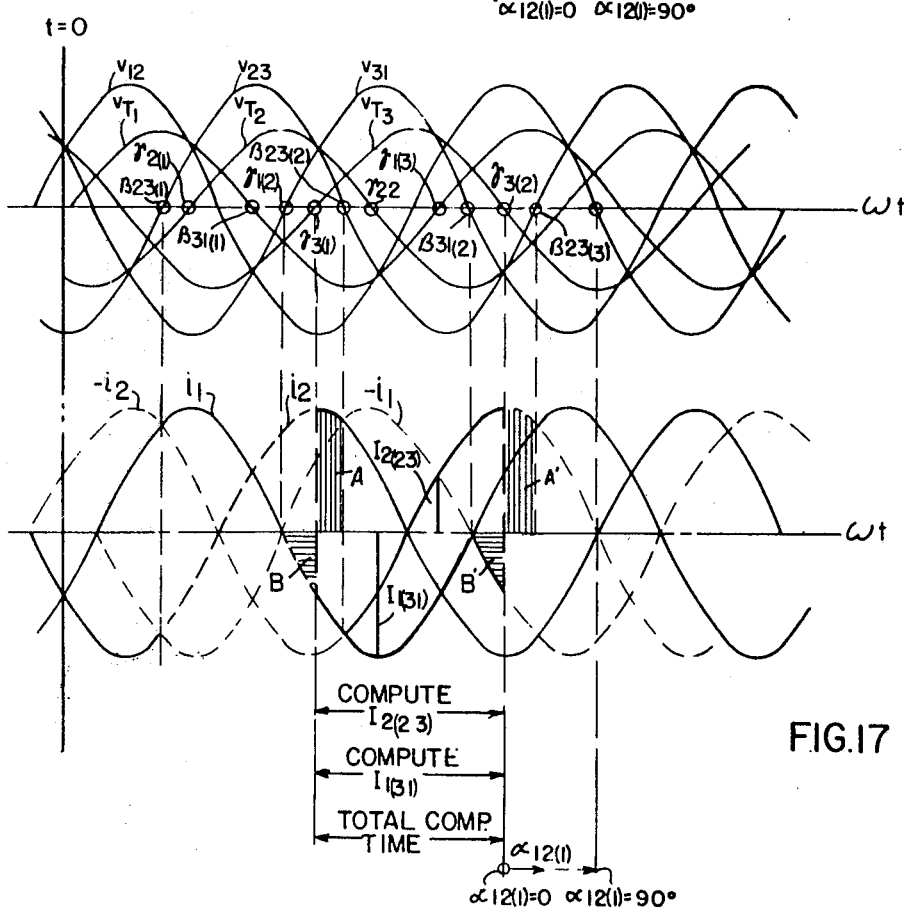
FIG. 17 shows still another current integration region versus voltage.

Referring now to FIG. 16, the concepts shown in FIG. 15 are utilized for providing a further improved overall response time. Comparison of the FIGS. 15 and 16 shows that the computation of the quantity $I_{1(31)}$ is unchanged; however, the computation of the quantity $I_{2(23)}$ is computed by integrating the negative of the current $i_2$ over a 120° interval that is shifted with respect to the original integration interval by 180°. It can be seen that with this method the current $I_{2(23)}$ contains the latest available information about the change of the furnace current $i_2$ since the integration occurs continuously to the point of the firing angle $\alpha_{12}$ equaling zero. The total computation time is one-half cycle and only the computation of the quantity $I_{1(31)}$ is followed by an inactive time. Utilizing FIG. 16 a new equation for the inductor current can be written and that equation follows:

Refer now to FIG. 17. Originally the current $i_2$ was computed in the interval $\beta_{23(1)}$ to $\beta_{23(2)}$ (current $i_2$ is shown by the dashed lines in this interval). It would be possible to use the negative of the current $i_2$ in the subsequent 180° interval. However, this interval measured from the point $\beta_{23(2)}$ which is the end point of the original integration interval ends after the first possible firing point for $\alpha_{12}$, i.e. when $\alpha_{12} = 0°$, and it is at this latter ($\alpha_{12} = 0°$) point that the computation must be completed. However, by inspecting FIG. 17 it can be shown that the excess area A', that is the integral of the current ($-i_2$) from the earliest point of firing to the end of the 180° interval, is the same assuming non-changing furnace current, as the area A which is part of the original integration. This follows from the fact that a periodic function is equal to its negative if shifted by half a period. Therefore to complete the calculation by the time $\alpha_{12} = 0°$ the integration may be broken into two intervals. In the first interval, $\alpha_{3(1)}$ to $\beta_{23(2)}$ the original current $i_2$ is integrated, in the second interval $\beta_{23(2)}$ to $\alpha_{3(2)}$ the negative of the current $i_2$, ($-1_2$) is integrated. It is observable from the FIG. 7 that the sums of the two integrals are indeed the same as the original integral of $i_2$. As is also illustrated in FIG. 17 the computation of the current $I_{1(31)}$ can be accomplished in a similar fashion by integrating $i_1$ over the interval $\alpha_{3(1)}$ to $\beta_{31(2)}$ and then integrating the current ($-i_1$) over the $$I_{CL_{12(2t-1)}} = I_{CC} - \frac{1}{\sqrt{3}} \left[ \left( \frac{RR}{3X} - \frac{1}{\sqrt{3}} \right) \int_{\lambda_{2(2t)}}^{\lambda_{3(2t)}} (-i_2) d(\omega t) - \left( \frac{RR}{3X} + \frac{1}{\sqrt{3}} \right) \int_{\lambda_{3(2t-1)}}^{\lambda_{1(2t+1)}} i_1 d(\omega t) \right] + I \quad (23)$$

where I = 0.

It has been verified by computer simulation that the application of the above equation to the flicker compensator control CO increases the effective frequency range from an upper limit of 10 hz to approximately 15 hz. In the previously described computation the computation of the current quantity $I_{1(31)}$ is completed one-sixth of a cycle, that is 60°, earlier than the information is actually used and thus the compensation does not take into account the most recent variations of the current $i_1$. However, the following method which is based upon ½ cycle integration intervals improves this.

interval $\beta_{21(2)}$ to $\beta_{3(2)}$. Utilizing this technique total computation time is reduced to one half of a cycle and the inactive interval is completely eliminated. The required inductor current $I_{CL_{12}}$ is thus determined from the two furnace currents $i_2$ and $i_1$ in the ½ cycle interval immediately preceding the time when the necessary compensation is required, thereby the compensation takes into account the most recent variations of the previously described furnace currents $i_1$ and $i_2$. The equation for calculating the inductor current utilizing this inventive concept can be written in the following form:

$$I_{CL_{12(2t-1)}} = I_{CC} - \frac{1}{2} \left\{ \left( \frac{RR}{3X} - \frac{1}{\sqrt{3}} \right) \left[ \int_{\alpha_{3(2t-1)}}^{\beta_{23(2t)}} i_2 d(\omega t) + \int_{\beta_{23(2t)}}^{\alpha_{3(2t)}} (-i_2) d(\omega t) \right] \right. $$
$$\left. - \left( \frac{RR}{3X} + \frac{1}{\sqrt{3}} \right) \left[ \int_{\alpha_{3(2t-1)}}^{\beta_{31(2t)}} i_1 d(\omega t) + \int_{\beta_{31(2t)}}^{\alpha_{3(2t)}} (-i_1) d(\omega t) \right] \right\} + I. \quad (24)$$

It is interesting to note that although the total integration is done over 180°, the effect of the harmonic distortion if any is the same as if the integration were taken over 120° because of the specified sign change of the integrals involving the currents $i_1$ and $i_2$. It has been verified that by controlling the static compensator CO in accordance with the above equation the frequency response of the VAR system is extended to above 15 hz.

Figure 18:
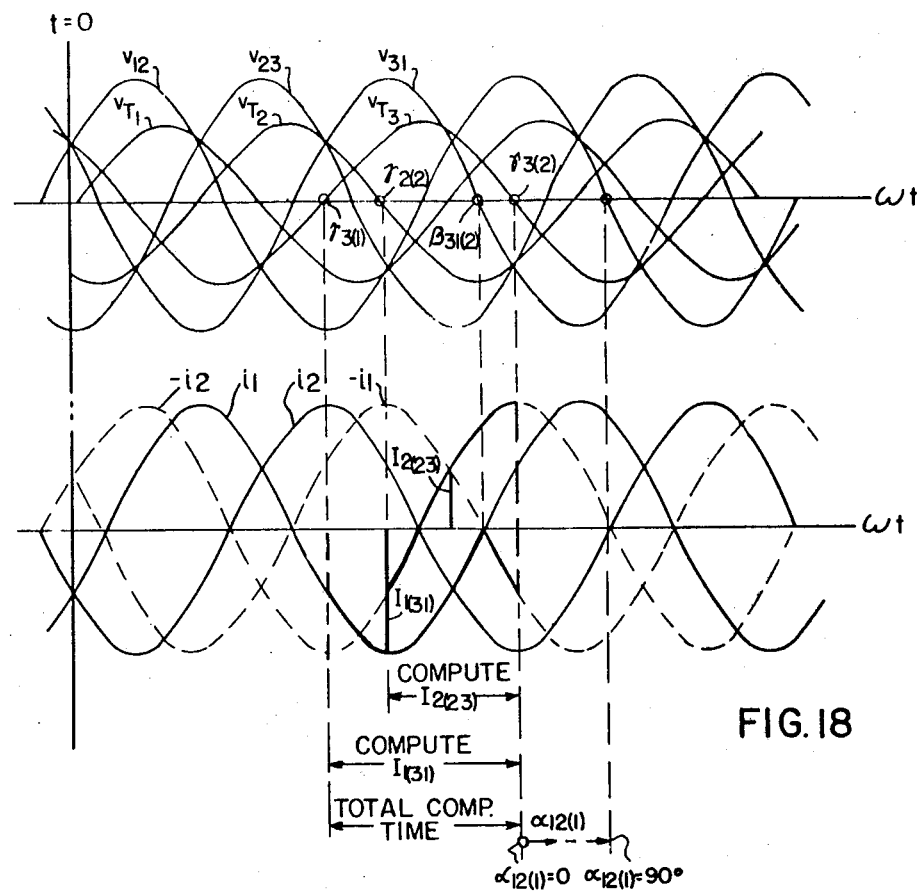
FIG. 18 shows still another current integration region versus voltage.
Figure 19:
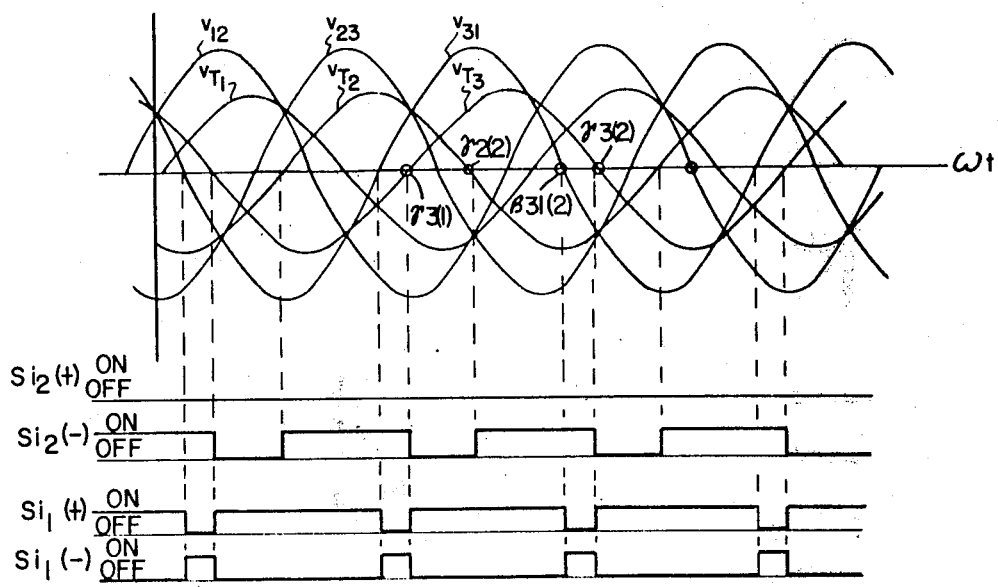
FIG. 19 shows a waveform diagram derived from the integration technique exemplified in FIG. 18.

Referring now to FIG. 18 it can be shown that still another method of current measurement can be derived by combining the methods described with respect to FIGS. 16 and 17. Consider once again FIG. 16. It can be seen that the computation of the current $I_{2(23)}$ is as good as possible from the point of view of fast response: the integration not only continues to the earliest point of thyristor firing, but also occurs while the latest values of current $i_2$ under typical furnace operation are the dominant values. The dominant values are the instantaneous values of the fundamental current wave close to its maximum as FIG. 18 indicates. On the other hand as was pointed out previously the computation of the current $I_{1(31)}$ is terminated before that value is actually utilized to determine the firing angle $\alpha_{12}$. Now considering FIG. 17 again, it can be established that the situation there is somewhat different. Although the integration of the current $i_2$ goes on as long as possible, that is it continues to the time of the earliest firing point of the firing angle $\alpha_{12}$, the dominant values of the current $i_2$ in fact appear at the beginning of the integration interval. Therefore, the magnitude of current $I_{2(23)}$ is more dependent upon the earlier values of the current $i_2$ than the latter ones. Thus the computation cannot take the latest trend of change in the furnace or load current into account as well as the method described with respect to FIG. 16. The latter method however provides the best computation for the current $I_{1(31)}$ by taking the integration of the current $i_1$ immediately prior to the earliest point of firing. Thus using the computation technique shown in FIG. 16 for computing the current $I_{2(23)}$ and the computation technique shown in FIG. 17 for computing the current $I_{1(31)}$, a method resulting in the fastest response can be derived. This method is illustrated in FIG. 18 and the corresponding equation for the inductor current may be written as follows:

mented according to circuit block diagrams and schematic drawings which are described hereinafter.

Figure 21:
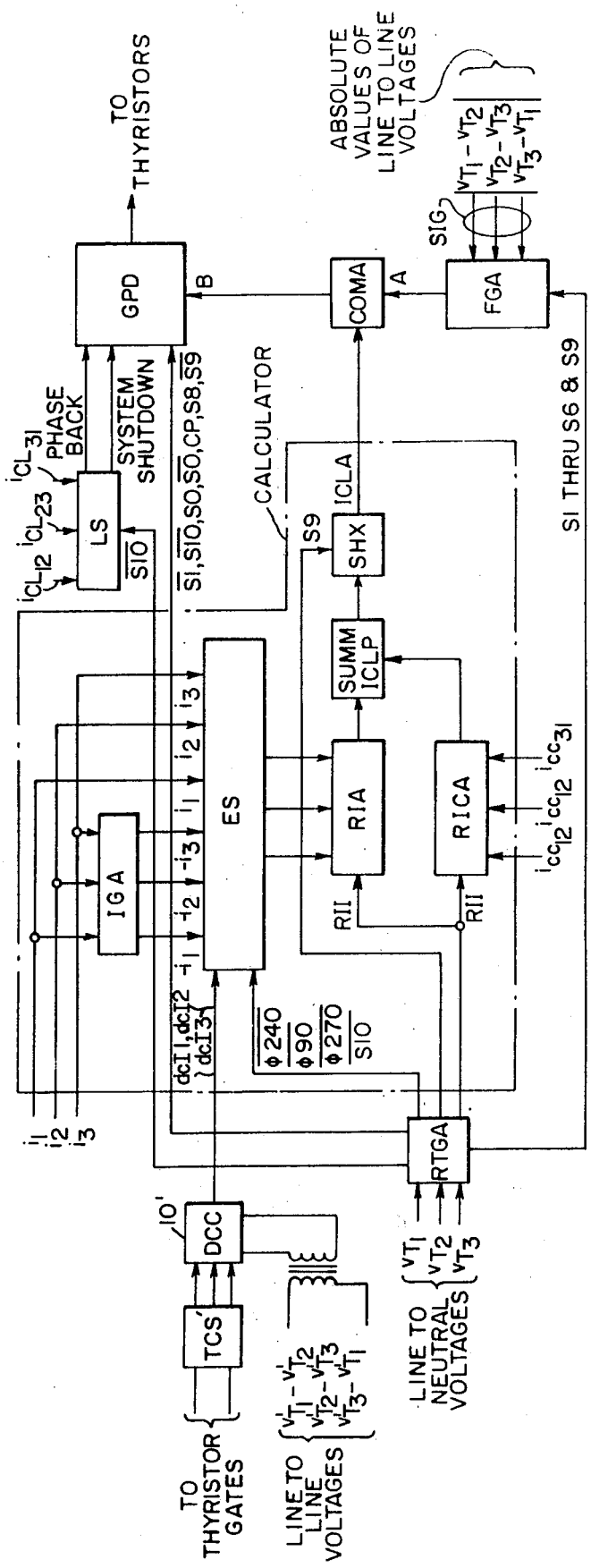
FIG. 21 shows another block diagram of a portion of the control system of FIG. 3 which utilizes the integration limits and techniques exemplified in FIG. 18.

Referring now to FIG. 21 there is shown another embodiment of the invention similar to that shown in FIG. 8 but which utilizes the concepts described and taught with respect to the embodiment of FIG. 18. By comparing FIG. 21 with FIG. 8 it can be seen that the important parts of the functional blocked diagram of each are similar, that is means are provided for measuring a certain circuit parameter to thus arrive at a delay angle $\alpha$ through the use of a switched input or resettable integrator. That is also taught the utilization of a function generator and a separate comparator to assist in implementing the production of the time delayed firing angle signal. In both cases the desired result is to achieve constant reactive power which may be zero reactive power as seen by the transmission line and to balance the asymmetric furnace load current as seen by the load. FIG. 21 shows a reference timing generator RTGA which may be similar to the reference timing generator or SYNCHRONOUS TIMING generator shown in FIG. 8 which includes the timing transformers TT, the zero crossing detectors ZCD, and the timing waveform generator TWG. In a preferred embodiment of the invention the reference timing generator RTGA of FIG. 21 may take on a new form which will be described hereinafter. The reference timing generator RTGA provides certain output signals which are utilizable by by other portions of the circuitry shown in FIG. 21 to perform appropriate functions. As an example, the reference timing generator RTGA may provide a signal $\overline{S10}$ to a load saving device or means LS which are similar to device LSOS described with respect to FIG. 3 which is the subject matter of copending application Ser. No. 535,629. The load saving device LS may utilize, as was described previously with respect to FIG. 3E, current input signals $i_{CL\,12}$, $i_{CL\,23}$ and $i_{CL\,31}$ all of which may be utilizable for providing the phase back or system shutdown signal which was described previously. In this embodiment of the invention the system shutdown signals and the phase back signals are shown as being provided to a gate pulse distributor GPD. In the embodiment shown primarily in FIGS. 3D and 3E the system shutdown signals were provided directly to a circuit breaker or similar means SSA. The gate pulse $$I_{CL_{12(2t-1)}} = I_{cc} - \left\{ \frac{1}{\sqrt{3}} \left( \frac{RR}{3X} - \frac{1}{\sqrt{3}} \right) \int_{\alpha_{2(2t)}}^{\alpha_{3(2t)}} (-i_2)d(\omega t) \right.$$

$$\left. - \frac{1}{2} \left( \frac{RR}{3X} + \frac{1}{\sqrt{3}} \right) \left[ \int_{\alpha_{3(2t-1)}}^{\beta_{31(2t)}} i_1 d(\omega t) + \int_{\beta_{31(2t)}}^{\alpha_{3(2t)}} (-i_1)d(\omega t) \right] \right\} + I \quad (25)$$

where $I = 0$.

This method has been tested by computer simulation with excellent results. The latter method, i.e. the method described with respect to FIG. 18, is impledistributor GPD may then provide signals to the appropriate thyristors in the compensator CO (not shown) to limit the firing angle $\alpha$ to, as an example, not less than 10°. Also shown in FIG. 21 is a direct current compensator $10'$, which may be similar to the direct current compensator 10 shown in FIG. 3 and described with respect thereto. This direct current compensator 10' is the subject matter of copending application Ser. No. 525,919. The direct current compensator 10' may be driven by a suitable thyristor conductor sensor TCS' which is similar to apparatus TCS shown in FIG. 3E. The output of the direct current compensator 10' provides signals dcI1, dcI2, and dcI3 to portions of an electronic switching apparatus ES in a manner similar to that described with respect to FIGS. 3E and 3C. One of the inputs to the direct current compensator 10' may be line to line voltages $(v_{T_1}-v_{T_2})$, $(v_{T_2}-v_{T_3})$ and $(v_{T_3}-v_{T_1})$ as shown in FIG. 3A for $(v_{T_3}-v_{T_1})$. In this embodiment of the invention the reference timing generator RTGA may also provide signals to the electronic switch ES, such as shown for example in detail in FIG. 27, to cooperate with line currents $i_1$, $i_2$, and $i_3$ and the inverted line currents $-i_1$, $-i_2$, and $-i_3$ as supplied by inverter IGA to thereby program or control a resettable integrator RIA similar to the resettable integrator RI shown in FIG. 8. The kinds of signals which may be supplied to the electronic switch ES are indicated as $\overline{\phi 240}$, $\overline{\phi 90}$, $\overline{\phi 270}$ (also shown in FIG. 24) and $\overline{S10}$.

Figure 27:
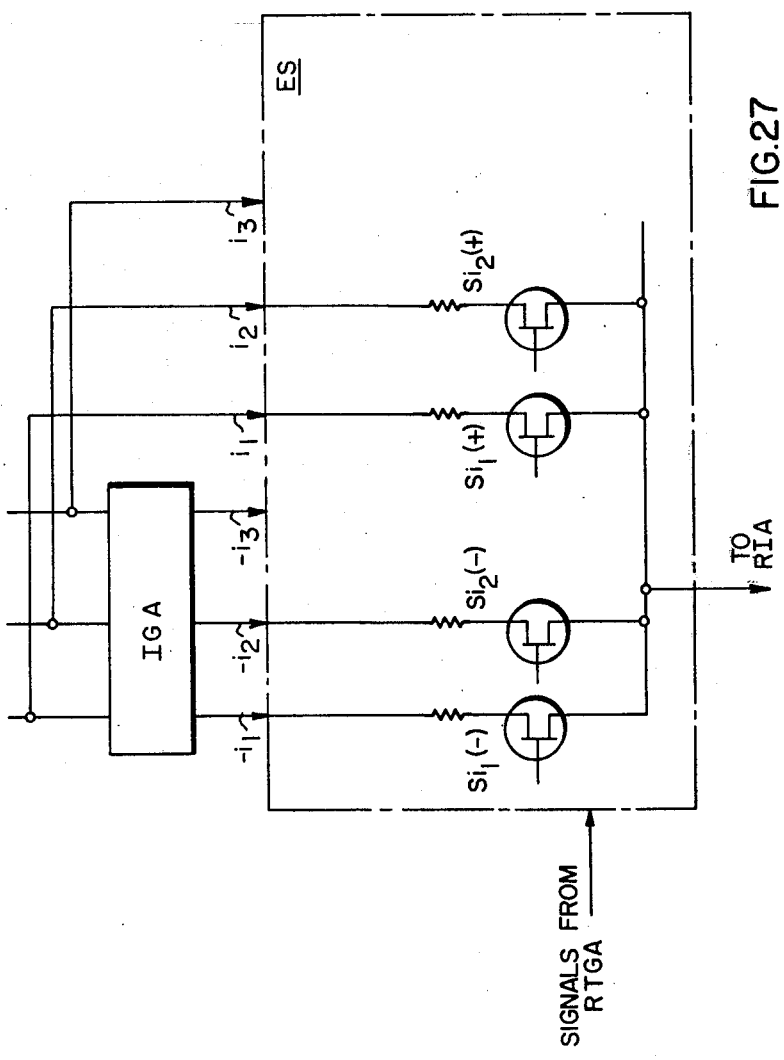
FIG. 27 shows an electronic switch apparatus for use with the embodiment of FIG. 21.

Referring to FIG. 27 the electronic switch ES may comprise gated means such as field effect transistors. A functional block for the inverting amplifier IGA and the electronic switch ES are shown. It must be noted that these are repeated from FIG. 21. In this example that portion of the electronic switch ES related only to the calculation of firing angle $\alpha_{12(1)}$ from current $I_{CL_{12}}$, which is related to the currents $I_{2(23)}$ and $I_{1(31)}$ which in turn are related to the currents $i_1$, $i_2$, $-i_1$ and $-i_2$ is shown. The related computational technique is graphically illustrated in FIG. 18. The switches $Si_1(-)$, $Si_2(-)$, $Si_1(+)$, and $Si_2(+)$ are gated in accordance with the conduction diagram shown in FIG. 19. The gating may be provided in accordance with the previously describes signals which issue from the reference timing generator RTGA shown in FIG. 21. It will be noted by comparing the timing diagram of FIG. 19 with the wave forms of FIG. 18 that switch $Si_2(+)$ does not conduct during the operation for determining $\alpha_{12(1)}$, while the other three switches $Si_1(+)$, $Si_1(-)$ and $Si_2(-)$ do conduct during the appropriate intervals of conduction which are indicated in FIG. 18. The reason $Si_2(+)$ does not conduct is that the current $(+i_2)$ does not enter into the computation of $\alpha_{12(1)}$ as can be seen by examining FIG. 18.

Referring once again to FIG. 21, input to the resettable integrator RIA is a signal RII which is generated by the reference timing generator RTGA and which is also applied to a second set of resettable integrators RICA which set is similar to the set RIC shown in FIG. 8. In this embodiment of the invention the output of the resettable integrators RIA and the output of the resettable integrators RICA are both provided to a summing amplifier SUMM ICLP similar to the summing amplifier ICL SUMM shown in FIG. 8. The output of the summing amplifier SUMM ICLP is provided to a sample and hold device SHX which is controlled by an output signal which may be signal S9 from the reference timing generator RTGA. The sample and hold means SHX provides an appropriate output signal ICLA to a comparator circuit COMA which then compares the signal ICLA with a signal A from a function generator FGA. The function generator FGA of FIG. 21 may be of the type described with respect to FIG. 3C or may be of a type, in a preferred embodiment, which is described hereinafter. Function generator FGA may utilize a set of input signals S9 and S1–S6 from the previously described reference timing generator RTGA and may also utilize the absolute value of voltage input signals $|v_{T_1}-v_{T_2}|$, $|v_{T_2}-v_{T_3}|$ and $|v_{T_3}-v_{T_1}|$. The output of the comparator COMA, which output is designated as the signal B in FIG. 21, may be utilized in the gate pulse distributor unit GPD.

Figure 22:
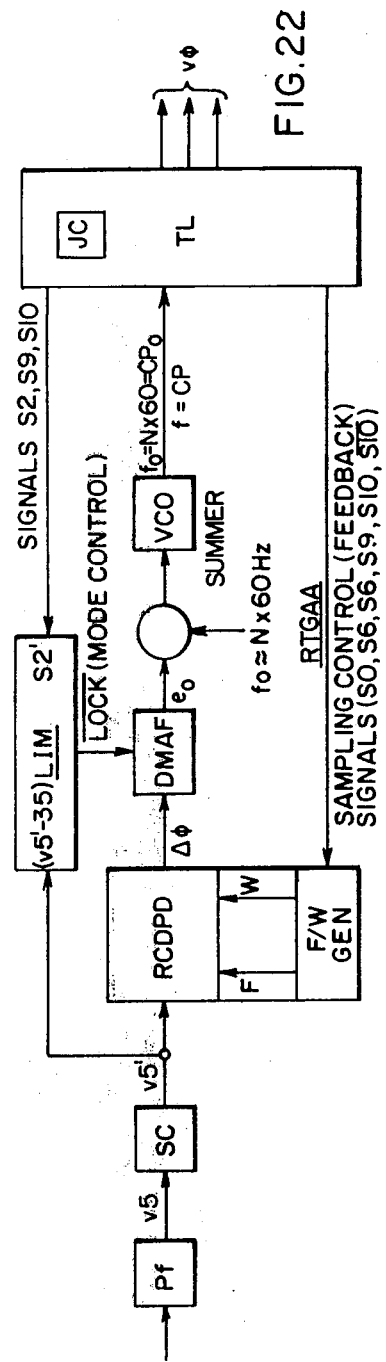
FIG. 22 shows a block diagram of a timing waveform generator suitable for use in the embodiment of FIG. 8 or in the embodiment of FIG. 21.

Referring now to FIG. 22 there is shown a reference timing generator RTGAA which may be used as the reference timing generator RTGA shown in FIG. 21. The reference timing generator RTGAA is arranged in the form of which is commonly called a phase locked loop. The phase locked loop contains a ripple cancelling digital phase detector RCDPD, a dual mode amplifier and filter DMAF, and additional elements to complete and/or influence the closed loop characteristics of the circuit as will become more apparent hereinafter. The input to the reference timing generator RTGA of FIG. 21 may be any one of a set of appropriate power line voltages $v_{T_1}$ through $v_{T_3}$. These signals are filtered by the prefilter Pf in FIG. 22. The output voltage v5 of the prefilter Pf is adjustable. This voltage v5 may lag the previously described line voltages by approximately 5 electrical degree in a 60 hz AC system. The prefilter time constant is selected to compensate for delays in transformer stages which are utilized to convert the previously described signals from the line voltage to the prefilter voltage v5. The signal v5 is amplified and clipped by a squaring circuit SC to provide an output wave which is designated v5'. This latter signal is applied concurrently to the input of the logic signal controlled static ripple cancelling digital phase detector RCDPD and the lock in monitor LIM. Depending upon whether the phase locked loop is in a "lock" or in an "out-of-lock" state, both of which will be described later, the gain of frequency characteristics of the dual mode amplifier filter DMAF are altered. When the phase locked loop is out of lock the dual mode amplifier filter DMAF is optimized for fast capture by utilizing an extended bandwidth, high transient response and low steady state gain at the expense of phase accuracy. This capture mode is enhanced with a bias amplifier circuit in the dual mode amplifier filter DMAF which decreases the capture time to only a full line voltage cycle. Faster capture capability means better recovery capability for the reference timing generator RTGAA on any external or internal interference. When the phase locked loop is in a lock mode, that is the mode where the phase difference between the signal v5' and its phase locked reference timing generator equivalent F which will be described hereafter is smaller than a preset limit here arbitrarily chosen to be plus or minus 15°, that state or mode is sensed by the lock in monitor LIM. The lock in monitor LIM then selects the appropriate mode of the dual mode amplifier filter DMAF by providing a $\overline{LOCK}$ output signal. The same $\overline{LOCK}$ information can be obtained with less circuitry if instead of the signal F, the zero crossing of the timing wave form S2, to be described later, is monitored. If the zero crossing of the signal S2 occurs during a 30° duration window, that is for the period of time of the signal v5' minus 35° (v5'−35) as initiated at the appropriate time that the signal v5' crosses the zero axis, then the phase locked loop is placed in the locked in mode. In this latter mode the phase locked loop operates with reduced bandwidth and larger steady state gain than during the capture mode. This technique if properly implemented results in high noise immunity and inherent zero steady state phase error irrespective of line frequency or drifting components anywhere in the phase locked loop. The phase error output of the phase detector RCDPD is a square wave signal $\Delta\phi$. The phase detector RCDPD is programmed to switch the signals $v5'$ or $\overline{v5'}$ as the case may be to the input of the digital mode amplifier filter DMAF. When the feedback signal F leads, is in phase or lags with respect to the signal $v5'$ the voltage controlled oscillator frequency must be decreased, unaltered or increased respectively to shift the signal F into phase with the signal $v5'$. The three output state phase detector RCDPD responds by switching a voltage zero, an open circuit or a relatively high voltage to the input of the dual mode amplifier filter DMAF. The zero or high signal forces the dual mode amplifier filter DMAF output signal to become more positive or more negative respectively than its previous output which provides the proper polarity to decrease or increase respectively the frequency $f$ at the output of the voltage controlled oscillator VCO. The duration of the zero or high signal is proportional to the existing phase difference and appears in each half period as input voltage to the DMAF. It follows from the above that in a steady state or an in-phase condition there is no need for either zero or high signals, and the signal $\Delta\phi$ represents an open circuit and does not influence the dual mode amplifier filter DMAF. Since $\Delta\phi$ is an open circuit due to internal cancellation of input signal $v5'$ and feedback signal F there is no ripple supplied to the dual mode amplifier signal in the steady state condition. During the capture mode the signals $v5'$ and F are strongly out of phase and therefore cannot cancel each other. This would normally produce a $\Delta\phi$ signal of long duration resulting in a unduly large voltage variation at the output $e_o$ of the dual mode amplifier DMAF. Because of the resulting large ripple, it has been found advantageous to limit the signal $\Delta\phi$ to a certain duration which may be less than ($\pm 35°$) and to make up for the loss of amplitude resulting from that limitation with the dual mode amplifier filter DMAF and the voltage controlled oscillator VCO. The limitation of the duration of the signal $\Delta\phi$ is implemented by analog sampling gates during both the positive and negative line cycles which let the signals $v5'$, $\overline{v5'}$ pass through to the dual mode amplifier filter DMAF input and become designated as signal $\Delta\phi$ only during the sampling interval. The sampling gate is controlled in both the positive and negative line voltage cycles by a digital wave from W which is in fixed phase relationship with the signal F. Both of the latter signals are derived from wave forms from the timing logic block TL as fed by the voltage controlled oscillator output CP shown in FIGS. 23 and 24. The duration of W, in this example, is 70° but other values may also be selected if the loop gain of the phase locked loop is corrected accordingly. In order to obtain $\Delta\phi$ output in both positive and negative line voltage periods window W may be gated 60 hz signals S10 and $\overline{S10}$ which, in turn, enable only that switch which provides the correct phase and magnitude information for the positive or negative half cycle respectively.

Figure 24:
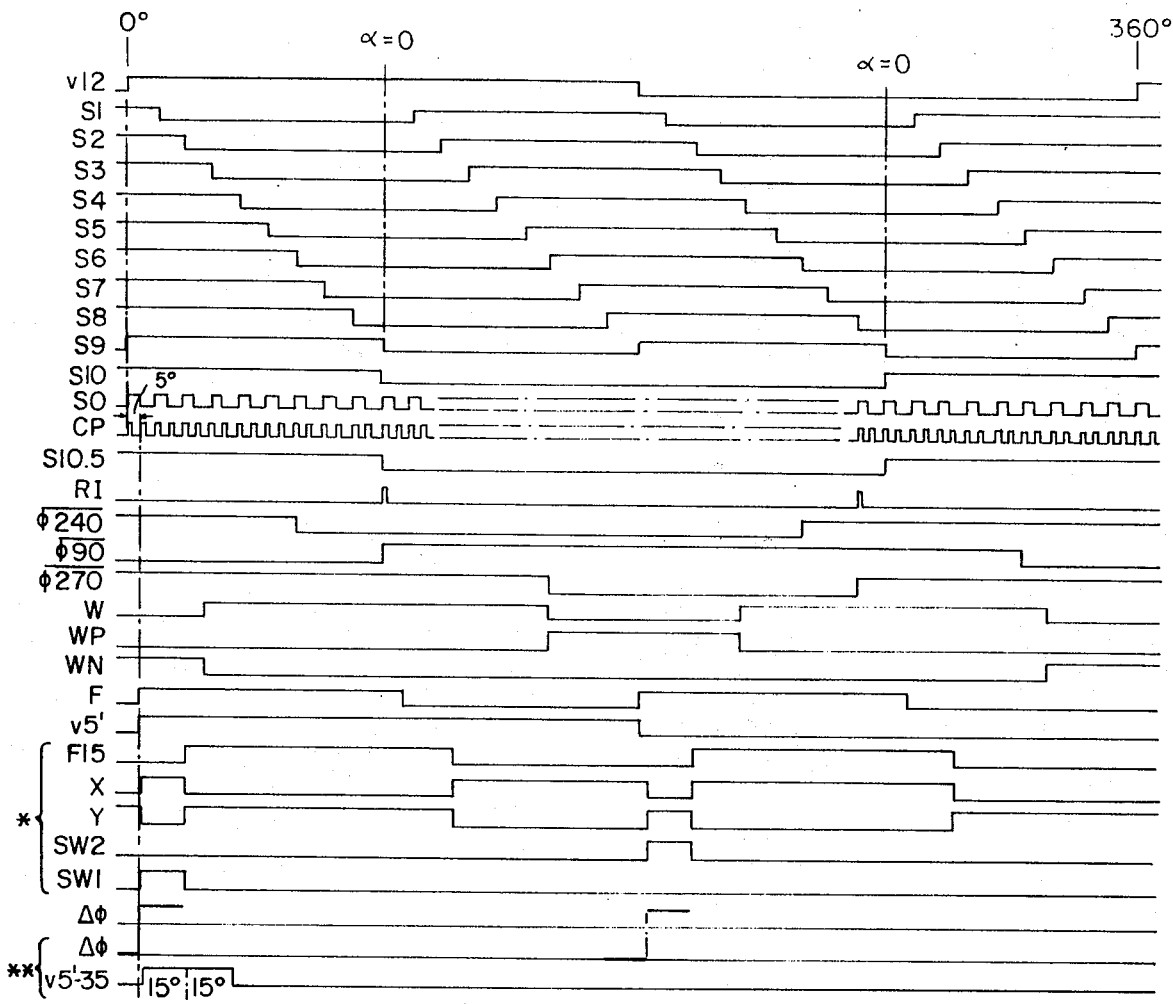
FIG. 24 shows the timing waveform diagram of the waveform generator of FIG. 23.

In this example signal F is derived so as to have its leading edge lagging 5° behind the actual zero crossing of line voltage $v_{12}$ shown as a clipped (digital) wave form in FIG. 24. This compensates for a delay, equal to 5° in this example, due to the net effect of the combined line potential transformation stages and the prefilter Pf. By proper selection of window W and feedback signal F a phase locked loop employing the described phase detector can operate at some other predetermined phase relationship with respect to its input signal while still theoretically maintaining zero phase error in steady state. Apart from the phase detection and dual mode techniques described previously the circuit also takes advantage of a conventional method to decrease capture time of a phase locked loop containing integrating capacitors which must reach a certain charged state before capture may begin. In this case the voltage controlled oscillator VCO is biased to approximately the value $f_o$ equals N times 60 hz. Consequently, when the output signal $e_o$ of the dual mode amplifier filter DMAF is zero the voltage controlled oscillator VCO output $CP_o$ is equal to N times 60 Hertz. In the circuit the $f_9 = N \times 60$ hz bias is implemented by biasing DMAF so that $e_o = f_o$ in the absence of $\Delta\phi$ input signal. N is the number of the dividing stages in the timing logic TL which are decoded to obtain the timing wave forms. The signal $f$ is a frequency signal proportional to the sum of the signal $f_o$ and the output signal $e_o$ of the dual mode amplifier. If the dual mode amplifier filter DMAF is chosen so that the signal $e_o$ never exceeds certain limits which would vary the voltage controlled oscillator output frequency more than a prescribed limit, the line and phase locked loop frequencies will stay relatively close. As is known, the closer these frequencies are the faster the capture times are in otherwise identical phase locked loop circuits. The timing logic circuit TL is a digital logic circuit with an input signal CP. The timing logic circuit TL may include a "Johnson Counter" JC in a preferred embodiment of the invention. It may also include a binary counter (divider) (not shown). The timing logic circuit TL comprises a combination of divider shift registers and gates as will be described hereinafter which apart from providing the interval control of the phase locked loop also supply several wave forms generally designated $v\phi$ which are utilized for reference timing purposes in the static flicker compensator CO. As an example, see the utilization of the output signals of the reference timing generator RTGA shown in FIG. 21.

Figure 23:
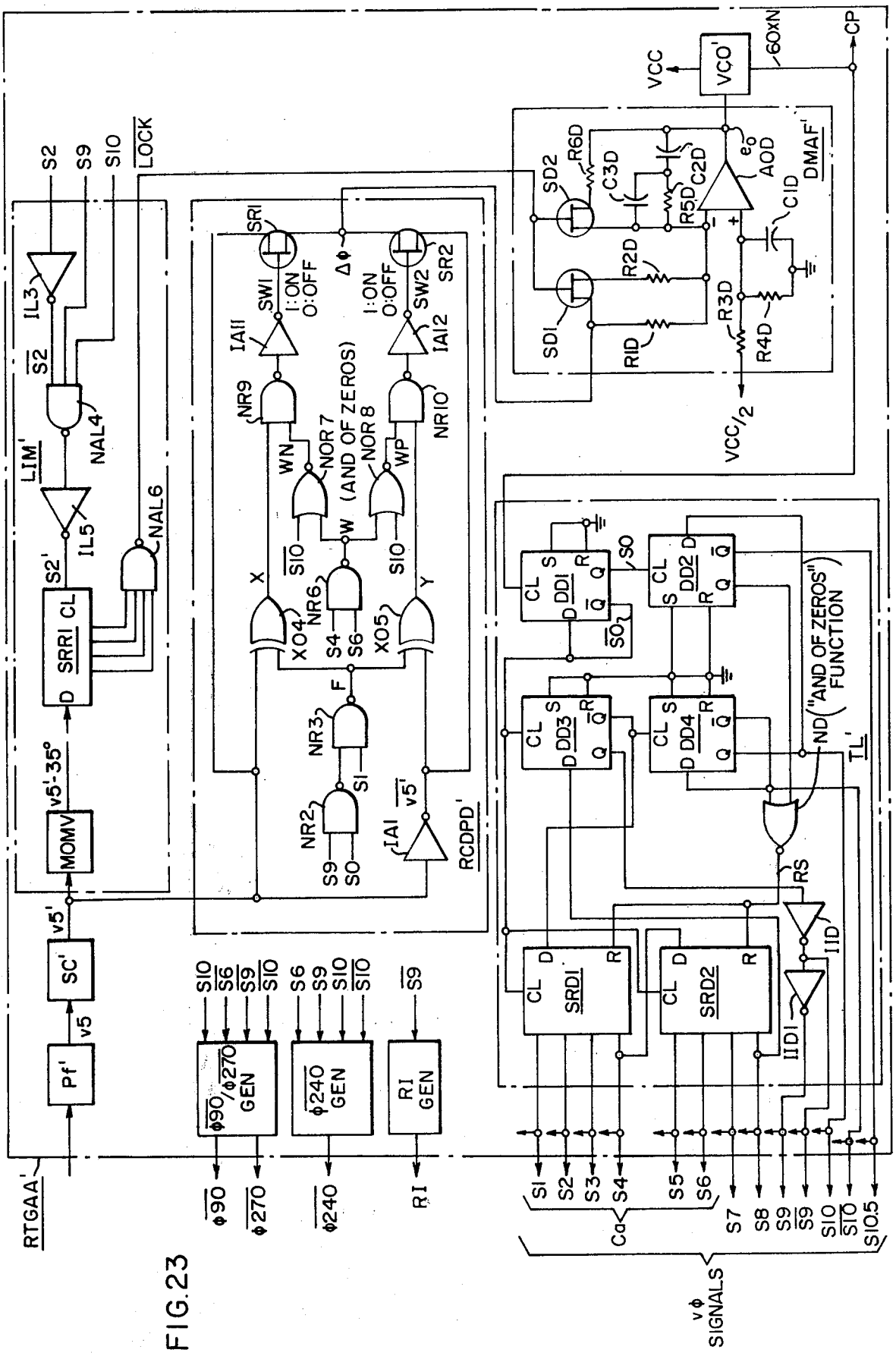
FIG. 23 shows a circuit schematic diagram of the timing waveform generator of FIG. 22.

Referring now to FIG. 23 and FIG. 24 together there is shown a particular embodiment of a reference timing generator RTGAA' which may be utilized to implement the block diagram reference timing generator RTGA shown in FIG. 21 and the timing wave forms associated therewith. There is provided a prefilter Pf' which is similar to prefilter Pf shown in FIG. 22. The input information to the prefilter Pf may be the same as or similar to the input information to the prefilter Pf shown in FIG. 22. There is also provided a squaring circuit SC' which is connected in series with the output of the prefilter Pf. The output of the squaring circuit SC' is designated $v5'$ as it was in FIG. 22 and it is provided concurrently to a lock in monitor LIM', and a ripple cancelling digital phase detector RCDPD'. The dual mode amplifier filter DMAF' is an active filter with switchable gain and frequency characteristics. It is built around an amplifier AOD which is biased to one half of a positive power supply voltage VCC by an equal resistance voltage divider which comprises the resistance elements R3D, R4D, and a capacitor noise filter C1D. The biasing of the amplifier AOD results in faster locking after circuit power is first applied. Connected to the negative side of the input of the amplifier AOD is input resistance R2D and another input resistance R1D. The input resistance R2D is connected in series with an electronic switch SD1. The other side of the switch SD1 and the other side of the resistive element R1D are connected to the signal line for conducting the signal $\Delta\phi$. A capacitive element C2D is connected or fed back from the output of the amplifier AOD to one side of a resistive element R5D the other side of which is connected to the previously mentioned input of the amplifier AOD. Connected across the resistive element R5D is a capacitive element C3D. Connected across the series combination of the capacitive elements C2D and C3D is the series combination of a resistive element R6D and an electronic switch SD2. During a capture mode the switches SD1 and SD2, which may be field effect transistors, are on. In that case, the open loop frequency response of the amplifier filter DMAF' is at least double that which it would be if the switches DS1 and DS2 were off. During capture the dual mode amplifier filter DMAF' operates as a three "Bode" diagram (not shown) break point network resulting in higher open loop gain at higher frequencies than in steady state condition. During capture condition, the filter DMAF' does represent a pure integration means. The absence of integration results in reduced drifting tendencies for random input signals which occur in the absence of a line voltage input signal to the prefilter Pf'. Because of this, the filter amplifier DMAF' does not tend to saturate due to drift preceding a capture, consequently, it exhibits a much higher degree of readiness to act when a signal appears at the prefilter Pf' input. In a lock mode or condition the generally pure integration action of the dual mode amplifier filter DMAF' is reestablished by opening the switch S2D. The resulting integrating action of the amplifier AOD in conjunction with its feedback capacitors and resistors provides a generally infinite DC gain at steady state for establishing zero phase error in the reference timing generator and nullifies the effects of drift elsewhere in the loop. By opening the switch SD1 the loop gain is decreased to a lower value which in turn increases the phase margin (stability of feedback control loop) to the required level. The output signal $e_o$ from the dual mode amplifier filter DMAF' is provided to a voltage controlled oscillator VCO' which may be of any standard type. An energizing signal or power supply signal VCC is necessary. The output of the voltage controlled oscillator is designated CP (as it is in FIG. 22) and is equal to some number N times a frequency $f$ (which in this embodiment is 60 hz).

The timing logic circuit TL' which contains a "Johnson Counter" is fed by the signal CP. The timing logic circuit TL' may be an all digital circuit which produces the signals shown as S1 through S10 of FIG. 24. Wave forms S1 through S9 are symmetrical 120 hz signals spaced in 10° incremental intervals with respect to S10 which in turn is a 60 hz signal which leads the voltage input signals at the prefilter Pf' by 90°. The timing logic circuit TL' of FIG. 23 comprises a first flip-flop DD1 which has its set and reset inputs disabled by connecting them to ground or system common and its clock input connected to the signal CP provided from the preceding voltage controlled oscillator stage VCO'. The Q output of flip-flop DD1 is connected to the clock input of another flip-flop DD2. The $\overline{Q}$ output terminal of flip-flop DD1 is connected to its own data input terminal and to the clock terminals of a flip-flop DD3 and the shift registers SRD1 and SRD2. The signal SO is at the Q output of the flip-flop DD1 and the signal $\overline{SO}$ is at the $\overline{Q}$ output of the flip-flop DD1. There is also another flip-flop DD4. The set and reset input terminal for the flip-flops DD2, DD3, and DD4 are all disabled by grounding them. The Q output terminal of the flip-flop DD2 is connected to one input terminal of a NOR gate ND. The Q output terminal of the flip-flop DD3 is connected to the input terminal of an inverter IID. The $\overline{Q}$ output terminal of the flip-flop DD3 is connected to the clock terminal of the flip-flop DD4 and to the data input terminal D of the shift register SRD1. The Q output terminal of the flip-flop DD4 is connected to the data input terminal of the flip-flop DD2 and provides the signal S10. The $\overline{Q}$ output terminal of the flip-flop DD4 is connected to the remaining terminal of the NOR gate ND and to its own D terminal. The $\overline{Q}$ terminal of the flip-flop DD4 provides the signal $\overline{S10}$. The output terminal of the NOR gate ND is connected to the reset terminals of the shift registers SRD1 and SRD2. The output of the the inverter IID is connected to the input of another inverter IID1. The output of the inverter IID represents the $\overline{S9}$ signal and the output of the inverter IID1 represents the S9 signal. The output of the shift register SRD1 comprises four output terminals having the signals S1, S2, S3 and S4 provided thereat, one to a terminal. The output terminal where the signal S4 may be generated is also connected to the data input terminal of the shift register SRD2. The output terminal of the shift register SRD2 comprises four outputs which are capable of providing the output signals S5, S6, S7 and S8, one to each terminal. The output terminal which produces the signal S8 is connected to the D input terminal of the flip-flop DD3. In operation the flip-flop DD1 acts as a divide by two divider which produces wave forms SO and $\overline{SO}$. In a preferred embodiment the period of the signal SO is equivalent to 10 electrical degrees. The $\overline{SO}$ signal clocks or indexes the eight bit shift register comprising the combined four bit shift registers SRD1 and SRD2. The last bit of the shift register SRD2 is connected to a divide by four divider circuit comprising the combined flip-flops DD3 and DD4. The Q output of the flip-flop DD3 is fed back as was described previously to the data input terminal of the shaft register SRD1. In this sense the terminal Q of the flip-flop DD3 produces a symmetrical 120 hz wave form or signal S9. The signal S10 is provided by the flip-flop DD4 as a 60 hz wave form or signal. A necessary function is the resetting of the total shift register comprising the combined shift register devices SRD1 and SRD2. This is done with a 5° pulse. This latter operation is needed for the safe startup of the timing logic device TL'. The $\overline{Q}$ output of the flip-flop DD2 is a signal S10.5 shown on the timing diagram of FIG. 24, which follows or lags the S10 signal by a 5° delay. The S10 and S10.5 signals are combined or added together by the NOR gate ND which produces a reset signal RS which is provided to the reset terminals R of the shift registers SRD1 and SRD2.

As was described previously, the input to the dual mode amplifier filter DMAF' comprises a lock/no lock signal from the lock in monitor LIM', and a signal $\Delta\phi$ from the ripple cancelling digital phase detector RCDPD'. As was also described previously both the digital phase detector RCDPD' and the lock-in monitor LIM' are driven at their respective inputs by the signal $v5'$ from the squaring circuits SC'. The ripple cancelling digital phase detector RCDPD' comprises an input line connected to the output terminal of the squaring circuit SC'. The input line is provided concurrently to an inverter IA1, to one terminal of an exclusive OR gate XO4 and to one side of an electronic switch SR1. The output terminal of the inverter IA1 which generates the $\overline{v5'}$ signal is supplied to one side of an electronic switch SR2 and to an input terminal of an exclusive OR gate XO5. There is provided a NAND gate NR2 which is capable of having the signals S9 and S0 provided to the input terminals thereof. The output of the NAND gate NR2 is provided to the input terminal of another NAND gate NR3 which is capable of having the signal S$i$ provided at the other input terminal thereof. The output of the NAND gate NR3 is provided simultaneously to the remaining terminal of each of the exclusive OR gates XO4 and XO5. It is on the output terminal of the NAND gate NR3 that the signal F appears. There is also provided a NAND gate NR6 which is capable of having provided on its two input terminals the signals S4 and S6. The output of a NAND gate NR6 provides the signal W which is supplied to one terminal each of NOR gates NOR7 and NOR8. The other input terminal for the NOR gate NOR7 receives the signal $\overline{S10}$ while the other input terminal of the NOR gate NOR8 receives the signal S10. The output terminal of the NOR gate NOR7 is supplied to one input terminal of NAND gate NR9. The output terminal of the exclusive OR gate XO4 is connected to the other input terminal of the NAND gate NR9. It is on the output terminal of gate XO4 that the signal X is provided and it is on the output terminal of the NOR gate NOR7 that a signal WN is provided. The output terminal of the exclusive OR gate XO5 is connected to one input terminal of a NAND gate NR10. The output terminal of the NOR gate NOR8 is connected to the other input terminal of the NAND gate NR10. The output terminal of the NOR gate NOR8 carries the signal WP while the output terminal of the exclusive OR gate XO5 carries the signal Y. The output terminal of the NAND gate NR9 is connected to an inverter IA11, the output of which is connected to the switching terminal of the switch SR1. The output of the inverter IA11 carries the signal SW1. The output terminal of the NAND gate NR10 is connected to the input terminal of an inverter IA12 the output of which is connected to the control terminal of the switch SR2. The output terminal of the inverter IA12 carries the signal SW2. The remaining terminals of the switches SR1 and SR2 are tied together at a common junction and are connected to an input of the dual mode amplifier filter DMAF'. It is on this latter output that the signal $\Delta\phi$ exists. The latter signal $\Delta\phi$ is a tri-state digital signal with outputs of 0, 1 or open circuit. The output pulse width of the latter signal is proportional to the phase difference while the output state, that is 0 or 1, determines the polarity of the phase difference with respect to the signals $v5'$ and F. When the signal F lags with respect to the signal $v5'$ the signal $\Delta\phi$ is 1. Similarly, when the feedback signal F leads with respect to the $v5'$ signal the signal $\Delta\phi$ is 0. The maximum pulse width however is limited by the signal W, which stands for window, to less than the maximum width which would be observed at 90° phase difference without limitation. The phase detector RCDPD' may supply phase information twice during one line voltage cycle. First the signal $\overline{v5'}$ is generated by an inverter IA1 as previously described. The signals $v5'$ and $\overline{v5'}$ are connected to controlled switches SR1 and SR2 respectively as was previously described, which signals are combined generally to provide the output signal $\Delta\phi$ as previously described. The feedback signal F is produced by the combined action of the NAND gates NR2 and NR3 as was previously described. The zero crossings of the $v5'$ signal occur approximately or generally 5° after the reference line voltage zero crossings. This is in accordance with the requirements set by the combined 5° delay incurred in the voltage transformation stage and in the prefilter P$f'$. If a delay other than 5° is selected the composition of the feedback signal F would have to be changed to provide the required in-phase signal with the phase detector input. The ripple cancelling characteristic of the phase detector RCDPD' is achieved by level sensitive exclusive OR-ing of the signals $v5'$ and F which in turn controls the output switches SR1 and SR2 along with windows WN and WP. Ripple cancelling is defined such that for zero phase error there is no output signal and therefore there is no ripple transmitted to the dual mode amplifier filter DMAF'. Since the phase detection circuit does not contain triggered (memory) logic circuits but only level controlled non-latching circuits, it exhibits a high degree of immunity to possible multiple line voltage zero crossings while still being capable of theoretically maintaining zero steady state phase error. Instead of latching on the first zero crossings as ripple cancelling phase detectors of the prior art do, the present ripple cancelling phase detector averages out the positive and negative going noise effects on the line voltage which cause the multiple zero crossings. Amplitude limiting which is equivalent to pulse duration is implemented by first deriving the basic window signal W, which is then provided at the output of the NAND gate NR6, from the signals S4 and S6. The zero state of the signal W is centered around the zero crossings of the signal $v5'$. The signal W is further gated through an AND of zeros function performed by the NOR gates NOR7 and NOR8. The second gating overrides the signal W thereby alternately inhibiting the switches SW1 and SW2 during half periods $\overline{S10}$ and S10 respectively. Without the second inhibition, erroneous information might be transferred to the output. This two stage inhibition is performed by the gates NOR7, NOR8, NR9, and NR10. Inverters IA11 and IA12 are used to interface the switches SR1 and SR2 with the gates NR9 and NR10 respectively.

In FIG. 24 a timing wave form diagram for the apparatus of FIGS. 21, 22 and 23 is shown. In addition, in FIG. 24, two examples for the signal $\Delta\phi$ are shown. One example corresponds to a 15° lag of the signal F with respect to $v5'$ and the other example corresponds to a 15° lead of the signal F with respect to $v5'$.

There is also present in the drawing of FIG. 23, a lock in monitor LIM'. This comprises a monostable multivibrator MOMV the input of which is connected to the $v5'$ output and the output of which is equal to $v5'$ minus 35°. The output of the monostable MOMV is connected to the data input terminal of a shift register SRR1. The clock terminal CL of the shift register SRR1 is connected to the output of inverter IL5. There is provided another inverter IL3 and output of which is connected to one input terminal of a NAND gate NAL4. Provided to other input terminals of the NAND gate NAL4 are the signals S9 and S10. The input signal to the inverter IL3 is the signal S2. Consequently, the output of the inverter IL3 is the signal $\overline{S2}$. The output of the NAND gate NAL4 is provided as an input to the previously described inverter IL5. The output signal of the inverter IL5 is the signal S2' which, as was described previously is connected to the clock terminal CL of the shift register SRR1. There are four output terminals for the shift register SRR1 which are provided as inputs to a NAND gate NAL6 the output of which comprises the $\overline{\text{LOCK}}$ signal for the amplifier filter DMAF'. With respect to the lock in monitor LIM' the 30° wide sensing window as previously described is obtained from a level sensitive monostable circuit MOMV fed by the signal v5'. During sensing, starting with the leading edge of the signal v5', the window signal v5' minus 35° and therefore the input terminal of the shift register SRR1 is at a digital one for a 30° duration of a line cycle. In steady state the clock signal S2' becomes a digital one 15° after the window signal W is initiated. When the phase locked loop comprising the phase cancelling digital phase detector RCDPD', the dual mode amplifier filter DMAF', and the voltage controlled oscillator VCO' is in a lock status or state the signal S2' clocks the shift register SRR1 at the middle of the previously described window and the one input of the gate NAL6 becomes a digital one. If the above state occurs or continues for at least four consecutive line cycles (arbitrarily chosen) the phase locked loop is considered to be in the lock state. This is indicated by the presence of zero for the output $\overline{\text{LOCK}}$ signal of NAND gate NAL6. Whenever a single cycle is detected in which clocking occurred while the signal v5' minus 35° is zero the $\overline{\text{LOCK}}$ signal becomes one for at least four consecutive line cycles. In this condition the reference timing generator RTGAA' is in a capture mode which is the condition for the fastest possible recovery period.

There is shown in the reference timing generator RTGAA' of FIG. 23 a functional block designated $\overline{\phi\,90}/\phi\,270$ GEN which has as input signals the previously described signals S10, $\overline{S6}$, $\overline{S9}$, and $\overline{S10}$. Its outputs are $\overline{\phi\,90}$ and $\overline{\phi\,270}$. There is also provided a $\overline{\phi\,240}$ GEN which has as its inputs the signals S6, S9, S10 and $\overline{S10}$ and which has as its output the signal $\overline{\phi\,240}$. Finally, there is an RI GEN which has as its input the signal $\overline{S9}$ and as its output signal RI. These latter signals may be used as the output signals of reference timing generator RTGA shown in FIG. 21. As an example note the signals provided as a timing input for the electronic switches ES of FIG. 21.

Figure 25:
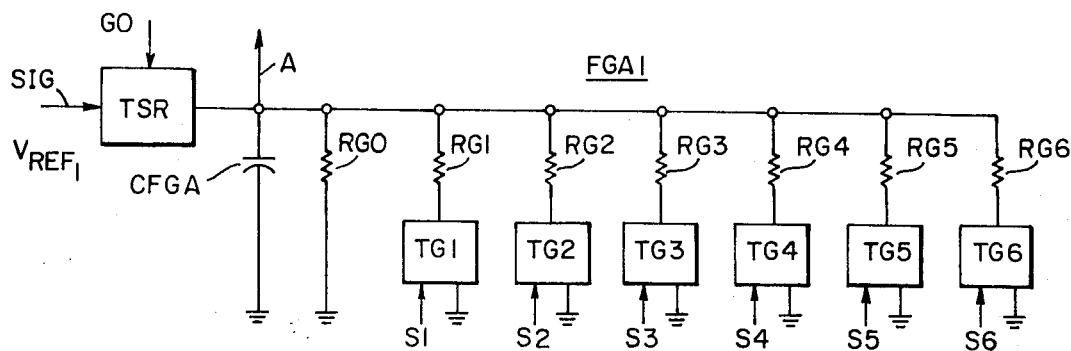
FIG. 25 shows a function generator suitable for use in the control system of FIG. 21 or the control system of FIG. 8.

Referring now to FIG. 25 there is shown a function generator FGA1 which may be utilized for the function generator FGA shown in FIG. 21. The function generator FGA1 may comprise a timing signal receiver TSR which may have as inputs the signals generally designated SIG in FIG. 21 for example, and a signal generally designated GO. Connected in parallel with the output A and ground or system common of the function generator FGA1, is a capacitor CFGA, a resistor RGO and six switched resistors RG1 through RG6. Each of the switched resistors RG1 through RG6 is controlled by respective switching elements TG1 through TG6 which in turn are supplied with the signals S1 through S6 respectively as described and shown in FIGS. 23 and 24. The output A is adapted to be supplied to be a comparator such as COMA as shown in FIG. 21. Conceptually, the circuit is based on equation (26), shown below which is a repetition of equation (10) shown previously but repeated here for convenience.

$$I_{CL} = 2\left(\frac{\sqrt{3}\,V}{\pi\omega L}\right)\left(\frac{\pi}{2} - \alpha - \frac{1}{2}\sin 2\alpha\right), \qquad (26)$$

where $$0 \leq I_{CL} \leq \frac{\sqrt{3}\,V}{\pi\omega L} \text{ for } \frac{\pi}{2} \geq \alpha \geq 0.$$

A function generator representing the right side of the equation above has been shown previously with respect to FIG. 3C. It is, for example, the function of alpha generator FG1 shown in FIG. 3C. In a preferred embodiment the function generator FGA1 of FIG. 25 may be used for the function generator FG1 of FIG. 3C. A method is available for use with the apparatus FGA1. The method takes into account the advantage that the desired function $f(\alpha)$ as shown previously bears a resemblance to a decaying exponential. Prior to zero degrees ($\alpha = 0°$), the capacitor CFGA is charged to a voltage potential (which may be proportional to a value $V/\omega L$ or alternately proportional to a capacitive component $I_{CC}$ of a compensator current $I_C$) through a transmission gate or timing signal receiver TSR while all other transmission gates TG1 through TG6 are blocked. At a time corresponding to alpha equaling zero degrees, the transmission gate TSR is blocked and the capacitor CFGA begins to discharge through the resistor RG0. The value of resistor RG0 is selected so that the deviation of the voltage across capacitor CFGA from the desired function $I_{CL}$ is minimized during a preselected time interval, for example the interval corresponding to $\alpha = 0°$ to $\alpha = 10°$. Since the slope of the desired function $I_{CL}$ at the end of this preselected interval has a larger negative magnitude than that resulting from the discharging of capacitor CFGA through resistor RG0, it is necessary to reduce the value of the total resistance that is utilized to discharge capacitor CFGA. Therefore, when $\alpha$ equals 10° the transmission gate TG1 is made conductive by the presence of the synchronized signal S1. Consequently the capacitor CFGA continues to discharge through the parallel combination of resistors RG0 and RG1. The value of resistor RG1 is selected so that the deviation of the voltage impressed across the capacitor CFGA from the desired functions is minimized during the next preselected interval which may correspond for example to the increment from $\alpha = 10°$ to $\alpha = 20°$. The desired function $I_{CL}$ is such that it is incrementally necessary to lower the parallel value of total discharging resistance at predetermined intervals in order to obtain close correspondence between the function $I_{CL}$ and the voltage across capacitor CFGA. Thus when $\alpha$ equals 20° another gate TG2 is made conductive by a signal S2 and the capacitor CFGA discharges then through the parallel combination of the three resistors RG0, RG1 and RG2. The rest of the transmission gates may be gated at 10° intervals in a similar manner by the signals S3–S6 thus causing the remainder of the parallel resistors RG3 through RG6 respectively to be gradually brought into the parallel combination comprising the total discharge resistance. Signal GO which controls the charging of capacitor CFGA may be formed by the combination (i.e. logical AND-ing) of signals S9 and S6. The previously described action periodically changes the slope of the discharging characteristic of the capacitive element CFGA. The total time-related capacitor discharge curve may represent the signal A of FIG. 21. This latter signal is used in a preferred embodiment of the invention as a comparison signal for a comparator such as COMA shown in FIG. 21. Eventually a value of signal A is attained which causes the comparator COMA of FIG. 21 to change state thus causing the firing or triggering on of a related thyristor in the compensator CO.

Figure 26:
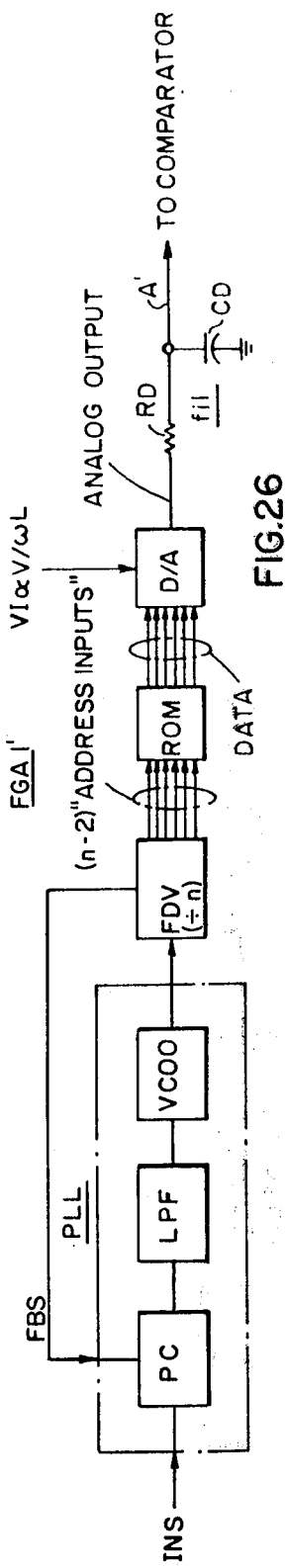
FIG. 26 shows still another function generator suitable for use in the control system of FIG. 21 or the control system of FIG. 8.

Referring now to FIG. 26 there is shown a function generator FGA1'. In this case the output of an $n$ bit divider FDV in the phase lock loop PLL provides "address inputs" for a read-only memory ROM. The read-only memory ROM is programmed to give a digital output value which, when converted to a voltage output by the D/A converter and smoothed by the RC low pass filter $fil$ will provide the desired function A'. If, for example, $n = 8$, then $n-2 = 6$ address inputs are applied to the read-only memory ROM. Consequently, 64 discrete time steps each corresponding to 90/64 of a degree are generated in the 0° to 90° time interval or period. For each step, a predetermined digital output may be obtained from the read-only memory ROM. When this digital output is applied to the digital-to-analog converter D/A, a preselected value of voltage is applied to the RC filter $fil$. The purpose of the RC filter $fil$ is to smooth out the discrete steps in the output voltage wave forms. By making the reference voltage VI proportional to V/ωL, as an example, the desired function tracking is obtained. The output of the RC filter is signal A' and may be applied to the voltage comparator COMA (shown in FIG. 21) in place of signal A. When correspondence is obtained with a signal representing $I_{CL}$ (such as signal ICLA in FIG. 21), a firing signal such as signal B in FIG. 21 is given or supplied to the unit GPD of FIG. 21.

With respect to the embodiment of FIG. 25, it should be noted that the generated $f(\alpha)$, i.e. signal A has no discontinuities in the voltage values but will have discontinuities in the incremental slopes of the curve. On the other hand, in the embodiment of FIG. 26 there are discontinuities in the actual voltage value of signal A'. The phase lock loop PLL of FIG. 26 may comprise a phase comparator PC which feeds a low pass filter LPF which in turn feeds a voltage controlled oscillator VCOO. The voltage controlled oscillator VCOO provides the input signal to the $n$ bit frequency divider FDV. The feed back signal FBS is supplied to the phase comparator PC where it is compared with the input signal INS. Signal INS may be a 60 hz line voltage or current signal. The RC filter $fil$ comprises the resistive element RD and the capacitive element CD. It has been found through testing that the signal A' of FIG. 25 simulates or approximates the actual $f(\alpha)$ signal (rightmost bracketed portion in equation (26)) within 0.3% of the peak initial value of the $f(\alpha)$ signal, for 10° increments with six addressed inputs to the ROM. Closer approximation can be obtained by using smaller increments.

The varied slope approximation shown in FIG. 25 (signal A) may be utilized to get the same accuracy associated with the technique described with respect to FIG. 26 but may do so with less steps or changes per increment of time or voltage angle.

The function generators of FIGS. 25 and 26 are relatively drift-free, economical, reliable and generally approach zero at their outputs at the end of their operating cycles.

The advantages of the apparatus taught herein are many. One advantage lies in the fact that flicker compensation or reactive power generation may be accomplished quickly without the use of a synchronous condenser. Another advantage lies in the fact the DC component can be eliminated in the compensator. Another advantage lies in the fact that system shutdown can be initiated according to predetermined conditions. Another advantage lies in the fact that a mathematical representation determinative of firing angle can be implemented.

What we claim as our invention is:

1. Apparatus for providing reactive power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which is present between said first, second and third conductors respectively and a common electrical reference point, said electrical system also including a primary source of alternating electrical power connected to the three conductors, said electrical system also including an electrical load connected to three conductors, the first, second and third terminal voltages having first, second and third peak magnitudes respectively and a given phase relationship relative to each other for a given period of time, comprising:

a. a reactive power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said reactive power generator providing a compensating current of said frequency at said first output terminal during a switch controlled portion of a given half cycle of said first alternating voltage, said compensating current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said reactive power generator for switching said reactive power generator to thus provide said portion of said compensating current according to the following relationship:

switch delay being related to the integration of the negative of said second load current over a first interval starting at a point where said second terminal voltage crosses zero going negative and ending at a point where said third terminal voltage next crosses zero going negative, and the integration of said first load current over a second interval starting at the point where said third terminal voltage crosses zero going positive and ending at a point when said first terminal voltage next crosses zero going positive, said latter two intervals overlapping, said switch delay being measured from the end of the first interval, all integrations being made with respect to said frequency times time.

2. The combination as claimed in claim 1 wherein said frequency is 60 hz.

3. The combination as claimed in claim 2 wherein said phase relationship between said first, second and third terminal voltages is 120° for each voltage relative to the others.

4. The combination as claimed in claim 1 wherein said first, second and third peak magnitudes are generally equal for said first, second and third terminal voltages respectively.

5. The combination as claimed in claim 1 wherein said common electrical reference for said first, second and third terminal voltages is ground potential.

6. The combination as claimed in claim 1 wherein said common electrical reference for said first, second and third terminal voltages is the common midpoint of a star connected A.C. generating system.

7. The combination as claimed in claim 1 wherein said predetermined fixed phase relationship between said first terminal voltage relative to said common reference and said first alternating source current is generally 0°.

8. The combination as claimed in claim 1 wherein said reactive power generator comprises a thyristor switched inductor, said switch delay being a delay in the firing angle of said thyristor.

9. The combination as claimed in claim 1 comprising a second reactive power generator having a first output terminal thereof connected to said place on said second conductor and having a second output terminal thereof connected to a place on said third conductor, a third reactive power generator having a first output terminal thereof connected to said place said third conductor and a second output terminal thereof connected to said place on said first conductor, a third alternating load current of said frequency flowing in said third conductor between said place thereon and said load, said second and said third reactive power generators providing second and third compensating currents of said frequency respectively during second and third switch controlled portions respectively of given half cycles of said second and third alternating voltages respectively, said second and said third compensating currents being vectorially added to said second and said third alternating load currents respectively so that a second and third alternating source current respectively of said frequency flowing in said second and third conductors respectively between said source and said place where said first output terminal of said second reactive power generator is connected to said second conductor and said place where said first output terminal of said third reactor power generator is connected to said third conductor respectively are each in second and third predetermined fixed phase relationship respectively with said second and third terminal voltages respectively for each half cycle thereof.

10. The combination as claimed in claim 9 wherein said first, second and third predetermined fixed phase relationships between said first, second and third terminal voltages respectively relative to said common reference and said first, second and third alternating source currents respectively are equal.

11. The combination as claimed in claim 10 wherein said latter equal phase relationship is zero.

12. The combination as claimed in claim 10 wherein said first, second and third source currents are balanced because of the compensating currents of said first, second and third reactive power generators respectively.

13. Apparatus for providing reactive power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which is present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a reactive power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said reactive power generator providing a compensating current of said frequency at said first output terminal during a switch controlled portion of a given half cycle of said first alternating voltage, said compensating current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said reactive power generator for switching said reactive power generator to thus provide said portion of said compensating current according to the following relationship:

switch delay being related to the integration of said second load current over the interval starting at a point where said third terminal voltage crosses zero going positive and ending at a point where said second voltage next crosses zero going negative, plus the integration of the negative of said second load current over the interval starting at the last named point and ending at a point where said third terminal voltage next crosses zero going negative, and the integration of said first load current over an interval starting at said point where said third terminal voltage crosses zero going positive and ending at a point where said third voltage next crosses zero going negative, plus the integration of the negative of said first load current over an interval starting at said last named point and ending at said point where said third terminal voltage crosses zero going negative, said switch delay being measured from the end of said last interval, all integrations being made with respect to said frequency times time.

14. The combination as claimed in claim 13 wherein said frequency is 60 hz.

15. The combination as claimed in claim 14 wherein said phase relationship between said first, second and third terminal voltages is 120° for each voltage relative to the others.

16. The combination as claimed in claim 13 wherein said first, second and third peak magnitudes are generally equal for said first, second and third terminal voltages respectively.

17. The combination as claimed in claim 13 wherein said common electrical reference for said first, second and third terminal voltages is ground potential.

18. The combination as claimed in claim 13 wherein said common electrical reference for said first, second and third terminal voltages is the common midpoint of a star connected A.C. generating system.

19. The combination as claimed in claim 13 wherein said predetermined fixed phase relationship between said first terminal voltage relative to said common reference and said first alternating source current is generally 0°.

20. The combination as claimed in claim 13 wherein said reactive power generator comprises a thyristor switched inductor, said switch delay being a delay in the firing angle of said thyristor.

21. The combination as claimed in claim 13 comprising a second reactive power generator having a first output terminal thereof connected to said place on said second conductor and having a second output terminal thereof connected to a place on said third conductor, a third reactive power generator having a first output terminal thereof connected to said place said third conductor and a second output terminal thereof connected to said place on said first conductor, a third alternating load current of said frequency flowing in said third conductor between said place thereon and said load, said second and said third reactive power generators providing second and third compensating currents of said frequency respectively during second and third switch controlled portions respectively of given half cycles of said second and third alternating voltages respectively, said second and said third compensating currents being vectorially added to said second and said third alternating load currents respectively so that a second and third alternating source current respectively of said frequency flowing in said second and third conductors respectively between said source and said place where said first output terminal of said second reactive power generator is connected to said second conductor and said place where said first output terminal of said third reactor power generator is connected to said third conductor respectively are each in second and third predetermined fixed phase relationship respectively with said second and third terminal voltages respectively for each half cycle thereof.

22. The combination as claimed in claim 21 wherein said first, second and third predetermined fixed phase relationships between said first, second and third terminal voltages respectively relative to said common reference and said first, second and third alternating source currents respectively are equal.

23. The combination as claimed in claim 22 wherein said latter equal phase relationship is zero.

24. The combination as claimed in claim 22 wherein said first second and third source currents are balanced because of the compensating currents of said first, second and third reactive power generators respectively.

25. Apparatus for providing reactive power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which is present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a reactive power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said reactive power generator providing a compensating current of said frequency at said first output terminal during a switch controlled portion of a given half cycle of said first alternating voltage, said compensating current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said reactive power generator for switching said reactive power generator to thus provide said portion of said compensating current according to the following relationship:

switch delay being related to the integration of said first load current over the interval starting at a point where said third terminal voltage crosses zero going positive and ending at a point where said third voltage next crosses zero going negative plus the integration of the negative of said first load current over an interval starting at said last named point and ending at a point where said third terminal voltage next crosses zero going negative, and the integration of the negative of said second load current over an interval starting at a point where said second terminal voltage crosses zero going negative and ending at said point where said third terminal voltage crosses zero going negative, said switch delay being measured from the end of said last named interval, all integrations being made with respect to said frequency times time.

26. The combination as claimed in claim 25 wherein said frequency is 60 hz.

27. The combination as claimed in claim 26 wherein said phase relationship between said first, second and third terminal voltages is 120° for each voltage relative to the others.

28. The combination as claimed in claim 25 wherein said first, second and third peak magnitudes are generally equal for said first, second and third terminal voltages respectively.

29. The combination as claimed in claim 25 wherein said common electrical reference for said first, second and third terminal voltages is ground potential.

30. The combination as claimed in claim 25 wherein said common electrical reference for said first, second and third terminal voltages is the common midpoint of a star connected A.C. generating system.

31. The combination as claimed in claim 25 wherein said predetermined fixed phase relationship between said first terminal voltage relative to said common reference and said first alternating source current is generally 0°.

32. The combination as claimed in claim 25 wherein said reactive power generator comprises a thyristor switched inductor, said switch delay being a delay in the firing angle of said thyristor.

33. The combination as claimed in claim 25 comprising a second reactive power generator having a first output terminal thereof connected to said place on said second conductor and having a second output terminal thereof connected to a place on said third conductor, a third reactive power generator having a first output terminal thereof connected to said place said third conductor and a second output terminal thereof connected to said place on said first conductor, a third alternating load current of said frequency flowing in said third conductor between said place thereon and said load, said second and said third reactive power generators providing second and third compensating currents of said frequency respectively during second and third switch controlled portions respectively of given half cycles of said second and third alternating voltages respectively, said second and said third compensating currents being vectorially added to said second and said third alternating load currents respectively so that a second and third alternating source current respectively of said frequency flowing in said second and third conductors respectively between said source and said place where said first output terminal of said second reactive power generator is connected to said second conductor and said place where said first output terminal of said third reactive power generator is connected to said third conductor respectively are each in second and third predetermined fixed phase relationship respectively with said second and third terminal voltages respectively for each half cycle thereof.

34. The combination as claimed in claim 33 wherein said first, second and third predetermined fixed phase relationships between said first, second and third terminal voltages respectively relative to said common reference and said first, second and third alternating source currents respectively are equal.

35. The combination as claimed in claim 34 wherein said latter equal phase relationship is zero.

36. The combination as claimed in claim 34 wherein said first, second and third source currents are balanced because of the compensating currents of said first, second and third reactive power generators respectively.

37. Apparatus for providing reactive power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which is present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a reactive power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said reactive power generator providing a compensating current of said frequency at said first output terminal during a switch controlled portion of a given half cycle of said first alternating voltage, said compensating current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said reactive power generator for switching said reactive power generator to thus provide said portion of said compensating current according to the following relationship:

switch delay being related to the integration of said second load current over an interval starting at the point where said second terminal voltage crosses zero going positive and ending at a point where said third terminal voltage next crosses zero going positive, and the integration of said first load current over an interval starting at said last named point and ending at point where said first terminal voltage next crosses zero going positive, said switch delay being measured from a point in time when the next following positive peak of said first alternating voltage occurs, all integrations being measured with respect to frequency times time.

38. The combination as claimed in claim 37 wherein said frequency is 60 hz..

39. The combination as claimed in claim 38 wherein said phase relationship between said first, second and third terminal voltages is 120° for each voltage relative to the others.

40. The combination as claimed in claim 37 wherein said first, second and third peak magnitudes are generally equal for said first, second and third terminal voltages respectively.

41. The combination as claimed in claim 37 wherein said common electrical reference for said first, second and third terminal voltages is ground potential.

42. The combination as claimed in claim 37 wherein said common electrical reference for said first, second and third terminal voltages is the common midpoint of a star connected A.C. generating system.

43. The combination as claimed in claim 37 wherein said predetermined fixed phase relationship between said first terminal voltage relative to said common reference and said first alternating source current is generally 0°.

44. The combination as claimed in claim 37 wherein said reactive power generator comprises a thyristor switched inductor, said switch delay being a delay in the firing angle of said thyristor.

45. The combination as claimed in claim 37 comprising a second reactive power generator having a first output terminal thereof connected to said place on said second conductor and having a second output terminal thereof connected to a place on said third conductor, a third reactive power generator having a first output terminal thereof connected to said place said third conductor and a second output terminal thereof connected to said place on said first conductor, a third alternating load current of said frequency flowing in said third conductor between said place thereon and said load, said second and said third reactive power generators providing second and third compensating currents of said frequency respectively during second and third switch controlled portions respectively of given half cycles of said second and third alternating voltages respectively, said second and said third compensating currents being vectorially added to said second and said third alternating load currents respectively so that a second and third alternating source current respectively of said frequency flowing in said second and third conductors respectively between said source and said place where said first output terminal of said second reactive power generator is connected to said second conductor and said place where said first output terminal of said third reactor power generator is connected to said third conductor respectively are each in second and third predetermined fixed phase relationship respectively with said second and third terminal voltages respectively for each half cycle thereof.

46. The combination as claimed in claim 45 wherein said first, second and third predetermined fixed phase relationships between said first, second and third terminal voltages respectively relative to said common reference and said first, second and third alternating source currents respectively are equal.

47. The combination as claimed in claim 46 wherein said latter equal phase relationship is zero.

48. The combination as claimed in claim 46 wherein said first, second and third source currents are balanced because of the compensating currents of said first, second and third reactive power generators respectively.

49. Apparatus for providing power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said power generator providing a current of said frequency at said first output terminal during a switch controlled portion of a given half cycle of said first alternating voltage, said current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said power generator for switching said power generator to thus provide said portion of said current according to the following relationship:

switch delay related to the integration of the negative of said second load current over a first interval starting at a point where said second terminal voltage crosses zero going negative and ending at a point where said third terminal voltage next crosses zero going negative, and the integration of said first load current over a second interval starting at the point where said third terminal voltage crosses zero going positive and ending at a point when said first terminal voltage next crosses zero going positive, said latter two intervals overlapping, said switch delay being measured from the end of the first interval, all integrations being made with respect to said frequency times time.

50. Apparatus for providing power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said power generator providing a current of said frequency at said first output terminal during a switch controlled portion of a given half cycle of said first alternating voltage, said current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said power generator for switching said power generator to thus provide said portion of said current according to the following relationship:

switch delay related to the integration of said second load current over the interval starting at a point where said third terminal voltage crosses zero going positive and ending at a point where said second voltage next crosses zero going negative, plus the integration of the negative of said second load current over the interval starting at the last named point and ending at a point where said third terminal voltage next crosses zero going negative, and the integration of said first load current over an interval starting at said point where said third terminal voltage crosses zero going positive and ending at a point where said third voltage next crosses zero going negative, plus the integration of the negative of said first load current over an interval starting at said last named point and ending at said point where said third terminal voltage crosses zero going negative, said switch delay being measured from the end of said last interval, all integrations being made with respect to said frequency times time.

51. Apparatus for providing power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said power generator providing a current of said frequency at said first output terminal during a switch controlled portion of a given half cycle of said first alternating voltage, said current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said power generator for switching said power generator to thus provide said portion of said current according to the following relationship:

switch delay is being related to the integration of said first load current over the interval starting at a point where said third terminal voltage crosses zero going positive and ending at a point where said third voltage next crosses zero going negative plus the integration of the negative of said first load current over an interval starting at said last named point and ending at a point where said third terminal voltage next crosses zero going negative, and the integration of the negative of said second load current over an interval starting at a point where said second terminal voltage crosses zero going negative and ending at said point where said third terminal voltage crosses zero going negative, said switch delay being measured from the end of said last named interval, all integrations being made with respect to said frequency times time.

52. Apparatus for providing power to an alternating current electrical system which includes three electrical conductors, where there is a first alternating voltage of predetermined frequency present between a first and a second of the conductors, a second alternating voltage of said frequency present between the second and a third of said conductors, and a third alternating voltage of said frequency present between the third and the first of said conductors, first, second and third terminal voltages each of which present respectively between said first, second and third conductors and a common electrical reference point, said electrical system also including a primary source of alternating electrical power connected to the three conductors, said electrical system also including an electrical load connected to the three conductors, the first, second and third terminal voltages having first, second and third peak magnitudes respectively and a given phase relationship relative to each other for a given period of time, comprising:

a. a power generator having a first output terminal thereof electrically connected to a place on said first conductor between said load and said primary source and having a second output terminal thereof electrically connected to a place on said second conductor between said load and said primary source, a first alternating load current of said frequency flowing in said first conductor between said place thereon and said load, a second alternating load current of said frequency flowing in said second conductor between said place thereon and said load, said power generator providing a current of said frequency at said first output terminal during a switch controlled portion of a given half cycle of said first alternating voltage, said current being vectorially added to said first alternating load current, a first alternating primary source current of said frequency which flows in said first conductor between said primary source and said place where said first output terminal is connected to said first conductor thus being in predetermined fixed phase relationship with said first terminal voltage for a half cycle, said switch controlled portion being related to a calculated switch delay; and b. calculator and sensor means for sensing values of said load currents and said voltages and calculating said switch delay as a function thereof, said calculator and sensor means being connected to said power generator for switching said power generator to thus provide said portion of said current according to the following relationship:

switch delay being related to the integration of said second load current over an interval starting at the point where said second terminal voltage crosses zero going positive and ending at a point where said third terminal voltage next crosses zero going positive, and the integration of said first load current over an interval starting at said last named point and ending at point where said first terminal voltage next crosses zero going positive, said switch delay being measured from a point in time when the next following positive peak of said first alternating voltage occurs, all integrations being measured with respect to frequency times time.

* * * * *